United States Patent
Knoppert et al.

(10) Patent No.: US 10,860,112 B1
(45) Date of Patent: Dec. 8, 2020

(54) SYSTEM FOR A SOLID-STATE KEYBOARD AND TOUCHPAD WITH A SINGLE SHEET COVER FOR PROVIDING HAPTIC FEEDBACK

(71) Applicant: Dell Products, LP, Round Rock, TX (US)

(72) Inventors: Michiel Knoppert, Amsterdam (NL); Priyank Gajiwala, Austin, TX (US); Thomas M. Hinskens, Utrecht (NL)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/777,900

(22) Filed: Jan. 31, 2020

(51) Int. Cl.
| | |
|---|---|
| G08B 21/00 | (2006.01) |
| G06F 3/01 | (2006.01) |
| G06F 3/02 | (2006.01) |
| G06F 3/044 | (2006.01) |
| H01L 41/09 | (2006.01) |
| G06F 3/0354 | (2013.01) |

(52) U.S. Cl.
CPC ............ *G06F 3/016* (2013.01); *G06F 3/0213* (2013.01); *G06F 3/0219* (2013.01); *G06F 3/03547* (2013.01); *G06F 3/044* (2013.01); *H01L 41/09* (2013.01); *G06F 2203/014* (2013.01)

(58) Field of Classification Search
CPC ................................. G06F 3/016; H04B 3/36
USPC ................. 340/407.2, 407.1, 426.18, 426.22
See application file for complete search history.

(56) References Cited

U.S. PATENT DOCUMENTS

| 4,618,797 A | 10/1986 | Cline |
| 4,857,887 A | 8/1989 | Iten |

(Continued)

FOREIGN PATENT DOCUMENTS

| JP | 2014164610 A | 9/2014 |
| KR | 100442116 B1 | 7/2004 |

(Continued)

OTHER PUBLICATIONS

Rekimoto, J., et al., "PreSensell: Bi-directional Touch and Pressure Sensing Interactions with Tactile Feedback," Apr. 2006, 6 pages.

(Continued)

*Primary Examiner* — Tai T Nguyen
(74) *Attorney, Agent, or Firm* — Prol Intellectual Property Law, PLLC; H. Kenneth Prol

(57) ABSTRACT

A coversheet layer of an information handling system, comprising a coversheet having a key location of a haptic keyboard and a haptic touchpad area on a C-cover for the information handling system including a magnet or ferromagnetic insert in the coversheet for alignment to a top replaceable overlay layer magnetically attachable to the coversheet, a support layer, a contact foil placed between the coversheet and support layer, a piezoelectric element placed between the contact foil and support layer to receive an applied mechanical stress at the key location or touchpad actuation location of the coversheet and generate an electric actuation signal and a controller of the information handling system operatively coupled to the contact foil to receive the electric actuation signal and send an electrical haptic response signal to the piezoelectric element to cause the piezoelectric element to generate haptic feedback.

20 Claims, 17 Drawing Sheets

(56) References Cited

U.S. PATENT DOCUMENTS

| | | |
|---|---|---|
| 5,463,388 A | 10/1995 | Bole |
| 5,825,352 A | 10/1998 | Bisset |
| 5,861,583 A | 1/1999 | Schediwy |
| 5,887,995 A | 3/1999 | Holehan |
| 6,147,680 A | 11/2000 | Tareev |
| 6,188,391 B1 | 2/2001 | Seely |
| 6,239,790 B1 | 5/2001 | Martinelli |
| 6,532,824 B1 | 3/2003 | Ueno |
| 6,574,095 B2 | 6/2003 | Suzuki |
| 6,680,731 B2 | 1/2004 | Gerpheide |
| 6,703,550 B2 | 3/2004 | Chu |
| 6,822,635 B2 | 11/2004 | Shahoian |
| 6,882,337 B2 | 4/2005 | Shetter |
| 7,336,260 B2 | 2/2008 | Martin |
| 7,439,962 B2 | 10/2008 | Reynolds |
| 7,486,279 B2 | 2/2009 | Wong |
| 7,523,410 B2 | 4/2009 | Rekimoto |
| 7,535,454 B2 | 5/2009 | Jasso |
| 7,741,979 B2 | 6/2010 | Schlosser |
| 7,808,488 B2 | 10/2010 | Martin |
| 8,144,453 B2 | 3/2012 | Brown |
| 8,159,461 B2 | 4/2012 | Martin |
| 8,164,573 B2 | 4/2012 | DaCosta |
| 8,199,033 B2 | 6/2012 | Peterson |
| 8,248,277 B2 | 8/2012 | Peterson |
| 8,248,278 B2 | 8/2012 | Schlosser |
| 8,279,052 B2 | 10/2012 | Heubel |
| 8,294,600 B2 | 10/2012 | Peterson |
| 8,294,677 B2 | 10/2012 | Wu |
| 8,373,664 B2 | 2/2013 | Wright |
| 8,477,113 B2 | 7/2013 | Wu |
| 8,508,487 B2 | 8/2013 | Schwesig |
| 8,542,134 B2 | 9/2013 | Peterson |
| 8,581,710 B2 | 11/2013 | Heubel |
| 8,633,916 B2 | 1/2014 | Bernstein |
| 8,674,941 B2 | 3/2014 | Casparian |
| 8,749,507 B2 | 6/2014 | DaCosta |
| 8,773,356 B2 | 7/2014 | Martin |
| 8,797,295 B2 | 8/2014 | Bernstein |
| 8,842,091 B2 | 9/2014 | Simmons |
| 9,274,660 B2 | 3/2016 | Bernstein |
| 9,280,248 B2 | 3/2016 | Bernstein |
| 9,318,006 B2 | 4/2016 | Heubel |
| 9,336,969 B2 | 5/2016 | Takashima |
| 9,400,582 B2 | 7/2016 | Bernstein |
| 9,477,342 B2 | 10/2016 | Daverman |
| 9,535,557 B2 | 1/2017 | Bernstein |
| 9,829,982 B2 | 11/2017 | Bernstein |
| 10,089,840 B2 | 10/2018 | Moussette |
| 10,120,450 B2 | 11/2018 | Bernstein |
| 2004/0020754 A1* | 2/2004 | Sullivan ............... H01H 13/702 200/314 |
| 2006/0109255 A1 | 5/2006 | Chen |
| 2007/0063987 A1 | 3/2007 | Sato |
| 2007/0273671 A1 | 11/2007 | Zadesky |
| 2008/0098456 A1 | 4/2008 | Alward |
| 2008/0202824 A1 | 8/2008 | Philipp |
| 2008/0259046 A1 | 10/2008 | Carsanaro |
| 2009/0002178 A1 | 1/2009 | Guday |
| 2009/0243817 A1 | 10/2009 | Son |
| 2009/0315853 A1* | 12/2009 | Yang ...................... G06F 3/044 345/174 |
| 2009/0315854 A1 | 12/2009 | Matsuo |
| 2010/0089735 A1 | 4/2010 | Takeda |
| 2010/0102830 A1 | 4/2010 | Curtis |
| 2010/0110018 A1 | 5/2010 | Faubert |
| 2010/0128002 A1 | 5/2010 | Stacy |
| 2012/0062491 A1 | 3/2012 | Coni |
| 2012/0092263 A1 | 4/2012 | Peterson |
| 2013/0249802 A1 | 9/2013 | Yasutake |
| 2015/0185842 A1 | 7/2015 | Picciotto |
| 2017/0269688 A1 | 9/2017 | Chan |
| 2018/0074694 A1 | 3/2018 | Lehmann |
| 2019/0073036 A1 | 3/2019 | Bernstein |

FOREIGN PATENT DOCUMENTS

| | | |
|---|---|---|
| KR | 20040081697 A | 9/2004 |
| WO | 2004/042685 A2 | 5/2004 |
| WO | 2004/042693 A1 | 5/2004 |
| WO | 2005/057546 A1 | 6/2005 |
| WO | 2011/056752 A1 | 5/2011 |
| WO | 2011/071837 A2 | 6/2011 |

OTHER PUBLICATIONS

Rekimoto, J. et al., "PreSense: Interaction Techniques for Finger Sensing Input Devices," UIST '03 Vancouver, BC, Canada, Nov. 2003, pp. 203-212, ACM 1-58113-636-06/03/0010.

Holleis, P. et al., "Studying Applications for Touch-Enabled Mobile Phone Keypads," Proceedings of the Second International Conference on Tangible and Embedded Interaction (TEI'08), Feb 18-20, 2008, Bonn, Germany, pp. 15-18.

Westerman, W. et al., "Multi-Touch: A New Tactile 2-D Gesture Interface for Human-Computer Interaction," Proceedings of the Human Factors and Ergonomics Society 45th Annual Meeting, Oct. 2001, pp. 632-636.

* cited by examiner

SYSTEM FOR A SOLID-STATE KEYBOARD AND TOUCHPAD WITH A SINGLE SHEET COVER FOR PROVIDING HAPTIC FEEDBACK

FIELD OF THE DISCLOSURE

The present disclosure generally relates to a key switch assembly of, for example, an information handling system. The present disclosure more specifically relates to the use of piezoelectric sensor and haptic generator elements in a keyboard and touchpad with uniform appearance for an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard or other input or output devices such as cursor control devices for manual input of information by the user which may have a streamline profile.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
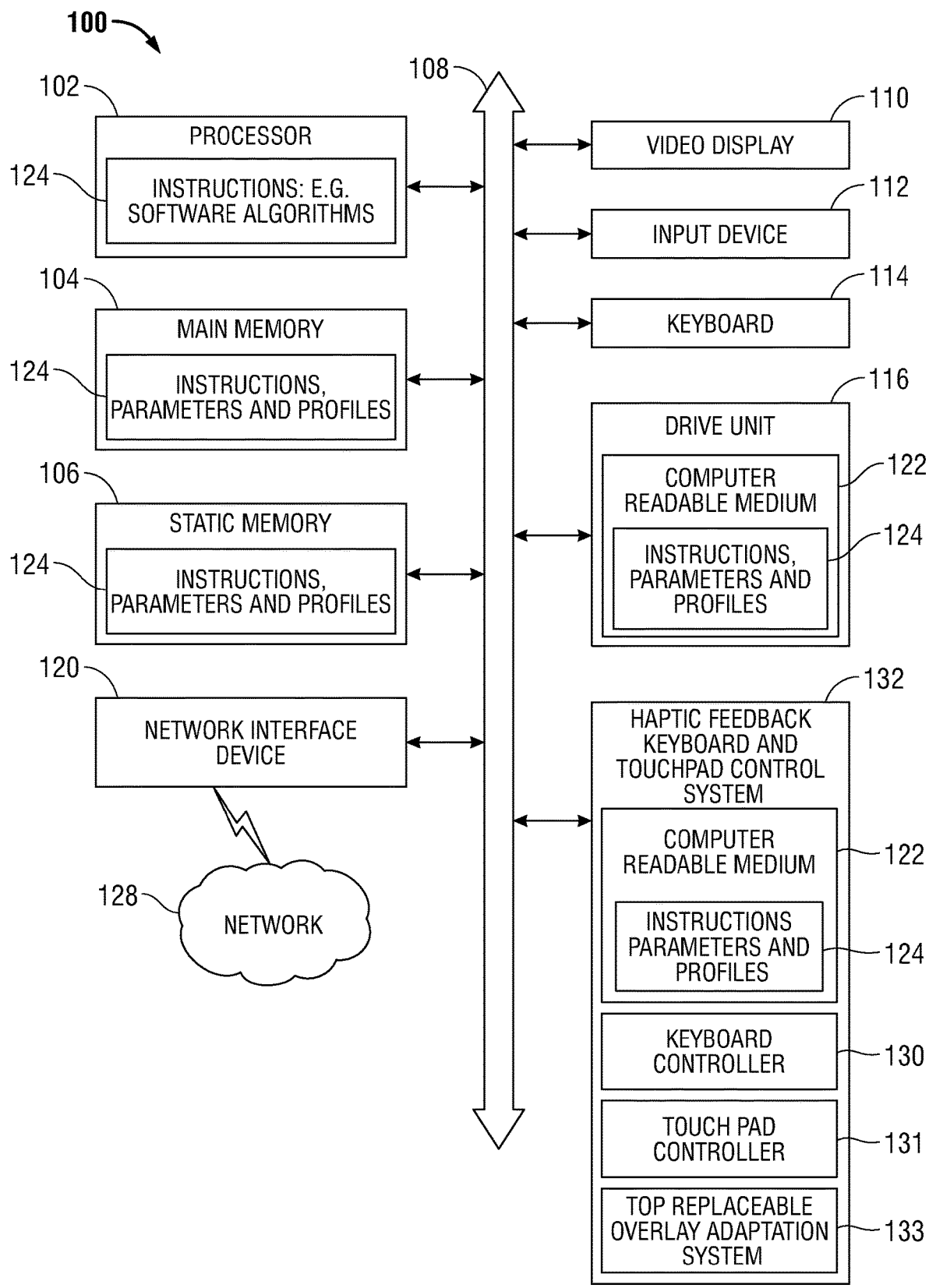
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a keyboard of an information handling system. The keyboard may include, in an embodiment, a coversheet to identify an actuation location of an input actuation device. In embodiments herein, the coversheet my be combined into a single sheet of material including the designation of one or more keys for a keyboard, an area designated for a touchpad, and a palmrest for covering the C-cover of an information handling system. The coversheet may overlay and serve as an interface layer in some embodiments for a user to actuate the one or more keys, the touchpad area, or to rest palms on the C-cover. With embodiments including a single sheet of material, a variety of material choices may be made for the appearance of the C-cover and further a single source for the coversheet may allow for easier control of a consistent appearance over the entire C-cover surface coversheet. For example, matching the color of the keys, touchpad and palmrests that may come from different vendors or different manufacturing lines may be solved with a single-material coversheet as those parts of the C-cover over the flat haptic keyboard and touchpad of the present embodiments. Further, materials with a cloth, wood, bamboo, glass, ceramic, metallic, carbon fiber, plastics, among many options may be available in a variety of colors and textures for use with the C-cover. Further, with the single material coversheet of the C-cover the need for opening or key vias is not necessary to provide for key and touchpad travel to mechanically activate switches below the keyboard or touchpad. Local deformation of the key location of the haptic keyboard or the touchpad area provide for actuation of the key or touchpad of the present embodiments. Thus, no gap around keys or the touchpad area is needed with the haptic keyboard of the present embodiments, although one may be selected for aesthetic reasons or for enhancement of cooling or backlighting for an information handling system. In single material coversheet embodiments, the coversheet is stuck to a C-cover substructure providing a continuous sheet over top of the C-cover thereby providing sealing protection against spills or dirt entering the base chassis. It is further easier to clean the single coversheet embodiments described herein. The shape, size, and layout of keys or the touchpad is also flexible.

In some embodiments, a single sheet coversheet may be attached to the substructures of the C-cover, the haptic stackup for the keys, and the haptic stackup for the touchpad via adhesives, or in part via mechanical attachment mechanisms such as screws into a threaded receiver hole in the chassis or some types of clips or other mechanical attachment. In another aspect, embodiments herein may include a flat coversheet with one or more magnets disposed in or on the coversheet which may be used to magnetically attach top replaceable overlays onto the coversheet with close attachment to translate actuation pressure and any haptic feedback event to a user's fingers as with keys or a touchpad on the coversheet itself. In this way, the language of the keyboard, key layouts, shapes, key sizes, cover materials and colors, or the designations to identify key and touchpad actuation areas may be swapped out with ease and provide for information handling system customers at a lower cost in various embodiments. The flat coversheet may further include guides or raised walls to assist with placement and attachment of the top replaceable overlay onto the coversheet to align one or more keys, and touchpad area over the piezoelectric elements of the haptic keyboard or haptic touchpad underneath the C-cover. Multiple embodiments are described herein.

In other embodiments where key or even touchpad vias may be formed in a coversheet to delineate keys or the touchpad, the elimination of need for mechanical travel for the key or touchpad means the gaps may be formed with limited tolerance. In such embodiments, the use of a hydrophobic membrane or gasket may provide for water or dirt resistance while allowing for heat exhaust at levels that would not be notice by a user or provide for backlighting in some embodiments.

In an embodiment a support layer may be placed underneath the coversheet to support the coversheet and other layers within the keyboard. In some embodiments, a waterproof gasket may be located around the support layer for the haptic keyboard and touchpad to further isolate the base chassis from spills or dirt and may even be formed to provide a level of water-resistance protection. The keyboard may, in an embodiment, include a contact foil placed between the coversheet and support layer. In the embodiments presented herein, the keyboard may include a piezoelectric element placed between the contact foil and support layer to receive an applied mechanical stress at the actuation location of the input actuation device. The keyboard of the information handling system, in an embodiment, may include a controller of the information handling system operatively coupled to the contact foil to receive an electric charge from the piezoelectric element placed under the mechanical stress; and send an electrical charge to the piezoelectric element of a signal varying in polarity, voltage or current to cause the piezoelectric element to provide haptic feedback at the actuation location. The use of piezoelectric elements within the keyboard may eliminate the use of other devices such as a scissor mechanism that are used to maintain a keycap of a key above an electrical connection or for a dive board type mechanism under a touchpad. Instead, the piezoelectric elements may reduce or eliminate those mechanical elements that may fail after a number of actuations while also reducing the thickness of the keyboard or the touchpad itself. Instead of the keys of the keyboard requiring travel of a scissor mechanism within a C-cover of the information handling system, the relatively thinner keys defined (either physically or visibly) on the solid state keyboard of the presently-described information handling system may reduce the physical thickness of the keyboard within the information handling system. Further, the solid state touchpad may eliminate the dive board mechanism and underlying click switch for selection of items via the mechanically actuated touchpad. This may enable a thinner, more streamlined information handling system. The overall thickness of the information handling system may be reduced to as to decrease the size and weight of the information handling system. In other embodiments, because the keyboard described herein has a reduced thickness, the space within the information handling system used to house other components, such as a battery, of the information handling system may be increased allowing for the increase in size of these components or the inclusion of additional components within the chassis of the information handling system. Additionally, because the solid state keyboard or touchpad described herein does not include the mechanical components (i.e., scissor mechanism and coupled key cap or dive board mechanism) as other keyboards or touchpads, the keyboard may be less susceptible to wear or mechanical strain over time. Instead, with the implementation of the piezoelectric elements, the solid state keyboard or touchpad of embodiments herein uses fewer mechanical parts and may be more robust resulting in longer usable life.

During operation of the solid state keyboard or touchpad of the information handling system described in embodiments herein, a key on the keyboard or the touchpad may be actuated by a user pressing down on a specific location. In an embodiment, this specific location may be visually indicated by an alphanumeric symbol such as those found on a QWERTY keyboard, a key pedestal or raised location, or another designation such as a tactile frame or depression in a cover sheet. In other embodiments, the specific language, key location, key sizes, keyboard or touchpad layout may be varied with the use of the top replaceable overlay. For example, the top replaceable overlay may correspond to a different language keyboard or a different key layout with differing key sizes or shapes. The key or keys may correspond to one or more piezoelectric elements which may be adjusted to accommodate the new keyboard top replaceable overlay by a top replaceable overlay adaptation system that may detect the magnets engaged in the information handling system C-cover cover sheet via Hall effect sensors. As described in embodiments herein, the top replaceable overlay adaptation system may determine which type of keyboard top replaceable overlay has been attached by sensing the combination of sensed magnets in the coversheet of the C-cover have been paired to a top replaceable overlay and the polarity of those magnets in some embodiments.

In an embodiment, this specific location may be a position on a touchpad user interface surface and may also have an x-y location detected by a capacitive touchpad interface. The actuations of these specific locations by, for example, a user's finger causes a mechanical stress to be applied to the piezoelectric element resulting in the deformation of the piezoelectric element. Upon application of this mechanical stress and the deformation of the piezoelectric element, the piezoelectric element accumulates an electric charge that is passed to a controller of the information handling system via the contact foil described herein. In an embodiment, the controller receives the electrical charge and sends an electrical charge back to the piezoelectric element. Upon application of the electrical charge on the piezoelectric element by the controller, the piezoelectric element may be mechanically stretched or compressed so as to create a haptic feedback event such as the piezoelectric element warping up or down and returning to its pre-deformed state. This warping of the layers of the piezoelectric element causes the user to feel a haptic sensation at the actuated key or the specific location where the user pressed in order to actuate a key or touchpad. This haptic feedback against the user's finger causes a sensation of pressing a mechanical key thereby creating a feeling to a user that the key was pressed or that a touchpad has been clicked to select an item such as one displayed on a display screen.

Embodiments of the present disclosure employ piezoelectric elements in order to provide haptic feedback at a thin keyboard or touchpad. In the present specification and in the appended claims, the term "actuate" or "actuation" is meant to understood as an action that causes an operation. In the context of the present disclosure, this includes the action by a user such as pressing against a location on a keyboard or touchpad. During actuation of a key or touchpad, a user may press against a visually labeled or tactilely identified key on a keyboard or an unlabeled or labeled location on a touchpad or touchpad area of a C-cover. This actuation, according to the present disclosure, causes a mechanical strain on a piezoelectric element and, consequently, cause a buildup of electric charge in the piezoelectric element. This electric charge is detectable by a controller via a conductive contact foil. The detected electrical charge may be interpreted by the controller as an indication that the key or location on the touchpad was actuated. Thus, in an embodiment, the actuation by a user results in the controller sending an electrical signal back to the piezoelectric element under the key or one or more of an array of piezoelectric elements under where the touchpad has been actuated. When the activating haptic electrical signal (with particular polarity, current, or voltage) is received at the piezoelectric element, the piezoelectric material in the piezoelectric element may stretch or compress to warp the piezoelectric element thereby creating the haptic feedback at that key or location on the touchpad described herein.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O)

devices 112, such as a keyboard 114, a touchpad, a mouse, a video/graphic display 110, or any combination thereof. The information handling system 100 may also include one or more buses operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 of the haptic feedback keyboard and touchpad control system 132, and drive unit 116 (volatile (e.g. random-access memory, etc.), nonvolatile memory (read-only memory, flash memory etc.) or any combination thereof. It is to be appreciated that the haptic feedback keyboard and touchpad control system 132 may be either a haptic feedback keyboard control system 132 for only a haptic keyboard or a haptic feedback touchpad control system 132 for only a haptic touchpad in various embodiment herein. In particular, the haptic feedback keyboard and touchpad control system 132 may be separate system for controlling just a haptic keyboard according to embodiments herein, or for controlling just a haptic touchpad according to embodiments herein, or for controlling both. The haptic keyboard and the haptic touchpad may have separate controllers or processors or share a controller or a processor according to embodiments herein. It is understood that reference to the haptic feedback keyboard and touchpad control system 132 does not necessarily require one system control both the haptic keyboard and the haptic touchpad in embodiments herein. The information handling system 100 may also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input), and a keyboard 114. Various drivers and control electronics may be operatively coupled to operate input devices 112 such as the haptic keyboard 110 and haptic touchpad according to the embodiments described herein.

The network interface device shown as wireless adapter 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may execute a haptic feedback keyboard and touchpad control system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the haptic feedback keyboard and touchpad control system 132 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a key or location on a touchpad. The disk drive unit 116 and static memory 106 may also contain space for data storage. Further, the instructions 124 may embody one or more of the methods or logic as described herein. For example, instructions relating to the haptic feedback keyboard and touchpad control system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The haptic feedback keyboard and touchpad control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the haptic feedback keyboard and touchpad control system 132 that may be operably connected to the bus 108. The haptic feedback keyboard and touchpad control system 132 computer readable medium 122 may also contain space for data storage. The haptic feedback keyboard and touchpad control system 132 may, according to the present description, perform tasks related to receiving an electric charge from a piezoelectric element and return an electrical charge to that piezoelectric element causing a haptic feedback at a key or location on a touchpad associated with that piezoelectric element. In these embodiments, the haptic feedback keyboard and touchpad control system 132 may receive an electric charge from any of a plurality of piezoelectric elements each associated with a key on keyboard (i.e., a QWERTY or other top replaceable overlay keyboard), a keypad, or a location on a touchpad. Input may be received by the haptic feedback keyboard and touchpad control system 132 either simultaneously or concurrently so as to provide a return electrical charge to the corresponding piezoelectric elements as described herein. The haptic feedback keyboard and touchpad control system 132, in embodiments herein, may be a control system for either a haptic feedback keyboard or for a haptic feedback touchpad system, or for both as shown in FIG. 1. For example, haptic feedback keyboard and touchpad control system 132 may include only a keyboard controller 130 for a haptic keyboard system or only a touchpad controller 131 for a haptic touchpad system in some embodiments that do not implement a haptic system for both the keyboard and touchpad. In other embodiments, both the keyboard controller 130 and touchpad controller 131 may be implemented for haptic input output systems as described herein. In further embodiments, a top replaceable overlay adaptation system 133 may form part of the haptic feedback keyboard and touchpad control system 132 and may be used to determine the attachment of various available top replaceable overlays to change the keyboard language, keyboard layout, or the appearance of the keyboard while still providing a close coupling allow detection of key or touchpad actuation and response haptic feedback events to be felt by the users. The top replaceable overlay adaptation system 133 may be operatively coupled to a plurality of Hall effect sensors and determine which type of keyboard top replaceable overlay has been attached by sensing the combination of sensed magnets in the coversheet of the C-cover have been paired to a top replaceable overlay in some embodiments. In further embodiments, the top replaceable overlay adaptation system 133 may also determine the polarity of those various magnets.

In an embodiment, the haptic feedback keyboard and touchpad control system 132 may communicate with the main memory 104, the processor 102, the video display 110, the alphanumeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
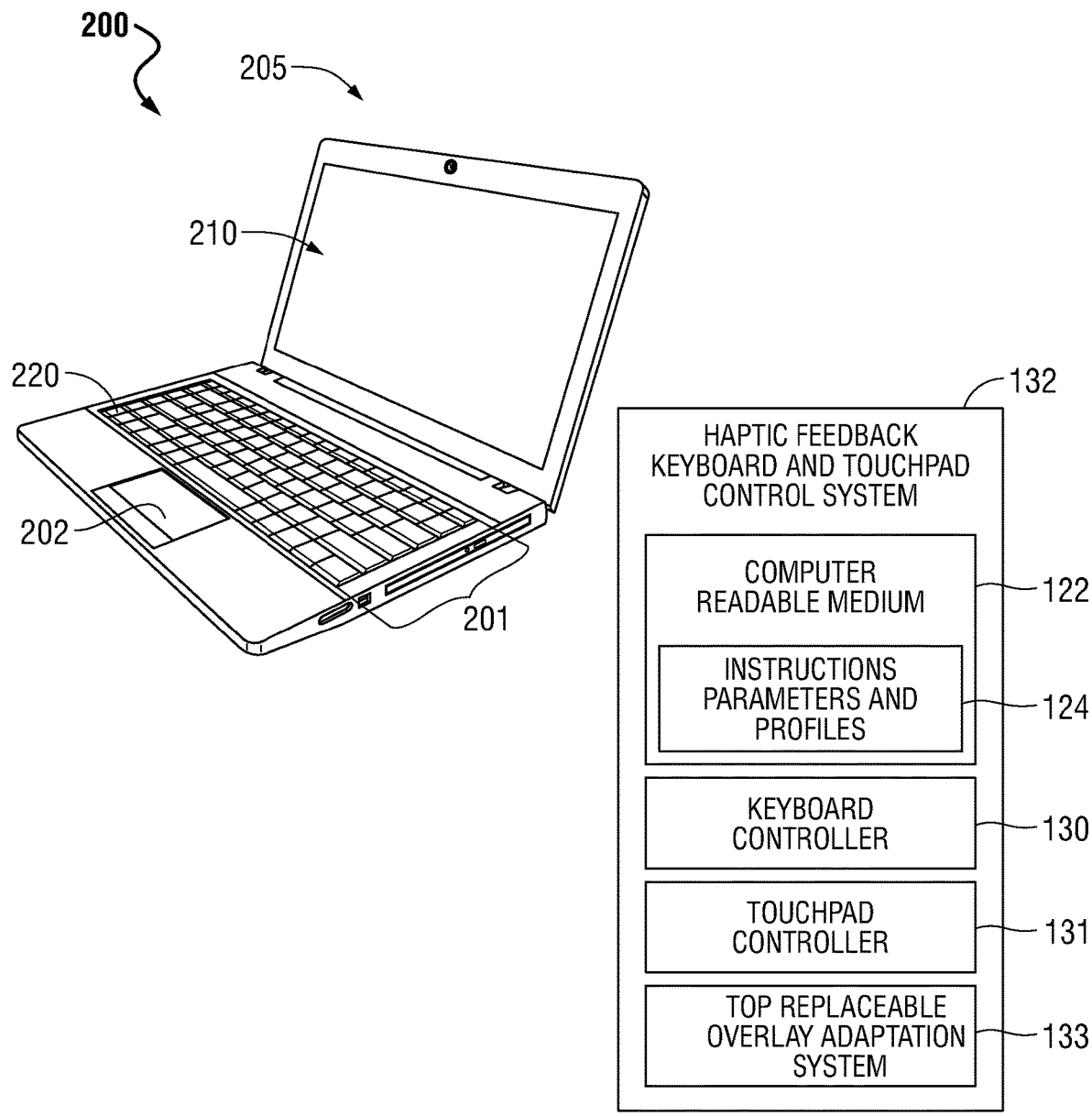
FIG. 2 is a perspective graphical diagram of an information handling system with a haptic feedback control system for a keyboard or touchpad according to an embodiment of the present disclosure.

FIG. 2 is a perspective graphical diagram of an information handling system 200 with a haptic feedback keyboard and touchpad control system 132 according to an embodiment of the present disclosure. Although FIG. 2 depicts the information handling system 200 as being implemented in a laptop computing device, FIG. 2 is not meant to be limiting and the present specification contemplates that the use of other types of information handling system as described herein. In the example, the information handling system may include a screen portion 210 and a keyboard portion 201 and touchpad portion 202. The screen portion 210 may include any device that may present to a user any visual data as output to a user in response to input and execution of the instructions, parameters, and profiles 124 by the processor 102 described in connection with FIG. 1. In an example embodiment, a graphical user interface may be presented to a user to input any number of parameters descriptive of the actuation force used to actuate any number of keys 220 on the keyboard portion 201 of the information handling system, an actuation force at a location on a touchpad 202, or both. The graphical user interface (GUI) may also be used to receive other settings including actuation of a "click" when selecting items on display 210 via a cursor using touchpad 202, setting the force required for actuation, setting multiple-levels of force and operations associated with those levels, and selection of magnitude, pattern, or other characteristics of the haptic response by a key 220 or touchpad 202 of the keyboard 201.

The keyboard portion 201 may include any number of keys 220 arranged in any manner so as to receive input from a user via selective actuation of those keys 220. In an embodiment, the keys 220 may be arranged similar to a QWERTY-type keyboard layout or any other alphabetic, symbolic, or numeric layout. In an embodiment, the keys 220 may be any number of keys from 1 to infinity. In another embodiment, the keyboard portion 201, the touchpad 202 and any palmrest and other portion of the C-cover may be made of a single sheet of material as a coversheet of the stack up of the piezoelectric keyboard and piezoelectric touchpad as described in systems herein. This single sheet of material may be made of metals such as aluminum, titanium, steel or the like or may be made of carbon fiber or plastics to provide for flexible materials. Other materials may include bamboo, wood, cloth or other woven material, ceramic, glass or similar materials to provide for chosen aesthetics for the information handling system. In yet other embodiments, a top replaceable overlay may be used to swap out type of keyboard 201 or touchpad 202 used for the information handling system. For example, a top replaceable overlay may be used for replacing a QWERTY-type keyboard with a keyboard for another language. A top replaceable overlay adaptation system 133 may be a part of the haptic feedback keyboard and touchpad control system 132 may operate to execute code instructions via a controller or processor to detect the top replaceable overlay attached to the coversheet of the C-cover. The top replaceable overlay adaptation system 133 may be operatively coupled to one or more Hall effect sensors, a light or infrared sensor, or other proximity sensor to determine that a top replaceable overlay has been attached via magnets or even which type of top replaceable overlay has been attached to the coversheet. Then the top replaceable overlay adaptation system 133 may adjust the interpretation of actuation of the piezoelectric element or elements corresponding to each key or keys of the new keyboard of the top replaceable overlay to interpret an actuation signal to represent a designated character on the top replaceable overlay. In other aspects, the top replaceable overlay may be used to vary shapes of keys or touchpad, layout of keys or touchpad, texture or materials or colors in various embodiments. In such embodiments, the top replaceable overlay adaptation system 133 may detect the top replaceable overlay attached as described if changes to interpretation of piezoelectric element actuation reflects a changed character designation on the top replaceable overlay due to change in language and alphanumeric characters or changes in location of keys or sizes of keys.

In an embodiment of the present description, each of the keys 220 may be associated with a piezoelectric element or more than one piezoelectric element. The piezoelectric element may be used to, as described herein, create an electrical charge relative to a key 220 on the keyboard portion 215 and send that electrical charge to a controller. In an embodiment, the controller may receive the electrical signal and send an electrical signal to the piezoelectric element. Upon application of the electrical signal at the piezoelectric element (i.e., having a specific current and voltage) associated with the actuated key 220 causes the piezoelectric element to convert that electrical charge into a mechanical stress by, for example, stiffening the piezoelectric element. The mechanical stress of the piezoelectric element due to the application of the electrical charge to the piezoelectric element may be felt by a user who actuated the key 220 or location on the touchpad.

In an embodiment, the touchpad portion 202 includes a touch surface and a capacitive touch layer that indicates a touch location using x- and y-coordinates across the touch surface. In an embodiment, an array of piezoelectric elements may be placed under the touch surface. Each of the piezoelectric elements among the array may detect and respond by providing haptic feedback depending on the piezoelectric elements' proximity to an actuation location across the surface of the touch layer. The array of piezoelectric elements activates the touch surface and is a detect/response by one or more nearby piezoelectric elements. The piezoelectric elements create a "click" haptic feedback such as when a user selects an item displayed with the haptic touchpad 202.

The information handling system 200 may include a haptic feedback keyboard and touchpad control system 132 as described herein. In an embodiment the keyboard controller 130 and the touchpad controller 131 may be the same controller that executes instructions, parameter, and profiles 124 to enact the functions of the keyboard 114 and touchpad as described herein. In an embodiment the keyboard controller 130 and the touchpad controller 131 may be the different controllers that each executes instructions, parameter, and profiles 124 to enact the functions of the keyboard 201 and touchpad 202 as described herein. In an embodiment, the haptic feedback keyboard and touchpad control system 132 may include one or more sets of instructions that, when executed by a keyboard controller 130, causes a current, at a voltage, to be applied to a piezoelectric element upon detection of an electrical charge from the piezoelectric element. The one or more sets of instructions of the haptic feedback keyboard and touchpad control system 132 may also include one or more sets of instructions that, when executed by the keyboard controller 130, determines which of any plurality of keys 220 on a keyboard portion 201 or locations on a touchpad 202 were activated by association of a scan code of the one or more piezoelectric elements to an alphanumeric character associated with such a key. In further embodiments, the one or more sets of instructions of the haptic feedback keyboard and touchpad control system 132 may also include one or more sets of instructions of the top replaceable overlay adaptation system that, when executed by the keyboard controller 130 or a processor, determines which of any of the top replaceable overlays has been attached to the coversheet over an existing default keyboard (such as a QWERTY-type keyboard or over a flat coversheet) via magnetic or other attachment and with an sensors able to detect the attachment. The top replaceable overlay adaptation system 133 in some embodiments may operate to adjust the scan code designation of received actuation signals from piezo electric elements when the set of alphanumeric The present embodiments also contemplate that only a haptic feedback keyboard 201 or only a haptic feedback touchpad 202 may be deployed into the information handling system with the other of the haptic feedback keyboard 201 or haptic feedback touchpad 202 being embodied as a conventional touchpad or keyboard. In an example, the keyboard controller 130 may receive, from a piezoelectric element, an electric charge and produce an electric charge to the piezoelectric element. The haptic feedback and touchpad control system 132 may also include a touchpad controller 131. In an embodiment, the touchpad controller 131 of the control system 132 may include one or more sets of instructions that, when executed by a touchpad controller 131, causes a current, at a voltage, to be applied to a piezoelectric element upon detection of an electrical charge from the piezoelectric element.

In an embodiment, the one or more sets of instructions of the haptic feedback keyboard and touchpad control system 132 may also include, in an embodiment, one or more sets of instructions that, when executed by a processor, adjusts the polarity, voltage, or current of haptic response signals applied to any piezoelectric element. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electrical charge applied any given piezoelectric element by the keyboard controller 130 may be customized to produce a specific level of haptic feedback at any given key. In an embodiment, the keyboard controller 130 of the information handling system 200 may include a look-up table. In this embodiment, the keyboard controller 130 of the information handling system 200 may access the look-up table in order to determine how a current pulse is to be applied to any given piezoelectric element and at what polarity or voltage of the haptic response signal to the piezoelectric elements.

The one or more sets of instructions of the haptic feedback keyboard and touchpad control system 132 may also include one or more sets of instructions that, when executed by the keyboard controller 130, causes any number of subsequent current pulses to be applied to any piezoelectric element. In this embodiment, the subsequent electrical pulses may cause a haptic feedback event to a user who actuated a key 220 on a keyboard portion 201 of the information handling system or changes in magnitude or pulses of haptic feedback to emulate the feel of a mechanical keystroke including adjustment of the feel of depth of the haptic-emulated keystroke. In other embodiments, the haptic feedback of the keyboard 201 may not need to emulate a keystroke of a mechanically actuated keyboard but instead provide a distinct haptic feel to indicate that a keystroke has occurred on the solid state keyboard 201 to the user.

In an embodiment, the one or more sets of instructions of the haptic feedback keyboard and touchpad control system 132 may also include, in an embodiment, one or more sets of instructions that, when executed by a processor, adjusts the voltage and current applied to any piezoelectric element at a touchpad portion 202. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electrical charge applied any given piezoelectric element by the touchpad controller 131 may be customized to produce a specific level of haptic feedback at any given location across the touchpad. In an embodiment, the touchpad controller 131 of the information handling system 200 may include a look-up table. In this embodiment, the touchpad controller 131 of the information handling system 200 may access the look-up table in order to determine how a current pulse is to be applied to any given piezoelectric element and at what polarity or voltage of the haptic response signal to the piezoelectric elements.

The one or more sets of instructions of the haptic feedback keyboard and touchpad control system 132 may also include one or more sets of instructions that, when executed by the touchpad controller 131, causes any number of subsequent current pulses to be applied to any piezoelectric element. In this embodiment, the subsequent electrical pulses may cause a haptic feedback event to a user who actuated a location across a touchpad portion 202 of the information handling system or changes in magnitude or pulses of haptic feedback to emulate the feel of a mechanical actuation of a touchpad portion 202 including adjustment of the feel of depth or click response of the haptic-emulated actuation of the touchpad portion 202. In other embodiments, the haptic feedback of the touchpad 202 may not need to emulate a click of a mechanically actuated touchpad but instead provide a distinct haptic feel to indicate that a touchpad selection has occurred on the solid state touchpad 202 to the user.

In an embodiment, the application of any current and voltage applied to any of the piezoelectric elements associated with any of the keys 220 or a location on a touchpad portion 202 may be dependent on an application being executed on the laptop computing device 205. By way of example, a user may be engaged in providing input, via the keys 220 of the keyboard portion 215, to a processor of the laptop computing device 205 in order to cause output to be provided. In a specific embodiment, the laptop computing device 205 may execute a basic input/output system (BIOS). Upon execution of the BIOS, the haptic feedback keyboard and touchpad control system 132 may begin to detect electrical signals or charges emitted from a piezoelectric element being placed in a strain by the actuation of a corresponding key 220 on the keyboard portion 215 or location on a touchpad portion 202. This may allow the haptic feedback keyboard and touchpad control system 132 to receive input at times when the laptop computing device 205 is in an on states. In an alternative embodiment, the execution of other application programs by a processor of the laptop computing device 205 such as word processing application program may trigger the haptic feedback keyboard and touchpad control system 132 to begin to detect the electrical charges produced at any given piezoelectric element. By deferring input received from the piezoelectric element at the keyboard controller 130 or any other controller or processor, accidental input may be prevented by any errant touch of the keyboard portion 215.

Figure 3A:
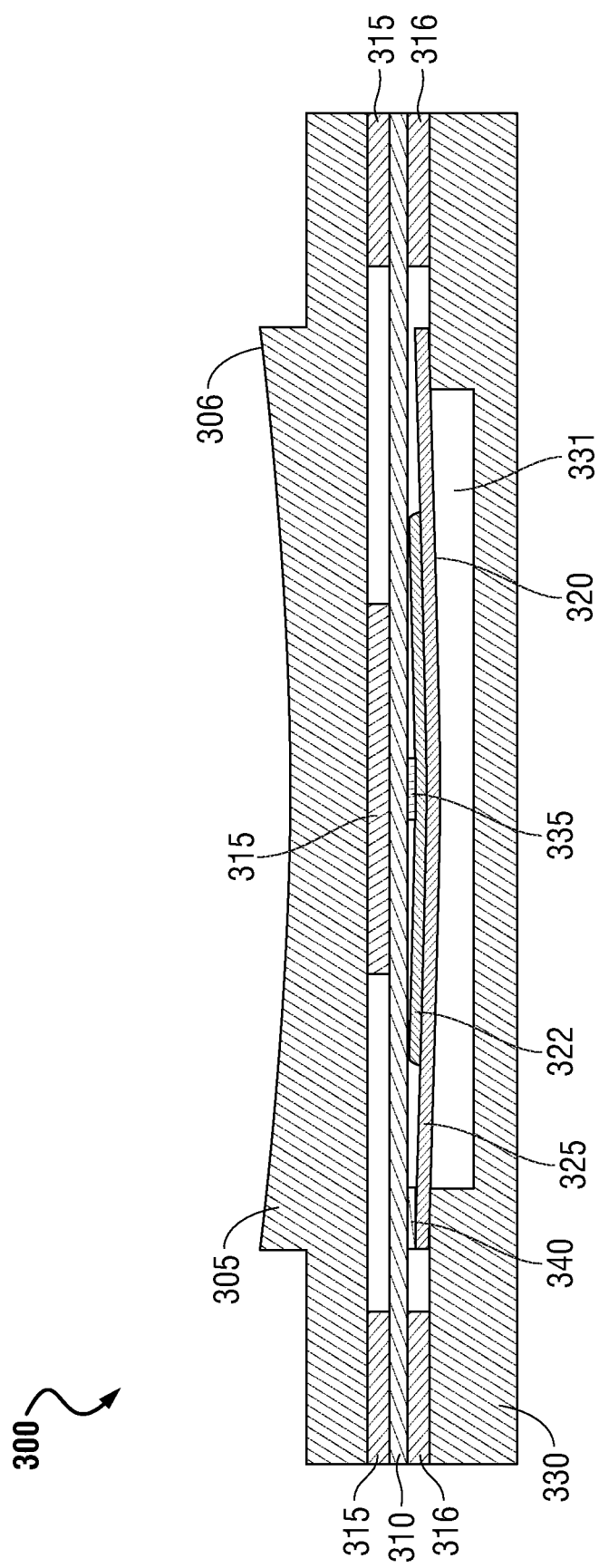
FIG. 3A is a side cut-out view of a key of a keyboard implementing a piezoelectric element in an unactuated state according to an embodiment of the present disclosure.

FIG. 3A is a side cut-out view of a key 300 of a keyboard implementing a piezoelectric element 320 in an unactuated state according to an embodiment of the present disclosure. According to an embodiment, the key 300 may be formed of a plurality of layers, one layer of which is a piezoelectric element 320. Although FIG. 3A shows a cross-sectional view of a single key 300, the present specification contemplates that a keyboard may also include a plurality of these similar keys 300 arranged as, for example, a QWERTY-type keyboard. The present specification also contemplates that, in addition to a keyboard, an information handling system described herein may also include a touchpad including a piezoelectric element 320 as described herein. Consequently, FIG. 3A is not intended to be limiting but merely intended as a description of operation of any type of input device contemplated by the present disclosure.

The key 300 includes a coversheet 305. The coversheet 305 may be made of any type of elastically resilient material. The elastically resilient material may allow, at least, a portion of the key 300 to be deformed upon application of a pressure from a user's finger. Upon withdraw of the pressure from the user's finger, the material the coversheet 305 is made of allows the coversheet 305 of the key 300 to bend back to its pre-deformed state. In an embodiment, the resilient material may allow the coversheet 305 to travel a minimal distance and still deform a piezoelectric element 320. For example, a distance of between 0.01 mm and 2 mm may be compressed in the stackup including the coversheet 305 and piezoelectric element. In an embodiment, the distance is between 0.05 mm and 0.15 mm. In an embodiment, the distance is 0.1 mm. The piezoelectric element 320 may deform between 5 microns and 30 microns in some embodiments.

In an embodiment, the shape of the coversheet 305 may have a selection of key pedestals 306 of various sizes and shaped so as to conform to a user's finger. In an embodiment, in order to shape the coversheet 305, the material used to form the coversheet 305 may be subjected to an injection molding process. As such, a top portion of the coversheet 305 may be formed to be ergonomically beneficial to a user's actuation such as by conforming to the user's fingers and including a pedestal 306 to highlight the key location, for example. In other embodiments, no key pedestals may be formed and a key location may be described in coversheet 305 via markings, depressions, key framing, or other methods. The injection molding process may be completed prior to the installation of the coversheet 305 into the remaining layers within the keyboard 300 as described herein. Any number of processes may be included with the injection molding process. In an embodiment, the injection molding process used to form the coversheet 305 may include forming a number of holes within a sheet of acrylonitrile butadiene styrene (ABS). These holes may correlate with a number of keys on a keyboard. The formation of the coversheet 305 may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In yet other embodiments, coversheet of the C-cover may include a plurality of vias for keys 300 having a cover sheet 305 or cap for each key. A key pedestal 306 for each key 300 in a solid state keyboard of the present embodiments may be disposed through the vias in the C-cover in such embodiments. Keys 300 may include small gaps that may be available for base chassis ventilation, or for allowing backlight framing of keys in some embodiments. Similarly, in some embodiments a via for touchpad interface surface may be provided in a C-cover coversheet for access to the top cover sheet of the solid state touchpad in some embodiments.

The key 300 may further include a number of adhesive layers 315 that physically couple the various layers of the key 300 together. In an embodiment, a first adhesive layer 315 may be formed on the coversheet 305 to adhere the coversheet 305 to a contact foil 310. The first adhesive layer 315 may include the placement of the adhesive at locations that may enhance the movement and prevent the hinderance of the actuation of the coversheet 305. In a specific embodiment, the first adhesive layer 315 may include placing the adhesive along borders of the key 300 as well as placing the adhesive at a central location of the key 300.

The contact foil 310 adhered to the coversheet 305 via the first layer of adhesive 315 may be made of any elastically resilient material that, when the coversheet 305 of key 300 is actuated or the contact foil 310 is bent towards a lower portion of the key 300, returns to its original state when the key 300 is no longer being actuated. The contact foil is a flexible material, such as polyethylene terephthalate (PET) serving as a polyester printed circuit board or other type of flexible printed circuit board, in several example embodiments. The contact foil 310 may include a number of metal traces formed thereon that electrically and communicatively couple each of the corresponding piezoelectric element 320 of key 300 to a controller such as a processor of an information handling system that includes a haptic feedback keyboard control system such as described herein. Formation of metal traces may be made according to a variety of methods including photolithographic techniques for applying metal or lamination of copper strips or other metal layers. During operation of the key 300, the contact foil 310 may receive an electrical charge from the piezoelectric element 320 at the metal traces that conduct the electrical charge to the processor or other controller associated with the key 300. The metal traces formed on the contact foil 310 may further be used to conduct a return electrical signal from the controller to the piezoelectric element 320 so that the voltage and current of the return electrical signal may cause the piezoelectric element 320 to warp upward and downward before returning to a planer and rigid form of the piezoelectric element 320 as would be required to cause a specified haptic event response to the user via coversheet 305. This actuation causing warping of the piezoelectric element 320 may cause a haptic feedback presented at the key 300 via the contact foil 310, adhesive 315, and coversheet 305 that the user may feel. This haptic feedback may be relayed to the user within microseconds of the user actuating the key 300 such that the user physically detects a sensation that the key 300 was pressed. This sensation felt by the user may be present despite no actual mechanical devices such as a scissor mechanism or other types of keyboard mechanical devices being present among the layers of the key 300. The signal to the piezoelectric element 320 may vary magnitude and pulsing to create the desired haptic response at key 300.

In an embodiment, portions of the contact foil 310 may be physically coupled to a support plate 330 via a second layer of adhesive 316. The location of the placement of the second adhesive layer 316 may include placing the adhesive along borders of the key 300.

In an embodiment presented herein, the piezoelectric element 320 may include a first portion 322 that may be any solid piezoelectric material that accumulates an electric charge when a mechanical stress is applied to it or specifically, in the embodiments presented herein, when the solid material is deformed. Solid materials used to form the piezoelectric element 320 may include crystals, ceramics, or protein layers, among other types of materials. For ease of explanation, the piezoelectric element 320 may be made of a type of ceramic although the present specification contemplates the use of other types of piezoelectric materials.

The piezoelectric element 320 may be housed over a cavity 331 formed in the support plate 330. The piezoelectric element 320 may comprise two portions 322 and 325 each electrically coupled via electric contact points such as soldering points 335 and 340, respectively, to a different electrical trace on a contact foil 310. The first portion 322 may be a ceramic disc in an embodiment. Second portion 325 of the piezoelectric element 320 may be a metal plate or ring, such as a brass plate, that extends beyond the edges of cavity 331. The first portion 322 and the second portion 325 may be operatively coupled via adhesive including conductive adhesives. The soldering points 335 and 340 may be silver solder contact points for operative electrical coupling to metal traces on contact foil 310. The brass plate 325 supports deflection of the piezoelectric element 320 into the cavity 331 to detect mechanical actuation of the key 300. In an embodiment, the support plate 330 may have cavity 330 formed therein such that the piezoelectric element 320 may be allowed to be deflected therein when the key 300 is actuated by a user and cavity 331 may be an aperture or hole through support plate 330 or may be a depression or hole in support plate 330 that does not pass through 330.

The piezoelectric element 320 may be electrically and communicatively coupled to the metal traces formed on the contact foil 310 via a metallic connection points 335 and 340 such as a solder dot. In a specific embodiment, the piezoelectric element 320 may be electrically and communicatively coupled at a first portion 322 to a metallic trace formed on the contact foil 310 by a first soldering point 335 and at a second portion 325 to a metallic trace in contact foil 310 via a second soldering point 340. The soldering points 335 and 340 may be silver contact points for making electrical contact to first portion 322 and second portion 325 of the piezoelectric element 320. As so oriented, the first soldering point 335 and second soldering point 340 may be formed to receive an electrical charge upon deflection of the piezoelectric element 320 as a user actuates the key 300. As described herein, the electrical charge may be detected by the controller as received from the electrically-conductive metal traces and portions 322 and 325.

Upon receiving an actuation signal, the controller sends an electrical signal back to the piezoelectric element 320 via the metal traces formed on the contact foil 310, through the soldering points 335 and 340 and to a conductive layer of metallic plate or ring 325 formed below the piezoelectric disk material 322. The conductive layer of metallic plate or ring 325 may apply the electrical signal to the piezoelectric disk material 322 so as to cause the piezoelectric disk material 322 to stretch or shrink depending on the polarity of the signal applied. For example, a negative signal applied to piezoelectric disk material element 322 relative to the charge at adhesively attached metallic plate 325 may cause piezoelectric disk 322 to expand or stretch in embodiments herein. This may cause metallic plate 325 to warp downward. Reversing polarity to the piezoelectric disk 322 may cause the piezoelectric disk 322 to compress or shrink and metallic plate 325 may warp upwards. The principle of haptics applied to the piezoelectric disk 322 includes an input voltage is applied through the two electrodes (voltage change as sine wave, square wave etc.) to generate movement on piezoelectric material 322 of the piezoelectric element 320 and a warping of the metallic layer or disk 325. This haptic response signal is used to cause a haptic tactile feedback such as a depression and return of the key 300 or a haptic "click" of a touchpad and which may be accompanied by a sound. Such an electrical signal, such as a sine wave signal, or other haptic response signals with varying polarities or voltage and current may be used by the controller to create the haptic feedback felt by the user as described herein. In these embodiments, the electric charge sent from the piezoelectric element 320 to the controller and the electrical signal sent from the controller to the piezoelectric element 320 may propagate along the two metal traces formed on the contact foil 310. The contact foil 310 may therefore, in an embodiment, include double the number of metal traces as that of the number of piezoelectric elements 320 used to form a keyboard that includes multiple keys 300.

FIG. 3A shows an image of a single key 300. The present specification contemplates that a plurality of keys 300 may be formed alongside each other in order to form, for example, a number pad, a keyboard, or a combination thereof. Consequently, although the features of the key 300 depicted in FIG. 3A apply to a single key 300, the present specification contemplates that any number of keys 300 may be formed on the keyboard so as to allow for the formation of an input device such as a keyboard. The keys 300 may be of any size (e.g., spacebar, tab key, or the like) and depending on size may include more than one piezoelectric element 320 associated with it. As the user actuates each of the keys 300, a haptic feedback may be felt by the user so as to present to the user a sensation that the key was pressed.

The formation of the key 300 may, in the embodiments presented herein, provides for a keyboard that has a relatively shorter distance of key travel as compared to those keyboards that implement mechanical devices such as a scissor mechanisms and key caps. In an embodiment, the distance of travel of the key 300 may be smaller than 0.1 mm. With the shorter distance of key travel, the overall thickness of the keyboard placed within an information handling system may be reduced. This increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may also result in the reduction of the weight of the information handling system thereby increasing the portability of the information handling system by the user.

The keys 300 of the present embodiments also include no moving mechanical parts. With the absence of mechanical moving parts, the key 300 of the presently described embodiments may be relatively more robust thereby increasing the useful life of the key 300. This may increase user satisfaction over the useful lifetime of the information handling system.

Figure 3B:
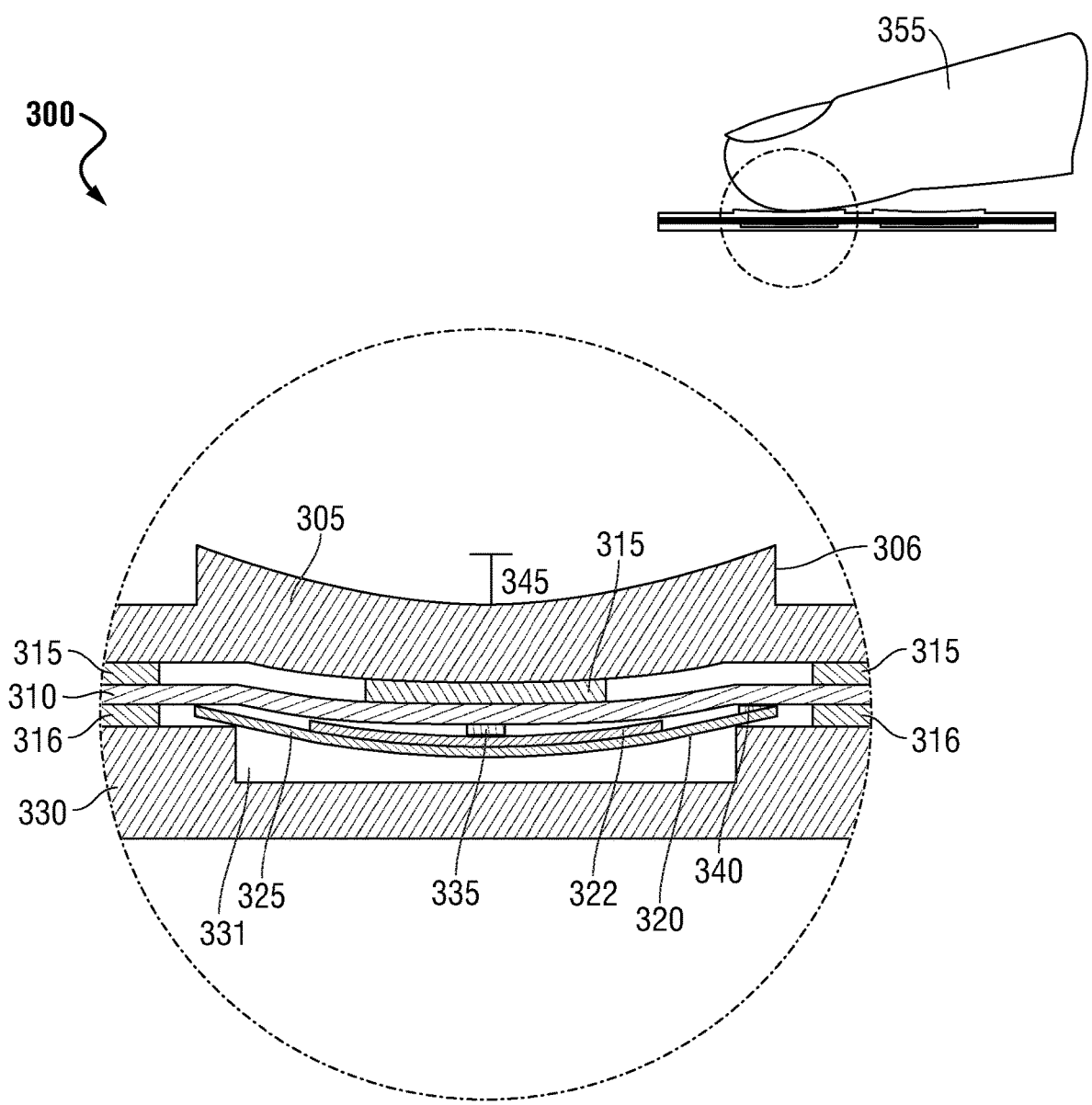
FIG. 3B is a side cut-out view of a key of a keyboard implementing a piezoelectric element in an actuated state according to an embodiment of the present disclosure.

FIG. 3B is a side cut-out view of a key 300 of a keyboard implementing a piezoelectric element 320 in an actuated state by a finger 355 according to an embodiment of the present disclosure. According to an embodiment, the key 300 may be formed of a plurality of layers, one layer of which is a piezoelectric element 320 made of a piezoelectric material, such as piezoelectric disk 322, and a of metallic plate or ring 325. Although FIG. 3B shows a cross-sectional view of a single key 300, the present specification contemplates that a keyboard may include a plurality of these keys 300. Also, a C-cover layer may further include a touchpad including a piezoelectric element 320 as described herein. Consequently, FIG. 3B is not intended to be limiting but merely intended as a description of operation of any portion of the input device contemplated by the present disclosure.

The key 300 includes a coversheet 305. The coversheet 305 may be made of any type of elastically resilient material. The coversheet 305 may cover a plurality of keys but also be continuous and cover any touchpad on the C-cover in some embodiments described herein. In other embodiments, one or both of a keyboard or touchpad may be separately disposed at vias in the coversheet of the C-cover as described herein. The elastically resilient material may allow, at least, a portion of the key 300 to be deformed upon application of a pressure from a user's finger. Upon withdraw of the pressure from the user's finger, the material the coversheet 305 is made of allows the coversheet 305 of the key 300 to bend back to its pre-deformed form. In an embodiment, the resilient material may allow the coversheet 305 to travel a distance of between 0.01 mm and 2 mm. FIG. 3B shows, in contrast to FIG. 3A, the deformation of the coversheet 305 piezoelectric element 320, and conductive layer 325. In some embodiments, portions of a first adhesive layer 316 and second adhesive layer 315 placed between the remaining layers of the key 300 may also be compressed when the finger 355 of a user deforms the remaining layers of the key 300.

In an embodiment, the shape of the coversheet 305 may include key pedestal 306 and may be concave so as to conform to a user's finger. In an embodiment, in order to shape the coversheet 305, the material used to form the coversheet 305 may be subjected to an injection molding process. As described herein, this may include multiple keys of a keyboard as well as other portions of the C-cover including any piezoelectric touchpads as described herein. A top portion of the coversheet 305 may be formed to be ergonomically beneficial to a user's actuation such as providing key or touchpad location identification such as key pedestal or framing or by conforming to the user's fingers, for example. The injection molding process may be completed prior to the installation of the coversheet 305 into the remaining layers within the keyboard or touchpad as described herein. Any number of processes may be included with the injection molding process. In an embodiment, the injection molding process used to form the coversheet 305 may include forming a number of holes within a sheet of acrylonitrile butadiene styrene (ABS). These holes may correlate with a number of keys on a keyboard. The formation of the coversheet 305 may continue with injection molding a translucent ABS through the holes to form a raised portion as a key pedestal correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In other embodiments, each key 300 may be formed such that it has a coversheet 305 with key pedestals 306 disposed through key vias in the C-cover coversheet (not shown). In such embodiments, the key 300 shown in FIG. 3B may be a structure for one or more keys of a solid state keyboard with any of the layers being independent or shared among the plurality of keys 300 in the keyboard.

In other embodiments, the coversheet 305 may include number holes for key vias and for a touchpad via. Each haptic key of the haptic keyboard may include a cover layer that protrudes through the key vias in the coversheet 305. Layering under the coversheet may include material layers that are hydrophobic such as Gore® membrane or similar materials or gaskets of rubber, silicone, foam or other materials having other properties. Though gaps between haptic keys and key vias may be minimized, such gaps may be useful for cooling ventilation of the base chassis or for allowing backlighting to frame the haptic keys. Similarly, a touchpad top touch interface layer may be attached under the coversheet 305 to seamlessly provide a designated touchpad area in the C-cover coversheet 305. Any combination of continuous coversheet for haptic keys or the haptic touchpad and vias in the coversheet for placement of haptic keys of a keyboard or a touchpad top touch interface layer are contemplated in various embodiments. Further, it is contemplated that in some embodiments one or the other of a haptic keyboard or haptic touchpad may be used with a keyboard having mechanically actuated keys or a touchpad with a mechanically actuate diving board mechanism.

The key 300 may further include a number of adhesive layers 315 such as the first adhesive layer 315 and second adhesive layer 316 described herein that physically couples the various layers of the key 300 together. In an embodiment, the first adhesive layer 315 may be formed on the coversheet 305 to adhere the coversheet 305 to a contact foil 310. The first adhesive layer 315 may be include the placement of the adhesive at locations that may enhance the movement or prevent the hinderance of the actuation of the coversheet 305. In a specific embodiment, the first adhesive layer 315 may include placing the adhesive along borders of the key 300 as well as placing the adhesive at a central location of the key 300.

The contact foil 310 adhered to the coversheet 305 via the first layer of adhesive 315 may be made of any elastically resilient material that, when the key 300 is actuated by a user's finger 355 or the contact foil 310 is bent towards a lower portion of the key 300, returns to its original state when the key 300 is no longer being actuated. The contact foil 310 may include a number of metal traces formed thereon that electrically and communicatively couple each of the keys 300 and a corresponding piezoelectric element 320 to a controller such as a processor of an information handling system that includes a haptic feedback keyboard control system such as described in connection with FIG. 1. During operation of the key 300, the contact foil 310 may receive an electrical charge from the piezoelectric element 320 at the metal traces that conduct the electrical charge to the processor or other controller associated with the key 300. As the piezoelectric disk material 322 is compressed by deflection and the metal plate or ring 325 warped downward, a change in voltage may be detected. The electrical charge created when the user actuates the key 300 with the user's finger 355 and the piezoelectric element 320 is subjected to a mechanical stress may be detected between soldering points 335 and 340. The electrical charge is communicated down metal traces formed on the contact foil 310 to a controller (not shown).

The metal traces formed on the contact foil 310 may further be used to conduct a return electrical signal from the controller to the piezoelectric element 320 so that the voltage and current of the return electrical signal may cause the piezoelectric element 320 compress further and then contract to return to warp upward and downward before returning to a planer and rigid form of the piezoelectric element 320 as would be required to cause a specified haptic event response to the user via coversheet 305. This actuation causing warping of the piezoelectric element 320 may cause a haptic feedback presented at the key 300 via the contact foil 310, adhesive 315, and coversheet 305 that the user may feel at the user's finger 355. This haptic feedback may be relayed to the user within microseconds of the user actuating the key 300 with the user's finger 355 such that the user physically detects a sensation, at that finger 355, that the key 300 was pressed. This sensation felt by the user may be present despite no actual mechanical devices such as a scissor mechanism of other types of keyboard mechanical devices being present among the layers of the key 300.

In an embodiment, portions of the contact foil 310 may be physically coupled to a support plate 330 via a second layer of adhesive 316. The location of the placement of the second adhesive layer 316 may include placing the adhesive along borders of the key 300.

In an embodiment presented herein, the piezoelectric element 320 may be any solid material that accumulates an electric charge when a mechanical stress is applied to it or specifically, in the embodiments presented herein, the solid material is deformed. Solid materials used to form the piezoelectric disk 322 or other piezoelectric material as part of a first portion 322 of the piezoelectric element 320 may include crystals, ceramics, biological matter, protein layers, among other types of materials. For ease of explanation, the piezoelectric disk material 322 may be made of a type of ceramic although the present specification contemplates the use of these other types of materials.

The piezoelectric element 320 may be housed over a cavity 331 formed under a bottom surface of the contact foil 310. The cavity 331 may be formed into or through a top surface of the support plate 330, and the second layer of adhesive 315. In an embodiment, the support plate 330 may have the cavity 331 formed therein such that the piezoelectric element 320 may be allowed to be deflected therein when the key 300 is actuated by application of a force of the user's finger 355.

The piezoelectric element 320 may be electrically and communicatively coupled to the metal traces formed on the contact foil 310 via a metallic connection point such as a solder dot 335, 340. The soldering points 335 and 340 may be silver contact points for making electrical contact to first portion 322 and second portion 325 of piezoelectric element 320. In a specific embodiment, the piezoelectric element 320 may be electrically and communicatively coupled to a metallic trace formed on the contact foil 310 by a first soldering point 335 and a second soldering point 340. The first portion 322 of piezoelectric element 320, such as a piezoelectric disk, may be coupled to the contact foil 310 via the first soldering point 335. The second portion 325 of piezoelectric element 320, such as a metal plate or ring, may be coupled to the contact foil 310 via the second soldering point 340. As so oriented, the first soldering point 335 and second soldering point 340 may be formed to receive an electrical charge upon deflection and mechanical stress of the piezoelectric disk 322 as a user's finger 355 actuates the key 300. As described herein, the electrical charge may be detected by the controller as received from the electrically-conductive metal traces and portions 322 and 325.

Upon receiving an actuation signal, the controller sends an electrical signal back to the piezoelectric element 320 via the metal traces formed on the contact foil 310, through the soldering points 335 and 340 and to a conductive layer of metal plate or ring 325 formed below the piezoelectric disk material 322. The conductive layer of metal plate or ring 325 and contact point 335 may apply the electrical signal to the piezoelectric disk material 322 so as to cause the piezoelectric disk material 322 to stretch or shrink depending on the polarity of the signal applied. For example, a negative signal applied to piezoelectric disk material 322 relative to the charge at adhesively attached metallic plate 325 may cause piezoelectric disk 322 to contract or shrink in embodiments herein. This may cause metallic plate 325 to warp downward. Reversing polarity to the piezoelectric disk 322 may cause the piezoelectric disk 322 to stretch and metallic plate 325 may warp upwards. The principle of haptics involves an input voltage applied through the two electrodes (with a responsive voltage change signal such as a sine wave, a square wave, or other wave form that changes in polarity, voltage, or current) to generate movement on piezoelectric material of the piezoelectric element 320 which causes a haptic feedback event in coordination with warping the metallic plate 325 based on the movement of the piezoelectric material layer 322. A tactile haptic sensation such as a mimicked keystroke or "click" may be generated in some example embodiments of haptic feedback events. The haptic feedback event may also be accompanied by a generated sound in some embodiments. Such an electrical haptic feedback signal, such as a sine wave signal, square wave signal, pulsed signals, or other signals varying polarities, voltages, or currents may be used by the controller to create the haptic feedback felt by the user at the user's finger 355 as described herein. In these embodiments, the electric charge sent from the piezoelectric element 320 to the controller and the electrical signal sent from the controller to the piezoelectric element 320 may propagate along the two metal traces formed on the contact foil 310. The contact foil 310 may therefore, in an embodiment, include double the number of metal traces as that of the number of piezoelectric elements 320 used to form a keyboard that includes multiple keys 300.

FIG. 3B shows an image of a single key 300. The present specification contemplates that a plurality of keys 300 may be formed alongside each other in order to form, for example, a number pad, a keyboard, or a combination thereof. Consequently, although the features of the key 300 depicted in FIG. 3B apply to a single key 300, the present specification contemplates that any number of keys 300 may be formed on the keyboard so as to allow for the formation of an input device such as a keyboard. The keys 300 may be of any size (e.g., spacebar or a tab key) and in some embodiments more than one piezoelectric element may be associated with larger keys. As the user actuates each of the keys 300, a haptic feedback may be felt by at the user's finger 355 so as to present to the user a sensation that the key was pressed.

The formation of the key 300 may, in the embodiments presented herein, provides for a keyboard that has a relatively shorter distance of key travel as compared to those keyboards that implement mechanical devices such as a scissor mechanisms and key caps. In an embodiment, the distance of travel of the key 300 may be smaller than 0.1 mm. With the shorter distance of key travel, the overall thickness of the keyboard placed within an information handling system may be reduced. This increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may result in the reduction of the weight of the information handling system thereby increasing the portability of the information handling system by the user.

Figure 3C:
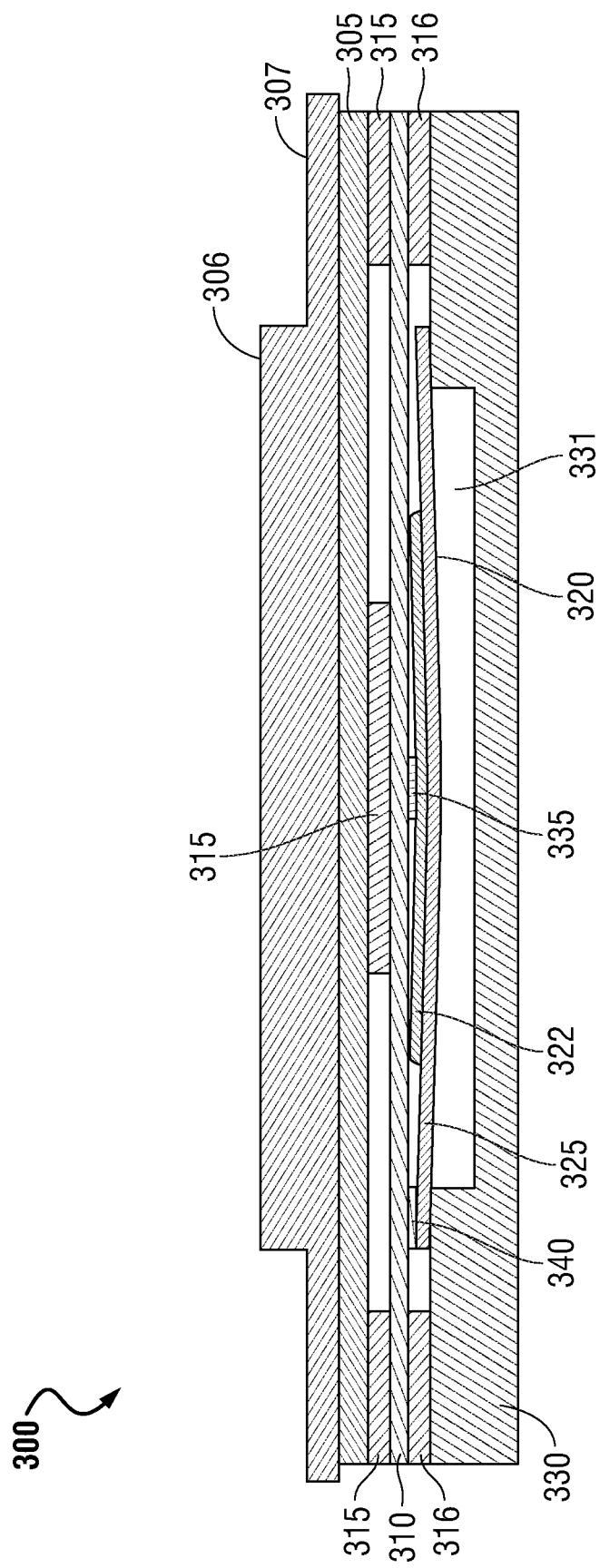
FIG. 3C is a side cut-out view of a key of a keyboard implementing a piezoelectric element in an unactuated state with a top replaceable overlay according to another embodiment of the present disclosure.

FIG. 3C is a side cut-out view of a key 300 of a keyboard implementing a piezoelectric element 320 in an unactuated state and including a top replaceable overlay on a coversheet of the key 300 according to an embodiment of the present disclosure. According to an embodiment, the key 300 may be formed of a plurality of layers, one layer of which is a piezoelectric element 320. Although FIG. 3C shows a cross-sectional view of a single key 300, the present specification contemplates that a keyboard may also include a plurality of these similar keys 300 arranged as, for example, a QWERTY-type keyboard or a variety of available top replaceable overlays for other keyboard layouts or keyboard languages. The present specification also contemplates that, in addition to a keyboard, an information handling system described herein may also include a touchpad including a piezoelectric element 320 as described herein. Consequently, FIG. 3C is not intended to be limiting but merely intended as a description of operation of any type of input device contemplated by the present disclosure.

The key 300 includes a coversheet 305 and a top replaceable overlay layer 307. The coversheet 305 or the top replaceable overlay layer 307 may be made of any type of elastically resilient material. Coversheet 305 or top replaceable overlay layer 307 may be part of a single material coversheet and may utilize any type of various materials described herein. The elastically resilient material may allow, at least, a portion of the key 300 to be deformed upon application of a pressure from a user's finger. Upon withdraw of the pressure from the user's finger, the material the coversheet 305 or the top replaceable overlay layer 307 is made of allows the coversheet 305 and any top replaceable overlay layer 307 of the key 300 to bend back to its pre-deformed state. In an embodiment, the resilient material may allow application of actuation pressure to the top replaceable overlay layer 307 to cause the coversheet 305 to travel a minimal distance and still deform a piezoelectric element 320. For example, a distance of between 0.01 mm and 2 mm may be compressed in the stackup including the coversheet 305 and piezoelectric element. In an embodiment, the distance is between 0.05 mm and 0.15 mm. In an embodiment, the distance is 0.1 mm. The piezoelectric element 320 may deform between 5 microns and 30 microns in some embodiments.

In an embodiment, the shape of the top replaceable overlay layer 307 may have a selection of key pedestals 306 of various sizes and shaped so as to conform to a user's finger. In an embodiment, in order to shape the top replaceable overlay layer 307, the material used to form the top replaceable overlay layer 307 may be subjected to an injection molding process. As such, a top portion of the top replaceable overlay layer 307 may be formed to be ergonomically beneficial to a user's actuation such as by conforming to the user's fingers and including a pedestal 306 to highlight the key location, for example. In other embodiments, no key pedestals may be formed and a key location may be designated in top replaceable overlay layer 307 via markings, depressions, key framing, or other methods. The injection molding process may be completed to form the top replaceable overlay layer 307. The top replaceable overlay layer 307 may be installation on the coversheet 305 via adhering the top replaceable overlay layer 307 to the coversheet 305 via magnetic attachment or other affixable and removable attachment such as adhesives or the like according to embodiments herein. The top replaceable overlay layer 307 may also trigger sensors to detect the attachment of the top replaceable overlay layer 307 as described in embodiments herein. The coversheet 305 may be similarly adhered into the remaining layers within the keyboard 300 as described herein. Any number of processes may be included with the injection molding process. In an embodiment, the injection molding process used to form the coversheet 305 may include forming a number of holes within a sheet of acrylonitrile butadiene styrene (ABS). These holes may correlate with a number of keys on a keyboard. The formation of the top replaceable overlay layer 307 may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the top replaceable overlay layer 307 on which the raised portions are formed may be painted and any number or type of graphics may be laser etched on each raised portion indicating a specific key of the keyboard. The top replaceable overlay layer 307 may reflect differing alphanumeric characters for different language keyboards for example and the haptic keyboard controller may adjust the scan code designation of the piezoelectric element 320 actuation signal received via a contact foil 310 based on the detected top replaceable overlay detected by the top replaceable overlay adaptation system as described in embodiments herein.

Similar to other embodiments describing the haptic key stackup of embodiments herein, the key 300 may further include a number of adhesive layers 315 and 316 that physically couple the various layers of the key 300 together. In an embodiment, a first adhesive layer 315 may be formed on the coversheet 305 to adhere the coversheet 305 to a contact foil 310. The first adhesive layer 315 may include the placement of the adhesive at locations that may enhance the movement and prevent the hinderance of the actuation of the coversheet 305. In a specific embodiment, the first adhesive layer 315 may include placing the adhesive along borders of the key 300 as well as placing the adhesive at a central location of the key 300.

The contact foil 310 adhered to the coversheet 305 via the first layer of adhesive 315 may be made of any elastically resilient material that, when the coversheet 305 of key 300 is actuated or the contact foil 310 is bent towards a lower portion of the key 300, returns to its original state when the key 300 is no longer being actuated. The contact foil is a flexible material, such as polyethylene terephthalate (PET) serving as a polyester printed circuit board or other type of flexible printed circuit board, in several example embodiments. The contact foil 310 may include a number of metal traces formed thereon that electrically and communicatively couple each of the corresponding piezoelectric element 320 of key 300 to a controller such as a processor of an information handling system that includes a haptic feedback keyboard control system such as described herein. Formation of metal traces may be made according to a variety of methods including photolithographic techniques for applying metal or lamination of copper strips or other metal layers. During operation of the key 300, the contact foil 310 may receive an electrical charge from the piezoelectric element 320 at the metal traces that conduct the electrical charge to the processor or other controller associated with the key 300. The metal traces formed on the contact foil 310 may further be used to conduct a return electrical signal from the controller to the piezoelectric element 320 so that the voltage and current of the return electrical signal may cause the piezoelectric element 320 to warp upward and downward before returning to a planer and rigid form of the piezoelectric element 320 as would be required to cause a specified haptic event response to the user via coversheet 305. This actuation causing warping of the piezoelectric element 320 may cause a haptic feedback presented at the key 300 via the contact foil 310, adhesive 315, and coversheet 305 that the user may feel. This haptic feedback may be relayed to the user within microseconds of the user actuating the key 300 such that the user physically detects a sensation that the key 300 was pressed. This sensation felt by the user may be present despite no actual mechanical devices such as a scissor mechanism or other types of keyboard mechanical devices being present among the layers of the key 300. The signal to the piezoelectric element 320 may vary magnitude and pulsing to create the desired haptic response at key 300.

In an embodiment, portions of the contact foil 310 may be physically coupled to a support plate 330 via a second layer of adhesive 316. The location of the placement of the second adhesive layer 316 may include placing the adhesive along borders of the key 300.

In an embodiment presented herein, the piezoelectric element 320 may include a first portion 322 that may be any solid piezoelectric material that accumulates an electric charge when a mechanical stress is applied to it or specifically, in the embodiments presented herein, when the solid material is deformed. Solid materials used to form the piezoelectric element 320 may include crystals, ceramics, or protein layers, among other types of materials. For ease of explanation, the piezoelectric element 320 may be made of a type of ceramic although the present specification contemplates the use of other types of piezoelectric materials.

The piezoelectric element 320 may be housed over a cavity 331 formed in the support plate 330. The piezoelectric element 320 may comprise two portions 322 and 325 each electrically coupled via electric contact points such as soldering points 335 and 340, respectively, to a different electrical trace on a contact foil 310. The first portion 322 may be a ceramic disc in an embodiment. Second portion 325 of the piezoelectric element 320 may be a metal plate or ring, such as a brass plate, that extends beyond the edges of cavity 331. The first portion 322 and the second portion 325 may be operatively coupled via adhesive including conductive adhesives. The soldering points 335 and 340 may be silver solder contact points for operative electrical coupling to metal traces on contact foil 310. The brass plate 325 supports deflection of the piezoelectric element 320 into the cavity 331 to detect mechanical actuation of the key 300. In an embodiment, the support plate 330 may have cavity 330 formed therein such that the piezoelectric element 320 may be allowed to be deflected therein when the key 300 is actuated by a user and cavity 331 may be an aperture or hole through support plate 330 or may be a depression or hole in support plate 330 that does not pass through 330.

The piezoelectric element 320 may be electrically and communicatively coupled to the metal traces formed on the contact foil 310 via a metallic connection points 335 and 340 such as a solder dot. In a specific embodiment, the piezoelectric element 320 may be electrically and communicatively coupled at a first portion 322 to a metallic trace formed on the contact foil 310 by a first soldering point 335 and at a second portion 325 to a metallic trace in contact foil 310 via a second soldering point 340. The soldering points 335 and 340 may be silver contact points for making electrical contact to first portion 322 and second portion 325 of the piezoelectric element 320. As so oriented, the first soldering point 335 and second soldering point 340 may be formed to receive an electrical charge upon deflection of the piezoelectric element 320 as a user actuates the key 300. As described herein, the electrical charge may be detected by the controller as received from the electrically-conductive metal traces and portions 322 and 325.

Upon receiving an actuation signal, the controller sends an electrical signal back to the piezoelectric element 320 via the metal traces formed on the contact foil 310, through the soldering points 335 and 340 and to a conductive layer of metallic plate or ring 325 formed below the piezoelectric disk material 322. The conductive layer of metallic plate or ring 325 may apply the electrical signal to the piezoelectric disk material 322 so as to cause the piezoelectric disk material 322 to stretch or shrink depending on the polarity of the signal applied. For example, a negative signal applied to piezoelectric disk material element 322 relative to the charge at adhesively attached metallic plate 325 may cause piezoelectric disk 322 to expand or stretch in embodiments herein. This may cause metallic plate 325 to warp downward. Reversing polarity to the piezoelectric disk 322 may cause the piezoelectric disk 322 to compress or shrink and metallic plate 325 may warp upwards. The principle of haptics applied to the piezoelectric disk 322 includes an input voltage is applied through the two electrodes (voltage change as sine wave, square wave etc.) to generate movement on piezoelectric material 322 of the piezoelectric element 320 and a warping of the metallic layer or disk 325.

This haptic response signal is used to cause a haptic tactile feedback such as a depression and return of the key 300 or a haptic "click" of a touchpad and which may be accompanied by a sound. Such an electrical signal, such as a sine wave signal, or other haptic response signals with varying polarities or voltage and current may be used by the controller to create the haptic feedback felt by the user as described herein. In these embodiments, the electric charge sent from the piezoelectric element 320 to the controller and the electrical signal sent from the controller to the piezoelectric element 320 may propagate along the two metal traces formed on the contact foil 310. The contact foil 310 may therefore, in an embodiment, include double the number of metal traces as that of the number of piezoelectric elements 320 used to form a keyboard that includes multiple keys 300.

FIG. 3C shows an image of a single key 300. The present specification contemplates that a plurality of keys 300 may be formed alongside each other in order to form, for example, a number pad, a keyboard, or a combination thereof. Consequently, although the features of the key 300 depicted in FIG. 3C apply to a single key 300, the present specification contemplates that any number of keys 300 may be formed on the keyboard via a top replaceable overlay so as to allow for the formation of an input device such as a keyboard. The keys 300 may be of any size (e.g., spacebar, tab key, or the like) and alphanumeric character and depending on size may include more than one piezoelectric element 320 associated with it. As the user actuates each of the keys 300, a haptic feedback may be felt by the user so as to present to the user a sensation that the key was pressed.

The formation of the key 300 with the top replaceable overlay may, in the embodiments presented herein, provide for a keyboard that has a relatively shorter distance of key travel as compared to those keyboards that implement mechanical devices such as a scissor mechanisms and key caps. The top replaceable overlay 307 is tightly aligned to the coversheet 305 via the magnetic or other reusable attachment such as reusable adhesives or magnets in some embodiments. The tight alignment of the top replaceable overlay 307 on the coversheet 305 provides a close haptic feel and response and is not dictated by the key travel required for most mechanically actuated keys. Thus, the top replaceable overlay 307 of the haptic key of the present embodiment may also avoid any hollow travel of previous overlays to accommodate the travel of mechanically actuated keys. Thus, in an embodiment, the distance of travel of the key 300 may be smaller than 0.1 mm and this may include with the top replaceable overlay layer 307. With the shorter distance of key travel, the overall thickness of the keyboard placed within an information handling system may be reduced. Thus, the actuation needed to register a keystroke with the piezoelectric element 320 or elements of key 300 and the feel of the haptic feedback response event from the piezoelectric element 320 may remain similar to that of a system with just a coversheet layer 305 such as in embodiments of FIGS. 3A and 3B. This also increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may also result in the reduction of the weight of the information handling system thereby increasing the portability of the information handling system by the user.

The keys 300 of the present embodiments also include no moving mechanical parts. With the absence of mechanical moving parts and a closely adhered top replaceable overlay to designate desired key location, size, and alphanumeric character type, the key 300 of the presently described embodiments may be relatively more robust and flexibly modified thereby increasing the usefulness of the key 300. This may increase user satisfaction over the useful lifetime of the information handling system.

Figure 4:
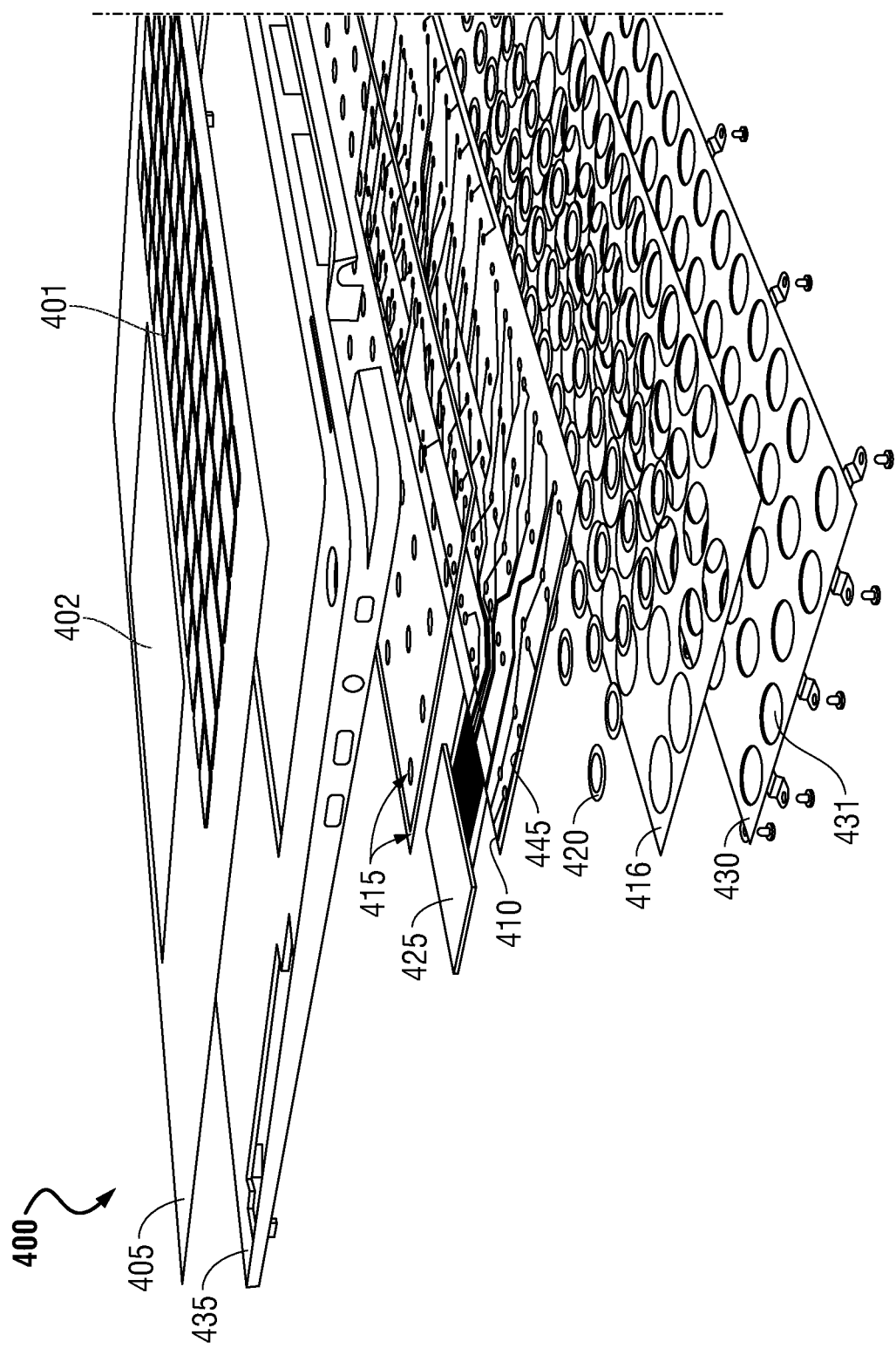
FIG. 4 is an exploded perspective view of a keyboard stack up for of an information handling system according to an embodiment of the present disclosure.

FIG. 4 is an exploded perspective view of a keyboard stack up 400 of an information handling system according to an embodiment of the present disclosure. The keyboard stack up 400 shows a plurality of keys, similar to those described in connection with FIGS. 3A and 3B, arranged so as to receive input from a user at multiple keys. FIG. 4 also shows a top coversheet 405 having both a keyboard 401 and a touchpad 402. Either or both of the keyboard 401 and touchpad 402 may be haptic systems as described in embodiments herein. In an embodiment, the keys may be arranged similar to a QWERTY design of a keyboard 401. However, other arrangements of any alphabetic, numeric, or symbolic keys is contemplated by the present description.

The keyboard stack up 400 may include several layers similar to those described in connection with FIGS. 3A, 3B or 3C. In an embodiment, the keyboard stack up 400 includes a coversheet layer 405. The coversheet layer 405 may be made of any type of elastically resilient material. Coversheet layer 405 may include a plurality of key designations, such as key pedestals as shown in keyboard 401 and a touchpad 402 area designation. The elastically resilient material may allow, at least, a portion of the coversheet layer 405 to be deformed upon application of a pressure from a user's finger. Upon withdraw of the pressure from the user's finger, the material the coversheet layer 405 is made of allows the coversheet layer 405 of the key to bend back to its pre-deformed form. In an embodiment, the resilient material may allow the coversheet layer 405 to travel a distance of between 0.01 mm and 2 mm. In some embodiments, coversheet layer 405 may be a single sheet material layer for the keyboard area designation 401, the touchpad area designation 402 and any palmrest area or bezel that covers the C-cover substructure. With such an embodiment, the coversheet layer may provide uniformity of material or color selection across the entire coversheet 405 or a choice of a variety of materials, textures or colors for use with the coversheet layer 405. In further embodiments, a spill proof and even water resistant feature to the haptic keyboard stackup 400 of the present embodiment may be realized with the single sheet material coversheet layer 405. With no gaps or cutouts to accommodate key or touchpad travel to actuate mechanical switches, avoidance of liquid spills or dirt entering the base chassis via the keyboard or touchpad may be achieved. In other embodiments, the keys and touchpad may used with a coversheet layer with vias to provide for some gaps as may be used for base chassis ventilation or for backlighting framing of keys. In such embodiments, hydrophobic material such as Gore® membrane or a gasket of rubber, silicone, foam or other material may be used at the gaps to prevent liquid or dirt from entering the keyboard stackup 400 described in the present embodiment.

In another embodiment, a top replaceable overlay (not shown) may be used with the keyboard stackup described herein. A reusable adhesive or magnetic attachment may be used to adhere the top replaceable overlay to the coversheet 405. For purposes herein with FIG. 4, it is understood that the coversheet 405 may have the top replaceable overlay to form key pedestals or designate key sizes and key layouts as well as types of alphanumeric designations according to the various embodiments described herein. The adhered top replaceable overly to the coversheet 405 may work with the coversheet to provide for actuation of the piezoelectric elements of the keys and touchpad in accordance with the embodiment described herein describing direct interface with the coversheet 405 except that a user may interface with the top replaceable overlay layer adhered to the coversheet 405 and translating actuation through the coversheet 405 to the keyboard stackup layers 400 within. In other embodiments, the top replaceable overlay may replace the coversheet 405 to for a replaceable coversheet 405 which may be magnetically or adhered with reusable adhesive to the structure beneath. In such an embodiment, the replaceable coversheet 405 may be placed over to the piezoelectric elements and the replaceable coversheet 405 may be used to actuate the piezoelectric elements as described below. In such an embodiment, a reusable adhesive may be used at 415 or no adhesive may be used with replaceable coversheet aligned and adhered magnetically or via a reusable adhesive not directly over the piezo electric element. In such embodiments, a protective membrane may be used of a hydrophobic material, such as a Gore® membrane for example over the piezoelectric element for protection during changes to the replaceable coversheet 405.

In an embodiment, the shape of the coversheet layer 405 or top replaceable overlay may be such so as to conform to the user's fingers. In an embodiment, in order to shape the coversheet layer 405, the material used to form the coversheet layer 405 may be subjected to an injection molding process. As such, a top portion of the coversheet layer 405 may be formed to be ergonomically beneficial to a user's actuation such as by providing a tactile key location designation and conforming to the user's fingers, for example. The injection molding process may be completed prior to the installation of the coversheet layer 405 into the remaining layers within the keyboard as described herein. Any number of processes may be included with the injection molding process. In an embodiment, the injection molding process used to form the coversheet layer 405 may include forming a number of holes within a sheet of, for example, ABS. These holes may correlate with each actuatable key to be formed on the keyboard 401. The formation of the coversheet layer 405 may continue with injection molding a translucent ABS through the holes to form a raised portion for key pedestals correlating with each of the number of keys on the keyboard 401. The raised portion for the key pedestals may include different and various materials used to form the raised portions. In an embodiment, the raised portions may be made of a fabric, silicone, or polycarbonate or combinations thereof. In an embodiment, the raised portion may include a fabric top layer with a polycarbonate insert bonded below the fabric top layer. In an embodiment, the raised portion may include a silicone or polycarbonate top layer with a polycarbonate insert bonded below the silicone or polycarbonate top layer. In an embodiment, the raised portion may include a polycarbonate top layer with a metal insert bonded below the polycarbonate top layer. In an embodiment, the raised portion includes a polycarbonate top layer with a silicone core bonded to the polycarbonate top layer. In each of these embodiments, the raised portion may be formed using an injection molding process, a compression molding process an insertion molding process, and a liquid silicone rubber (LSR) injection molding process, among other types of processes.

Opposite the raised portions a number of runners may be machined away to accommodate for receipt of other layers of the keyboard such as each of the piezoelectric elements 420. The surface of the coversheet layer 405 on which the raised portions of key pedestals are formed may be painted and any number or type of graphics may be laser etched on each raised portion indicating a specific key of the keyboard 401. As described, it is also contemplated that coversheet layer 405 may include a plurality of key vias for keys of the static keyboard of the present embodiments to be disposed through in some example embodiments. Similarly, it is contemplated that coversheet layer 405 may include a touchpad via as a window for a touchpad interface surface of a solid-state touchpad according to embodiments herein to be accessible in some aspects. Any combination of the above coversheet 405 layouts described is contemplated in embodiments described herein.

The keyboard stack up 400 may further include a C-cover substructure 435 forming part of the base chassis with a cutout for keyboard 401 and touchpad 402. In an embodiment, the touchpad 402 and coversheet layer 405 may form a monolithic piece that, for example, includes different polycarbonate-acrylonitrile butadiene styrene (PC-ABS) resins used to cosmetically differentiate the touchpad 402 from a remaining portion of the coversheet layer 405. In an embodiment, the different PC-ABS may include chemical properties that differentiates the touchpad 402 portion to the coversheet layer 405 via other properties such as stiffness. In an embodiment, the coversheet layer 405 may be expanded to extend over an area where a user may rest the user's palms against the information handling system often referred to as a palm rest. In an embodiment, the coversheet layer 405 may be expanded over the area of the palm rest through a material such as a glass. In this embodiment, the glass may be attached to a remaining portion of the C-cover substructure 435 through a bonding process or via metal inserts attached to glass and connected to the C-cover substructure 435 through a number of fastening devices.

In an embodiment, the C-cover substructure 435 may be made of a rigid material that prevents little or no movement. The rigidity of the C-cover substructure 435 allows the other layers within the keyboard 401 to be maintained within the information handling system. In an embodiment, the C-cover substructure 435 may be made to a metal.

The keyboard stack up 400, in an embodiment, may further include any number of adhesive layers 415. In an embodiment, a first adhesive layer 415 may mechanically couple the coversheet layer 405 to a contact foil layer 410. The first adhesive layer 415 may be include the placement of the adhesive at locations that may enhance the movement and prevent the hinderance of the actuation of the coversheet layer 405 at those locations across the coversheet layer 405 where keys are present. In a specific embodiment, the first adhesive layer 415 may include placing the adhesive along borders of each of the keys as well as placing the adhesive at a central location of each of the keys.

The contact foil layer 410 is adhered to the coversheet layer 405 via the first adhesive layer 415 may be made of any elastically resilient material that, when any given key is actuated or the contact foil layer 410 is bent towards a lower portion of the respective key, returns to its original state when the respective key is no longer being actuated. The contact foil layer 410 may include a number of metal traces 445 formed thereon that electrically and communicatively couples each of the keys and a corresponding piezoelectric element 420 to a controller 425 of an information handling system that includes a haptic feedback keyboard control system such as described in connection with FIG. 1. In an embodiment, the controller 425 may be a dedicated controller 425 communicatively coupled to the contact foil layer 410 so as to detect electrical charges from each of the piezoelectric elements 420 and provide electrical signals back to the respective piezoelectric elements 420. In an alternative embodiment, the controller 425 may be a processor of the information handling system that, among other computations and execution of other computer readable program code, also executes computer readable program code associated with the haptic feedback keyboard control system as described in FIG. 1.

During operation of each key on the keyboard 401, the contact foil layer 410 may receive an electrical charge from the respective piezoelectric elements 420 as they are compressed upon actuation at the metal traces 445 that conduct the electrical charge to the controller 425 associated with the keyboard 400. The metal traces 445 formed on the contact foil layer 410 may further be used to conduct a return electrical haptic response signal from the controller 425 to the piezoelectric elements 420 so that the voltage and current of the return electrical signal may cause the piezoelectric elements 420 to stretch or contract in response to a control haptic feedback signal and at varying polarities, voltages, or currents. This electrical response control signal to of each of the actuated piezoelectric elements 420 may cause a haptic feedback presented at each of the keys that the user may feel. This haptic feedback may be relayed to the user within milliseconds of the user actuating any of the keys on the keyboard 401 such that the user physically detects a sensation that the key was pressed. This sensation felt by the user may be present despite no actual mechanical devices such as a scissor mechanism or other types of keyboard mechanical devices being present among the layers of the keyboard 401.

The keyboard stack up 400 may further include a second adhesive layer 416 that mechanically couples the contact foil layer 410 to a support plate 430. In an embodiment, the second adhesive layer 416 may include the placement of an adhesive along borders of each piezoelectric element 420 of the keyboard stack up 400. As shown in FIG. 4, the second adhesive layer 416 includes circular voids that conform to a shape of each piezoelectric element 420 within the keyboard stack up 400.

The support plate 430 may be made of rigid material such as a metal. The support plate 430 prevents deformation of the keyboard stack up 400 except for, in some embodiments, the contact foil layer 410, piezoelectric element 420, first adhesive layer 415, and second adhesive layer 416 as for operation of the haptic keys. As such, the contact foil layer 410 may be allowed to detect the deformation of the piezoelectric elements 420. Additionally, a user using the keyboard 401 may feel a level of rigidity in the keyboard 401 except that at the locations of the keys where the user has expected that some level of deformation occurs when pressure is applied to provide for key actuation of the piezoelectric element 420.

In an embodiment, the support plate 430 may include a number of cavities 431 formed therein. The cavities 431 may be sized to have a relatively smaller diameter than the diameter of each of the respective piezoelectric elements 420. By including these cavities 431, the piezoelectric elements 420 may be allowed to be deformed into the cavities 431 so that the deformation of the piezoelectric element 420 creates the electrical charge described herein.

The metal plate of the piezoelectric elements 420 may have a diameter greater than cavities 431. Upon compression or contraction of the piezoelectric material portions, such as a ceramic disk of the piezoelectric element 420, the metal plate may warp into or away from the cavity 431. The depth of the cavities 431 may also be selected to allow for at least a central portion of each piezoelectric element 420 to be deflected into the cavities 440 some distance. This distance of deflection, in an embodiment, may be 0.1 mm or smaller or may be greater. In an embodiment, the cavities 431 may also be holes punched or machined through the support plate 430.

In an embodiment, the support plate 430 may be secured to other rigid elements of the information handling system. In an embodiment, the support plate 430 may be secured to the C-cover substrate 435 via a number of bolts, screws, or other mechanical or chemical coupling device. In some embodiments, the support plate 430 may be operatively coupled to the D-cover of the information handling system.

Each of the piezoelectric elements 420 may include a first portion layer of piezoelectric material and a second portion conductive layer as described herein in connection with the larger figures describing the keys in FIGS. 3A, 3B, or 3C. Additionally, each piezoelectric element 420 of the keyboard 401 may be operatively coupled to at least one metal trace 445 formed on the contact foil layer 410 via a contact point such as a solder point. In this embodiment, the conductive layer associated with each of the piezoelectric materials of the piezoelectric elements 420 may be operatively coupled to at least one metal trace 445 formed on the contact foil layer 410 via a contact point such as a solder point. The contact foil layer 410 may, in a particular embodiment, include two metal traces 445 for each piezoelectric element 420 at a first portion and a second portion formed in the keyboard 401.

During operation of the keyboard 401, a user may actuate a key formed on the coversheet layer 405 of the keyboard 401 by pressing down on that key. As a result of the mechanical stress placed on the piezoelectric material of the piezoelectric element 420 associated with the actuated key, an electric charge is created at the piezoelectric element 420. The electrical charge is carried to one or more metal traces 445 coupled to the piezoelectric material and the metal plate of the piezoelectric element 420 via a contact point such as a solder point. The electric charge received at the one or more metal traces 445 may be conducted to a controller 425 by the metal trace 445 as described herein. In this embodiment, the controller 425 may detect that electrical charge produced by the mechanical stress of the piezoelectric material of the piezoelectric element 420 and send an electrical signal back to the piezoelectric material of the piezoelectric element 420. This electrical signal may have a certain voltage, current, and polarity (−, +) sufficient to render the piezoelectric material of the piezoelectric element 420 to cause a haptic event or sound. The electrical signal from the controller 425 may follow the same or a different metal trace 445 back to the piezoelectric element 420. The electrical signal may be received at the piezoelectric material and metal plate of the piezoelectric element 420 via, for example, a contact point such as a solder point. Because the piezoelectric material of the piezoelectric element 420 receives the electrical signal from the controller 425 this causes the piezoelectric material to be generate a haptic event. A response signal may be a sine wave, a square wave, a pulsed signal, or other waveform of changing current, voltage, or polarity applied to the piezoelectric element 420. As a result of the piezoelectric material stretching or contracting during the haptic event, the piezoelectric element 420 warp downward or upward with respect to the cavity 431 and may return back to a non-deformed state thereby creating haptic feedback felt by the user's finger. In an embodiment, the relay of the electrical charge to the controller 425, the detection of the controller 425 of the electrical charge, and the return of the electrical signal by the controller 425 to the piezoelectric element 420 may be sufficiently quick enough for the user to feel the haptic feedback in a manner that the user does not detect any temporal delay between the actuation of the key and the detection of the haptic feedback created at the piezoelectric element 420. In an embodiment, the relay of the electrical charge to the controller 425, the detection of the controller 425 of the electrical charge, and the return of the electrical signal by the controller 425 to the piezoelectric element 420 may be on the order of microseconds. This operation of each of the keys of the keyboard 401 may be conducted every time the user actuates any key on the keyboard 401.

Figure 5:
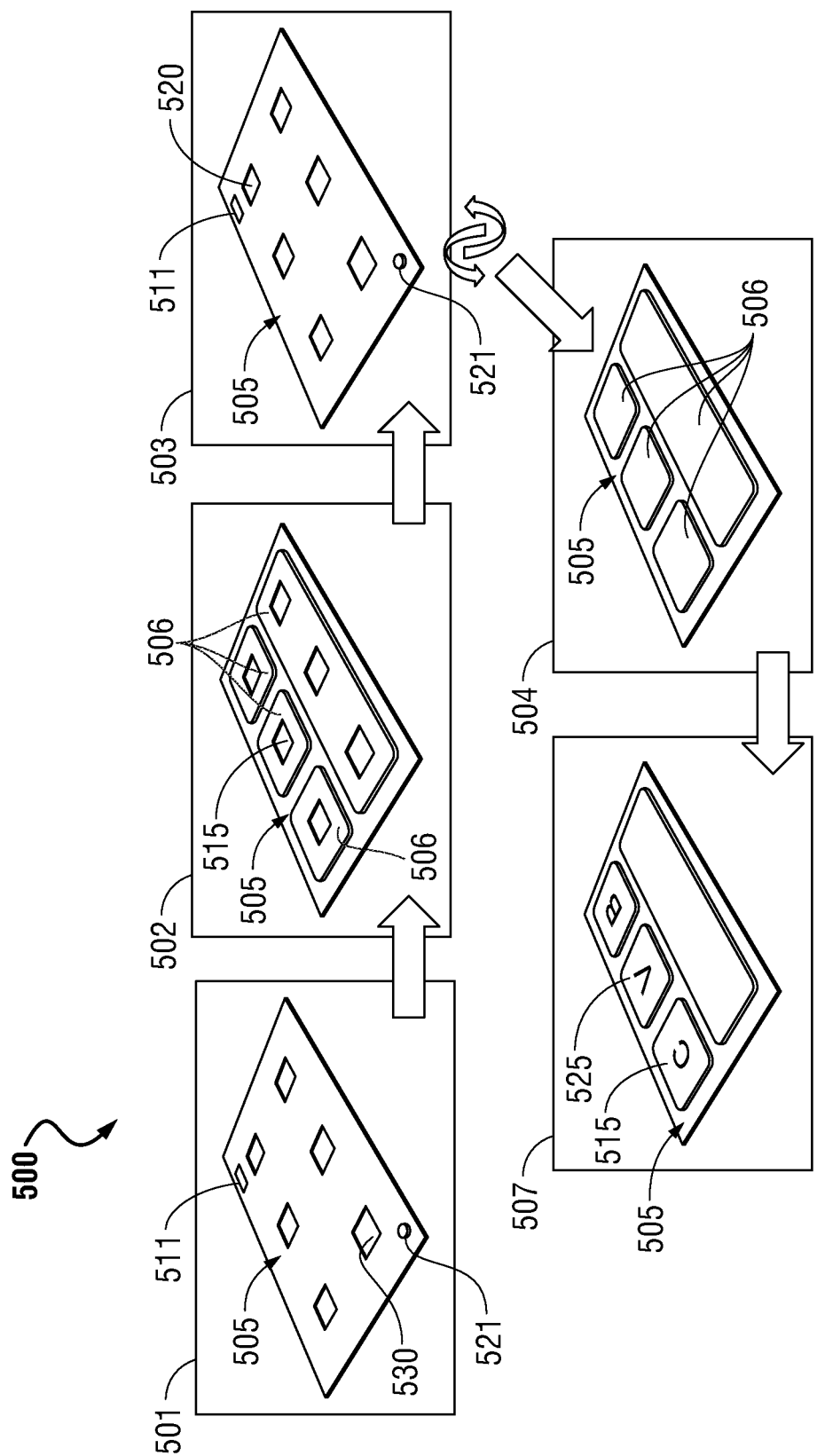
FIG. 5 is a series of sequential graphical views depicting a manufacture process of a coversheet of a keyboard according to an embodiment of the present disclosure.

FIG. 5 is a series of sequential graphical views 501, 502, 503, 504, and 507 depicting manufacture process 500 of a coversheet of a keyboard according to an embodiment of the present disclosure. A similar process may be used to manufacture a top replaceable overlay for use with some embodiments herein. The manufacture process 500 of the coversheet or top replaceable overlay may be done so as to produce a layer that a user may come in contact with during use of the keyboard. In an embodiment, the shape of the coversheet or top replaceable overlay may be such so as to conform to a user's finger.

The manufacture process 500 may begin at 501 with forming a number of holes 530 within a sheet of ABS 505. These holes may correlate with a number of keys on a keyboard. Although specific embodiments describe that the holes 530 are formed into a sheet of ABS 505, the present specification contemplates the use of other types of materials that are elastically resilient material that allows for deformation of the keyboard upon application of a force but provides for the return of the material to a pre-deformed state after that force is removed.

The manufacture process 500 may continue at 502 with injection molding a translucent ABS 515 through the holes 530 to form a raised portion as key pedestals 506 correlating with each of the number of keys on the keyboard. In an embodiment where a top replaceable overlay is formed according to the process of FIG. 5, one or more magnets may be placed such as at 511 into the mold for incorporation into the injection mold to enable embodiments herein involving detection by Hall effect sensors in the base chassis of the information handling system for interpretation by a top replaceable overlay adaptation system in determining which top replaceable overlay has been attached. In a particular embodiment, the location for the magnets may be silicone overmolded into the top replaceable overlay. The location 511 of one or more magnets and the polarity of the placed magnet may be varied to provide different combinations corresponding to a plurality of top replaceable overlays. In other embodiments, the one or more magnets at locations such as shown at 511 may be affixed on the backside or topside surface of the top replaceable overlay via mechanical or chemical means such as a snap fit or clip or via an adhesive. In a further embodiment, a trench or cavity may be formed in the injection mold or machined from the backside or topside of the top replaceable overlay for placement and attachment of the one or more magnets at locations such as 511 as described above. The magnets 511 may be silicone overmolded into a cavity of the top replaceable overlay in a particular embodiment.

In a further aspect, the top replaceable overlay may be used with a coversheet that may also have corresponding magnets, ferromagnetic inserts, or Hall effect sensors embedded or attached to locations such as 511 in the coversheet over the C-cover of the information handling system. The location 511 is an example for a magnet, ferromagnetic insert, or Hall effect sensor in example embodiments for illustration but such a location is not limiting and it is understood that the above may be placed anywhere in a coversheet or top replaceable overlay formed according to embodiments herein. The coversheet may also be formed via the ABS injection molding as described in the process herein of FIG. 5. A single sheet coversheet may be formed by such a process to include a haptic keyboard area, at touchpad area, palmrests and any bezel and may have a top replaceable overlay magnetically or adhered via reusable adhesive to it in some embodiments. The magnets, ferromagnetic strips or insert zones, or Hall effect sensors may be embedded in the coversheet injection mold at 511 in some embodiments. In a particular embodiment, the location for the magnet, ferromagnetic inserts, or Hall effect sensors may be silicone overmolded into the coversheet. In other embodiments, the magnets, ferromagnetic strips or insert zones, or Hall effect sensors may be attached to the underside or topside of the coversheet via mechanical or chemical attachments such as press fit into a cavity, clipped or slotted to the coversheet, or adhered via chemical adhesives such as at 511. The locations of the magnets, ferromagnetic strips or insert zones, or Hall effect sensors may be placed in the coversheet to correspond to attachment magnet locations in the top replaceable overlays that are to be attached in some embodiments. In a further aspect, the injection mold of the coversheet may include guide walls, slots, alignment pedestals or cavities, or other structures on the top side to align with the underside of a top replaceable overlay to ensure alignment over piezoelectric elements and, in some embodiments to assist in mechanical attachment of the top replaceable overlay to the coversheet of the C-cover of the information handling system. The top replaceable overlay may include corresponding underside structures such as edges, trenches, or walls to align with any guide walls or slots, or any alignment cavities or pedestals 521 to align with a corresponding structure on the coversheet.

In a backside view of coversheet or top replaceable overlay 505 shown in 503, the raised portions formed by the translucent ABS 515 may be machined away to form a number of runners 520 to accommodate for receipt of other layers of the keyboard. The manufacture process 500 may then include, on the top side of the coversheet or top replaceable overlay 505 of ABS shown at 504, painting the coversheet or top replaceable overlay 505 and key pedestals 506 a selected color. At 507, any number or type of graphics 525 may be painted or etched onto the surface of the coversheet or top replaceable overlay on which the raised portions of the translucent ABS are formed into key pedestals 506. In an embodiment, the keyboard may be formed out of a plurality of sheets of ABS 505 subjected to the manufacture process 500 described herein. In an embodiment, a single sheet of ABS 505 may be subjected to the manufacture process 500 described herein to form all of the keys of the keyboard, a touchpad, palmrests, and any bezel of a coversheet or top replaceable overlay 505 a user is to interact with.

Figure 6:
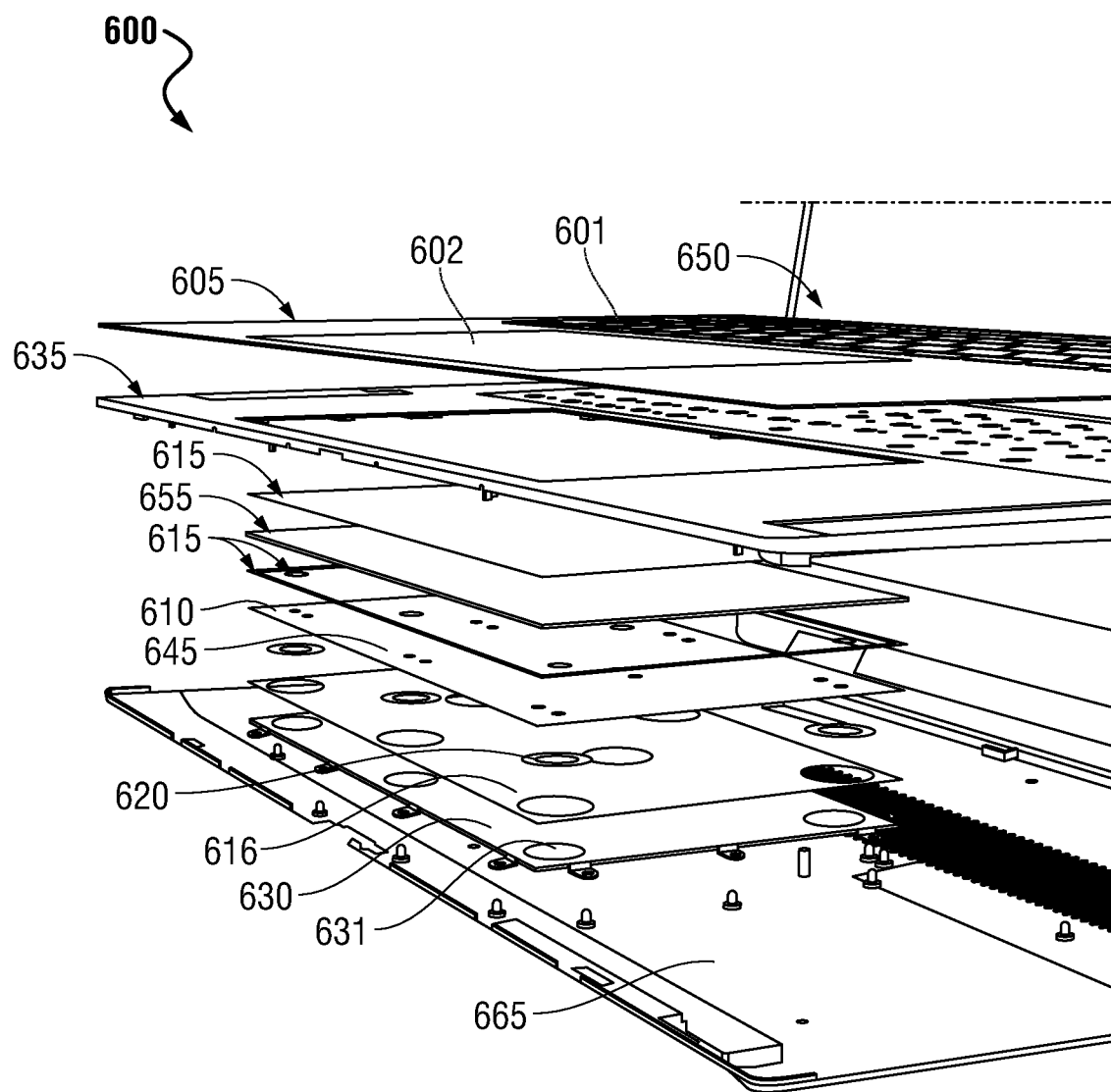
FIG. 6 is an exploded perspective view of a touchpad stack up for an information handling system according to another embodiment of the present disclosure.

FIG. 6 is an exploded perspective view of a touchpad stack up 600 of an information handling system according to another embodiment of the present disclosure. As described herein, the touchpad stack up 600 may also have a touchpad that implements the piezoelectric elements 620 described herein. The touchpad may be formed, in some embodiments, into a touchpad cover area 602 in coversheet layer 605. Coversheet 605 may also have a number of keys of a keyboard 601. The coversheet 605 may also have no keys by may be flat and have magnets, ferromagnetic inserts, or Hall effect sensors for use with a top replaceable overlay (not shown) attachable to the coversheet 605 as described with several embodiments herein. In yet other embodiments, the coversheet 605 may have a set of keys for a default keyboard such as a QWERTY-type keyboard and also have magnets, ferromagnetic inserts, or Hall effect sensors for use with the top replaceable overlays of embodiments described more fully herein. The top replaceable overlay may be fittingly attached magnetically or via reusable adhesive to tightly nest into the default keyboard layout of keys in the existing coversheet 605 in such embodiments. Coversheet 605 may have one or both the haptic touchpad 602 and haptic keyboard 601 in some embodiments. Coversheet 605 may be made of a single sheet material for touchpad 602, keyboard 601, and palmrests or any bezel around the same in embodiments as described herein. Such a coversheet of a single continuous material may provide for ease of manufacturing to ensure continuity of colors among the touchpad 602, keyboard 601, and palmrest or bezel as well as provide for a variety of materials to use with such coversheets 605 as described in embodiments herein. Further, a single sheet material for coversheet 605 may include a feature of having no vias thus reducing or eliminating risk of fluid spills or dirt from entering the base chassis of the information handling system via the keyboard 601 or touchpad 602. In other embodiments, either the haptic touchpad 602 or keyboard 601 may be a conventional system where keys or the touchpad interface layer appear through vias in the C-cover coversheet. In some example embodiments, the haptic keyboard 601 may have key vias or the haptic touchpad may have a touchpad via in the C-cover. In such embodiments, a hydrophobic membrane such as a Gore® membrane or gasket of rubber, silicone, foam or other material may be used around the vias to deter fluid or dirt from entering the base chassis of the information handling system. In other example embodiments, a mechanical keyboard 601 may be implemented with a haptic touchpad 602 or vice versa. In another embodiment, the touchpad coversheet layer 605 may be separate from any other coversheet layer such as for the keyboard 601 or other portions of a C-cover.

The touchpad coversheet layer 605 with designated haptic touchpad interface area 602 may be made of any type of elastically resilient material. The elastically resilient material may allow, at least, a portion of the touchpad coversheet layer 605 to be deformed upon application of a pressure from a user's finger. Upon withdraw of the pressure from the user's finger, the material of the touchpad coversheet layer 605 is made of allows the touchpad coversheet layer 605 of the touchpad to bend back to its pre-deformed state. In an embodiment, the resilient material may allow the touchpad coversheet layer 605 at haptic touchpad 602 to travel a distance of between 0.01 mm and 2 mm.

The arrangement of the piezoelectric elements 620 for haptic touchpad 602 described herein is also shown in FIG. 6. In the embodiment shown in FIG. 6, piezoelectric elements 620 are placed in an array under the touchpad of the touchpad coversheet layer 605. The placement of the piezoelectric elements 620 in the array under the touchpad surface 602 of the touchpad coversheet layer 605 may include more or less than the number of piezoelectric elements 620 shown. As described herein, the operation of the touchpad may be dependent on the location and number of piezoelectric elements 620. During operation, a controller (not shown) similar to the controller described in connection with FIG. 4 may receive an electric charge from one or a plurality of piezoelectric elements 620 formed below and across the touchpad area 620 of coversheet layer 605 so that the controller may detect one or more piezoelectric elements 620 providing a signal depending on proximity underneath an x- and y-coordinate location of the actuation location on the touchpad by the user. The receipt of one or a plurality of electrical charges from these piezoelectric elements 620 may allow the controller to appropriately send a return electrical signal to any of the piezoelectric elements 620 so that the user may detect a haptic feedback at the location where the user has actuated the haptic touchpad 602 of the coversheet layer 605.

The coversheet 605 with haptic touchpad 602 may further include a C-cover substructure 635. The C-cover substructure 635 may be made of a rigid material that prevents little or no movement. The rigidity of the C-cover substructure 635 allows the other layers within the touchpad stack up 600 to be maintained within the information handling system. In an embodiment, the C-cover substructure 635 may be made to a metal.

The touchpad stack up 600, in an embodiment, may further include any number of adhesive layers 615. In an embodiment, a first adhesive layer 615 may mechanically couple the touchpad coversheet layer 605 to a capacitive touch layer 655. The capacitive touch layer 655 may be made of a rigid material such as a glass, biaxially-oriented polyethylene terephthalate (BoPET) such as Mylar® produced by DUPONT®, or a glass-reinforced epoxy such as FR4 to serve a purpose as a stiffening layer as well. The capacitive touch layer 655 includes a grid of drive and sense lines to determine x- and y-touch locations on haptic touchpad 602 by a user. The capacitive touch layer 655 may be placed within the layers of the touchpad to distribute forces from a user's finger across the surface of the touchpad coversheet layer 605 and to the nearest or a plurality of nearest piezoelectric elements 620 in the array formed below and across the bottom surface of the haptic touchpad 602 of the coversheet layer 605 and capacitive touch layer 655. The stiffening function of the capacitive touch stiffening layer 655 is an optional embodiment as a rigidity of the haptic touchpad 602 may be provided by other layers as well in other embodiments.

The first adhesive layer 615 may be include the placement of the adhesive at locations that may enhance the movement and prevent the hinderance of the actuation of the touchpad coversheet layer 605 at those locations across the touchpad coversheet layer 605 where piezoelectric elements 620 are present. In a specific embodiment, the first adhesive layer 615 may include placing the adhesive along borders of each of the piezoelectric elements 620 as well as placing the adhesive at a central location of each of the piezoelectric elements 620.

The contact foil layer 610 adhered to the touchpad coversheet layer 605 via the first adhesive layer 615 may be made of any elastically resilient material that, when any given location at the touchpad coversheet layer 605 is actuated or the contact foil layer 610 is bent towards a lower portion of the respective location, returns to its original state when the respective location is no longer being actuated.

In an embodiment, the contact foil layer 610 or the capacitive touch layer 655 may include a capacitive touch layer x and y grid that detects and measures anything that is conductive such as a user's finger. The drive lines and sense lines may be a grid of indium tin oxide (ITO) or other conductive materials arranged to detect capacitive changes at x and y locations across the capacitive touch layer that correspond to the touch interface cover layer of the haptic touchpad 602. The capacitive touch layer 655 may be a printed circuit board (PCB) layer for the detection of the user's finger at an x- and y-coordinate location across the surface of the area of the haptic touchpad 602 of the coversheet layer 605. The capacitive touch layer 655 may be an array of drive lines and sense lines of ITO formed on the capacitive touch stiffening layer 655 or on the contact foil 610 in an embodiment. Drive lines and sense lines may be operatively coupled to a capacitive touch controller for determining x- and y-location of touches on the haptic touchpad 602. The capacitive touch layer can be part of the contact foil layer 610, or the its own contact touch layer 655, or part of a stiffener layer in various embodiments.

The contact foil layer 610 may include a number of metal traces 645 formed thereon that electrically and communicatively couples each of the locations and corresponding piezoelectric elements 620 to a controller (not shown) of an information handling system that includes a haptic feedback touchpad 602 control system such as described in connection with FIG. 1. Traces may be opposite the capacitive touch layer on contact foil layer 610 in an embodiment. In an embodiment, the controller may be a dedicated controller communicatively coupled to the contact foil layer 610 so as to detect electrical charges from the piezoelectric elements 620 and provide electrical signals back to the respective piezoelectric elements 620. In an alternative embodiment, the controller may be a processor of the information handling system that, among other computations and execution of other computer readable program code, also executes computer readable program code associated with the haptic feedback keyboard control system as described in FIG. 1.

During operation of the touchpad, the contact foil layer 610 may receive an electrical charge from one or a plurality of piezoelectric elements 620 operatively coupled underneath the metal traces 645 that conduct the electrical charge to the controller associated with the keyboard 600. The metal traces 645 formed on the contact foil layer 610 may further be used to conduct a return electrical signal from the controller to the piezoelectric elements 620 so that the voltage and current of the return electrical signal may cause the piezoelectric elements 620 to return to a haptic feedback event to the touchpad area 602. This haptic feedback event of the actuated piezoelectric elements 620 may cause a haptic feedback presented at the actuation location along the touchpad coversheet layer 605 that the user may feel. As described, the response electrical signal may be a sine wave, a square wave, a pulsed signal or other variations of voltage or polarity changes to generate a warping of a metal plate for the haptic feedback event. This haptic feedback may be relayed to the user within milliseconds of the user actuating a location on the touchpad area 602 of the coversheet layer 605 such that the user physically detects a sensation that the touchpad coversheet layer 605 was pressed. This sensation felt by the user may be present, despite no actual mechanical devices, such as a click switch mechanism, a touchpad trigger, or other types of touchpad mechanical devices being present among the layers of the touchpad stack up 600. The haptic event in particular may feel like a click similar to a mechanical switch click upon a press for selection by a user.

The touchpad stack up 600 may further include a second adhesive layer 616 that mechanically couples the contact foil layer 610 to a support plate 630. In an embodiment, the second adhesive layer 616 may include an adhesive that includes the placement of an adhesive along borders of each piezoelectric element 620. As shown in FIG. 6, the second adhesive layer 616 includes circular voids that conform to a shape of each piezoelectric element 620 placed below the touchpad area 602 of the coversheet layer 605.

The support plate 630 may be made of rigid material such as a metal. The support plate 630 prevents deformation of the touchpad stack up 600 except for, in some embodiments, actuation levels of deformation at the contact foil layer 610, piezoelectric elements 620, the first adhesive layer 615, second adhesive layer 616, and other relevant layers as described. As such, the contact foil layer 610 may be allowed to detect the deformation of the piezoelectric elements 620. Additionally, a user using the touchpad stack up 600 may feel a level of rigidity in the area of the haptic touchpad 602 that the user actuates with the piezoelectric elements 620 providing a haptic event to mimic the deformation to occur when pressure is applied.

In an embodiment, the support plate 630 may include a number of cavities 631 formed therein. The cavities 631 may be sized to have a relatively smaller diameter than the diameter of each of the respective piezoelectric elements 620. By including these cavities 631, the piezoelectric elements 620 may be allowed to be deformed into the cavities 631 so that the deformation of the piezoelectric elements 620 creates the electrical charge described herein to detect actuation. The depth of the cavities 631 may also be selected to allow for at least a central portion of each piezoelectric elements 620 to be deflected into the cavities 631 some distance. This distance of deflection, in an embodiment, may be 0.1 mm or smaller or greater according to embodiments herein.

In an embodiment, the support plate 630 may be secured to other rigid elements of the information handling system. In an embodiment, the support plate 630 may be secured to the C-cover substructure 635 via a number of bolts, screws, or other mechanical or chemical coupling device. In some embodiments, the support plate 630 may be a part of the D-cover of the information handling system.

Each of the piezoelectric elements 620 may include a layer of piezoelectric material and a conductive metal plate layer as described herein in connection with the larger figures describing the keys in FIGS. 3A and 3B. Additionally, each piezoelectric element 620 of the touchpad stack up 600 may be operatively coupled to at least one metal trace 645 formed on the contact foil layer 610 via a contact point such as a solder point. In this embodiment, the conductive metal plate and the piezoelectric materials of the piezoelectric elements 620 may each be operatively coupled to at least one metal trace 645 formed on the contact foil layer 610 via a contact point such as a solder point. Thus, the contact foil layer 610 may, in an embodiment, include two metal traces 645 for each piezoelectric element 620 formed in the keyboard 600.

During operation of the touchpad of the keyboard 600, a user may actuate a location across the touchpad area 602 of the coversheet layer 605 by pressing down on that location of the touchpad coversheet layer 605. As a result of the mechanical stress placed on the location of the touchpad area 602 of the coversheet layer 605, one or more piezoelectric materials of the piezoelectric elements 620 associated with a location or neighboring locations of the actuation location may be compressed. This compression of the piezoelectric element 620 may create an electric charge indicating actuation. The electrical charge is carried to one or more metal traces 645 coupled to the piezoelectric elements 620 via contact points such as solder points. The electric charge received at the metal trace 645 may be conducted to a controller (not shown) by the metal traces 645 as described herein. In this embodiment, the controller may detect that electrical charge produced by the mechanical stress of the piezoelectric material of the piezoelectric element 620 and send an electrical signal back to the piezoelectric material of the piezoelectric element 620. This electrical response signal may have a certain voltage, current, and polarity sufficient to cause a stretching or contraction response to generate a haptic feedback event as described in various embodiments herein. The electrical signal from the controller may follow the same metal traces 645 back to the given piezoelectric element 620. The electrical signal may be received at a conductive layer of the piezoelectric element 620 via, for example, the contact points such as the solder points. As a result of the piezoelectric material may be made rigid and the piezoelectric element 620 may return back to a non-deformed state thereby creating haptic feedback felt by the user's finger. This haptic feedback effect may be a click mimicking a mechanical click switch. In an embodiment, the relay of the electrical charge to the controller, the detection of the controller of the electrical charge, and the return of the electrical signal by the controller to the piezoelectric element 620 may be sufficiently quick enough for the user to feel the haptic feedback in a manner that the user does not detect any temporal delay between the actuation touchpad coversheet layer 605 and the detection of the haptic feedback created at the or a plurality of piezoelectric elements 620. In an embodiment, the relay of the electrical charge to the controller, the detection of the controller of the electrical charge, and the return of the electrical signal by the controller to the piezoelectric element 620 may be on the order of microseconds.

Unlike the individual keys of described in connection with the haptic keyboard of FIGS. 3A and 3B, however, the individual piezoelectric elements 620 may cooperate within the array to create the haptic feedback felt by the user at the touchpad coversheet layer 605. In some specific embodiments, the location of actuation by the user may be detected by the capacitive touch layer (either integrated into the contact foil layer 610, a separate capacitive touch layer 655, or with a stiffening layer) to indicate to the controller which piezoelectric elements 620 should receive a return electrical signal. Along with the receipt of an electrical charge from the piezoelectric elements 620, the controller may cause that all or a portion of the touchpad area forming the coversheet layer 605 receive haptic feedback. This may allow the haptic feedback to be felt by the user across the entire surface of the touchpad area 602 of the coversheet layer 605, across a left side of the touchpad area 602 of the coversheet layer 605, across a right side of the touchpad area 602 of the coversheet layer 605, across a top portion of the touchpad area 602 of the coversheet layer 605, across a bottom portion of the touchpad area 602 of the coversheet layer 605, or any specific area across the surface of the touchpad area 602 of the coversheet layer 605. In some embodiments, only a piezoelectric element 620 directly under the touch location or only piezoelectric elements 620 next to the nearest piezoelectric element 620 under the touch location may provide a haptic feedback event. Along with the capacitive touch layer, the piezoelectric elements 620 may allow a user to have the user's touch be detected at the touchpad while actuation, at any location across the surface of the touchpad coversheet layer 605 provides haptic feedback to the user so that the user can engage in a "click" action at the touchpad such as when selecting an item on a graphical user interface.

In an embodiment, the keyboard 600 may, once the layers described herein are coupled together, may be placed within the C-cover 635 with a D-cover 665 coupled thereto. The assembly of the coversheet 605, C-cover substructure 635, and the D-cover 665 forms a base chassis of the information handling system. In an embodiment, the base chassis may be coupled to a display chassis 650 that may include a display device. The touchpad stack up 600 described herein may allow the user to provide input to the display device of the display chassis using the capacitive touch layer, the piezoelectric elements 620 determining actuation, and the haptic feedback capabilities associated with the piezoelectric elements 620. By way of example, the capacitive touch layer may allow a user to move a cursor across the screen. In these examples, actuation of the touchpad coversheet layer 605 at a location across the touchpad coversheet layer 605 causes an item to be selected that is represented on the display device. This "click" action may provide similar input to the processor of the information handling system similar to that of a mouse click.

Figure 7:
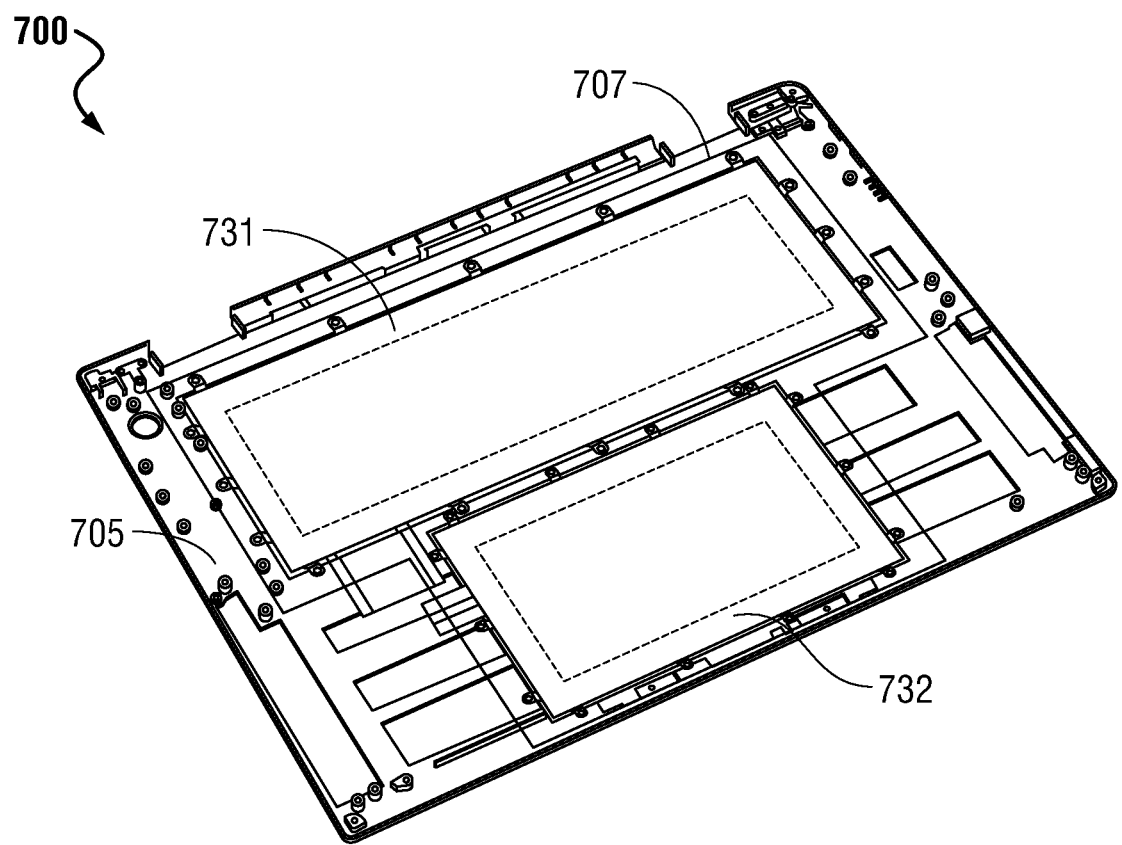
FIG. 7 is back perspective view of a C-cover housing with a gasket or membrane interface location for water resistance of an information handling system according to an embodiment of the present disclosure.

FIG. 7 is back perspective view of a C-cover 705 of an information handling system 700 according to an embodiment of the present disclosure. The C-cover 705 may be used to house a keyboard and touchpad as described herein. As also described, each of the keyboard and touchpad may include a support plate 731 and 732, respectively. In an embodiment, a single support plate may be used to support one or more of the keyboard piezoelectric assemblies described in connection with FIGS. 3A and 3B and the touchpad piezoelectric assembly described in connection with FIG. 6. In an alternative embodiment, the keyboard piezoelectric assemblies and the touchpad piezoelectric assembly may each include their own support plate 731 and 732, respectively. The support plates of the C-cover 705 shown may increase the stiffness of the haptic keyboard and touchpad described herein because the support plates 731 and 732 may be firmly fixed to the C-cover 705. This may enhance the perceived quality of the information handling system while still having a haptic feedback method and system that allows the user to feel as if an actuation of a key or touchpad has occurred. Still further, the haptic feedback systems described herein creates a keyboard or touchpad that feels like a mechanical keyboard vastly reduces physical key travel. Additionally, the construction of the haptic feedback systems described herein results in a much thinner and simpler keyboard and touchpad than that of a mechanical keyboard or touchpad enabling a thinner information handling system in some embodiments. With the reduction in space occupied by the haptic feedback keyboard and touchpad, space within the information handling system base chassis may be increased for use by other, additional, or larger components within the information handling system. In a specific example embodiment, the additional space provided within the information handling system due to the use of a haptic feedback keyboard and touchpad results in the ability to increase the size of a battery used to power the information handling system.

As shown in FIG. 7, the C-cover 705 may include both a piezoelectric keyboard portion secured to the C-cover 705 by a first support plate 731 and a touchpad portion being secured to the C-cover 705 by a second support plate 732. In an embodiment, it is contemplated that the touchpad and keyboard as described herein may be secured to the C-cover 705 by a single support plate that combines 731 and 732.

In a further embodiment, the support plates 731 or 732 or a combination support plate may be sealed from the remainder of the information handling system base chassis via a gasket or membrane layer 707 to provide isolation of the keypad stack up or touchpad stack up from the remainder of the base chassis of the information handling system that assembles to the C-cover 705. The gasket 707 is illustrated as to location and may be affixed to the outside of support plates 731, 732 or a combination plate or may be affixed between the support plates 731, 732, or a combination support plate and the C-cover 705 along the attachment points of the shown screws. The type of gasket or membrane used may be determinative of a level of water resistance or waterproofing established for the information handling system and may be used with one or more types of haptic keyboard and haptic touchpad stackups as described herein. For example, the single sheet coversheet embodiment with the shown gasket 707 may provide a sealed, waterproof haptic keyboard or haptic touchpad and other measures of water resistance or waterproofing may be used with the base chassis and display chassis in some embodiments. In the embodiments described above with FIG. 7, the keyboard and touchpad may both be operated using the piezoelectric elements as described herein.

Figure 8A:
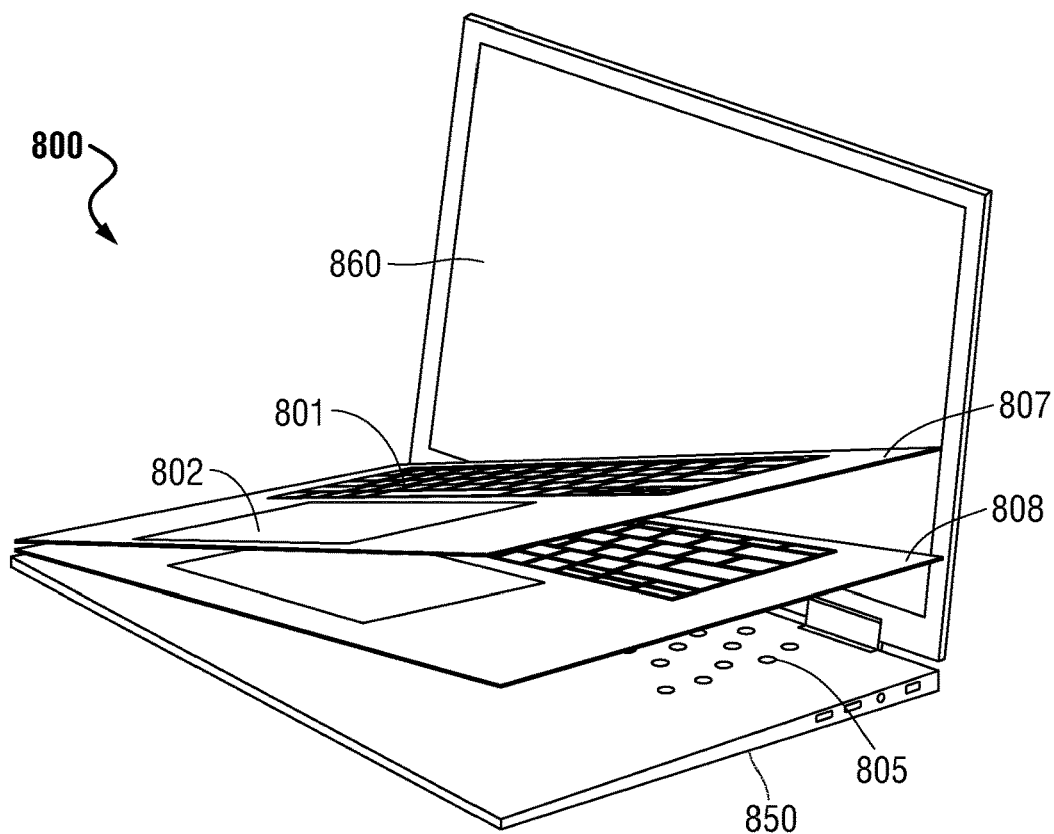
FIG. 8A is a perspective graphical diagram of an information handling system with a haptic keyboard and touchpad single coversheet with one or more top replaceable overlays according to an embodiment of the present disclosure.

FIG. 8A is a perspective view of an information handling system 800 with a haptic keyboard and haptic touchpad including one or more available top replaceable overlays according to an embodiment of the present disclosure. Information handling system 800 is depicted in FIG. 8A including a display in a display chassis 860 which is operatively coupled to a base chassis 850. It is understood that the base chassis 850 may include an assembly of a D-cover and a C-cover as is understood. In the shown example embodiment, the C-cover may include a coversheet 805 that comprises a top layer of a haptic keyboard assembly as well as a top layer of a haptic touchpad assembly. Circles shown on the coversheet 805 may be designations for key locations for at least one haptic keyboard layout set up whereby a plurality of piezoelectric elements may correspond to such locations for receiving actuation by a user and generating an actuation signal for detecting a keystroke via the haptic keyboard in one example embodiment. Actuation by a user may be received via a selection of one or more top replaceable overlays 807 and 808 which may be magnetically or otherwise attachable to coversheet 805. The top replaceable overlays 807 and 808 may include a haptic keyboard 801 and a haptic touchpad area 802. In the shown embodiment, a first top replaceable overlay 807 may have a set of keys for a haptic keyboard representing a first set of alphanumeric characters for a first language haptic keyboard. Further, the second top replaceable overlay 808 may have another set of keys for a haptic keyboard representing a second set of alphanumeric characters for a second language haptic keyboard.

In the shown example, the haptic keyboard of the first top replaceable overlay 807 and the haptic keyboard of the second top replaceable overlay 808 may have a similar key layout and have similar sizes, however that is also not required. In some embodiments, multiple top replaceable overlays 807 and 808 may involve different key layouts or different sized keys for alphanumeric characters which may be for the same or different language haptic keyboards. In yet other embodiments, a portion of the haptic touchpad may be utilized such that piezoelectric elements under the touchpad stackup are designated for additional keys to represent more alphanumeric characters such as when a language haptic keyboard requires more characters than the number of keys in a QWERTY-type keyboard for example. A top replaceable overlay adaptation system may operate according to embodiments described herein to magnetically detect the type of top replaceable overlay from a plurality of available top replaceable overlays such as 807 and 808. The top replaceable overlay adaptation system may then adjust piezoelectric elements in the haptic keyboard or even the haptic touchpad to correspond to key locations of the haptic keyboard on the selected top replaceable overlay attached to the coversheet. As described, the combination of magnets detected or polarity of magnets detected may indicate which top replaceable overlay is selected by reference to a set up database by the top replaceable overlay adaptation system for determining a corresponding type of top replaceable overlay. Once determined, the top replaceable overlay adaptation system may assign corresponding characters to scan codes received for one or more piezoelectric elements that correspond to registering keystrokes on alphanumeric keys of the selected haptic keyboard appearing on the top replaceable overlay adhered to the coversheet. In one embodiment not shown, a default haptic keyboard may be formed in the coversheet 805 upon which additional top replaceable overlays 807 or 808 may be affixed magnetically. Detection of the top replaceable overlay 807 or 808 on top of the default haptic keyboard of the coversheet 805 may override the operation of the haptic keyboard and touchpad control system for the default haptic keyboard and replace the operation with the selected top replaceable overlay such as 807 or 808. In an example embodiment, the default haptic keyboard may be a QWERTY-type keyboard layout.

It is understood that a one to one correspondence of piezoelectric elements to keys is not required in embodiments herein and one or more piezoelectric elements may be used by a haptic feedback keyboard and touchpad control system which may control the haptic keyboard of the embodiment herein. The top replaceable overlay adaptation system may cross reference a setup database indicating which of one or more piezoelectric elements in the haptic keyboard stackup corresponds to the known key location sizes and layouts of a detected haptic keyboard whether as part of a default coversheet keyboard or an attached top replaceable overlay 807 and 808

Figure 8B:
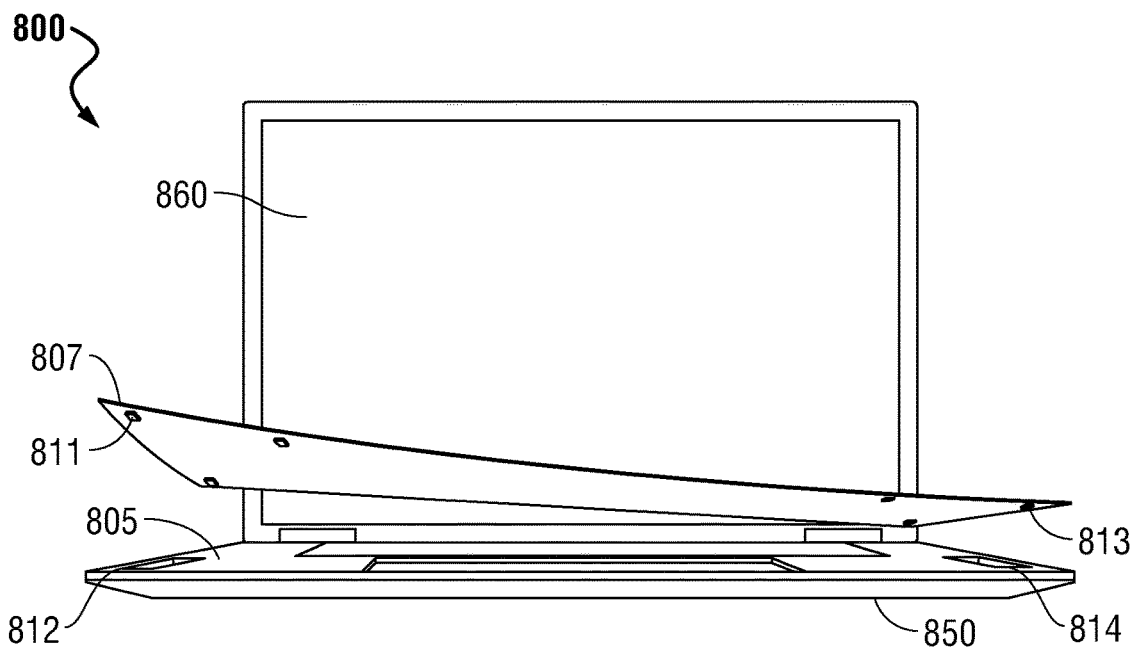
FIG. 8B is a front view graphical diagram of an information handling system with a haptic keyboard and touchpad single coversheet with a top replaceable overlay and attachment system according to an embodiment of the present disclosure.

FIG. 8B is a front view of an information handling system 800 with a haptic keyboard and haptic touchpad including a top replaceable overlay 807 and attachment system according to an embodiment the present disclosure. In an example embodiment, the information handling system 800 includes a display chassis 860 and a base chassis 850. The top replaceable overlay 807 is bent upward to depict the location of magnets for magnetic attachment of the top replaceable overlay 807 to a coversheet 805. The coversheet 805 may have a haptic keyboard area and a haptic touchpad area with haptic keyboard stackup and haptic touchpad stackup as described in various embodiments herein.

In an embodiment, the embodiment of FIG. 8B depicts an attachment system that may be used with the top replaceable overlay 807. The top replaceable overlay 807 may include a plurality of magnets 811 and 813 for magnetically coupling the top replaceable overlay 807 to the coversheet of the C-cover for base chassis 850. The magnets 811 and 813 shown are not limiting with respect to the number of magnets that may be used on top replaceable overlay 807. One or more magnets may be used to magnetically couple the top replaceable overlay 807 to the C-cover.

The magnets may also correspond to magnets, ferromagnetic inserts, or Hall effect sensors at 812 and 814 to align the top replaceable overlay 807 on the coversheet 805 as well as provide magnetic detection of the top replaceable overlay 807 by a top replaceable overlay adaptation system as described with several embodiments herein. The combination of magnets detected at 812 or 814 in embodiments herein may be cross referenced by the top replaceable overlay adaptation system with a database indicating which top replaceable overlay is attached to the coversheet. A greater number of magnets 811 and 813 with corresponding Hall effect sensors such as at 812 and 814 provide for more combinations that may be interpreted to indicate a wider selection of available top replaceable overlays. Further, magnetic polarity may be varied at magnets 811 and 813 and detected by Hall effect sensors 812 and 814 to provide an even greater number of potential combination to indicate an even wider selection of top replaceable overlays in some embodiments. It is also noted that more magnets such as 811 and 813 with corresponding magnetic attachment points of C-cover magnets or ferromagnetic inserts such as at 812 and 814 may provide a more robust magnetic attachment of the top replaceable overlay 807 to the coversheet 805. In some embodiments, edges around the perimeter of the coversheet 805 may be raised on the coversheet to operate as guides for receiving the top replaceable overlay 807 and ensuring alignment. Other structures may be used including cavities, guide pedestals, slots or the like on either the top replaceable overlay 807 or the coversheet 805 to assist with mechanical alignment and mechanical attachment of the top replaceable overlay 807 in some embodiments.

Figure 8C:
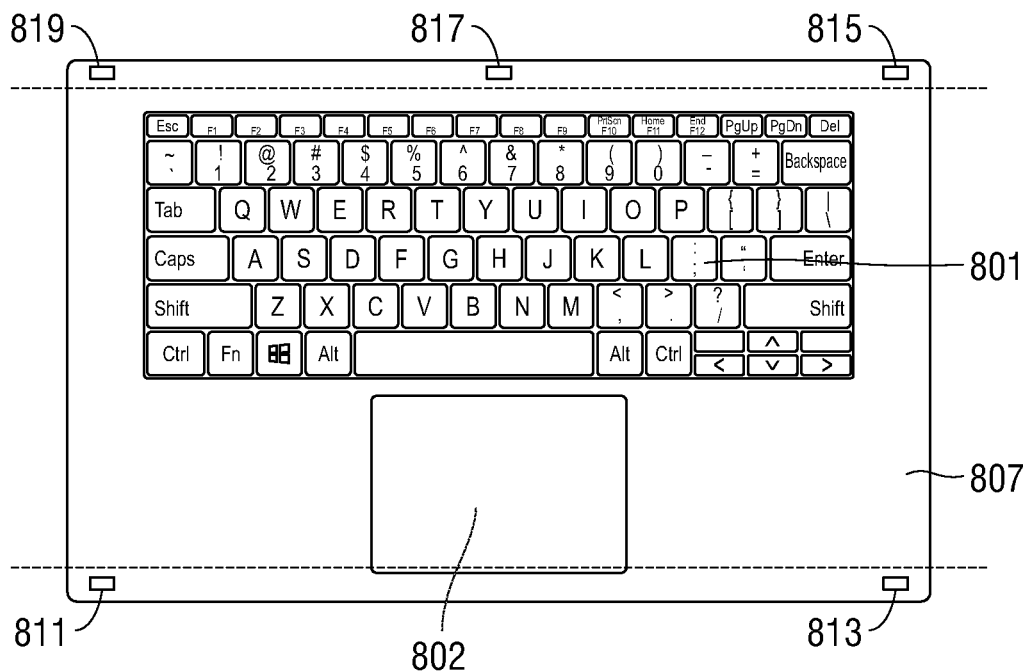
FIG. 8C is a top view graphical diagram of a top replaceable overlay and attachment system for a haptic keyboard and touchpad with a single coversheet for an information handling system according to an embodiment of the present disclosure.

FIG. 8C is a top view of a top replaceable overlay 807 with a portion of an attachment system for a haptic keyboard 801 or haptic touchpad 802 of an information handling system 800 according to an embodiment the present disclosure. In the top view of the top replaceable overlay 807 includes a plurality of potential magnet locations 811, 813, 815, 817, and 819 that may be disposed around the perimeter of the top replaceable overlay 807. In the shown example, corresponding magnets, ferromagnetic inserts, or Hall effect sensor may be disposed in similar locations around a C-cover under a coversheet thereon. As described with multiple embodiments herein, the potential magnets may be inserted at locations 811, 813, 815, 817, and 819 in the top replaceable overlay 807 in the injection mold, silicone overmolded, affixed via adhesive, press fit into cavities in the top replaceable overlay 807 or attached via other methods. Not every top replaceable overlay 807 will have magnets at each location 811, 813, 815, 817, and 819. In the shown embodiment, each top replaceable overlay 807 may have anywhere from one to five magnets and more magnets may be contemplated in other embodiments. With five magnets and five corresponding Hall effect magnetic proximity sensors, up to 30 combination may designate up to 30 different top replaceable overlays 807. With varying polarity of the magnets, more combinations may be added. Additionally, in some embodiments, the coversheet may include a default haptic keyboard over which the top replaceable overlay 807 may be attached to override the default haptic keyboard via the top replaceable overlay adaptation system detecting the combination of magnets in the selected top replaceable overlay 807. In this way, users may have a choice of selection of many language haptic keyboard top replaceable overlays, many key sizes or shapes for the haptic keyboard on the top replaceable overlays, many colors or materials of the haptic keyboard overlays, or keyboard layouts for the top replaceable overlays.

The top replaceable overlay 807 shown in FIGS. 8A, 8B and 8C may snugly affix to coversheet of the haptic keyboard and the haptic touchpad stack up and due to the elimination of mechanical key travel, the receiving of actuation pressure by a user and the haptic feedback event response are crisp and not lost in a hollow feel of previous overlays that would be used with mechanical keyboard systems. With the magnetic attachment system and the alignment systems described in embodiments herein, swapping out or replacing the top replaceable overlay 807 is simplified and the top replaceable overlay adaptation system may automatically switch between languages or preferred key layouts such that the keys designated on the selected top replaceable overlay 807 will generate the alphanumeric character designated via the same piezoelectric element stackup that may be used with other top replaceable overlays. Such a system provides flexibility and options while also providing the very thin, streamline haptic keyboard and touchpad according to embodiments herein. Further, a single sheet material may be used for the coversheet 805 and top replaceable overlay 807 of the embodiments of FIGS. 8A, 8B, and 8C providing protection from spills or dirt breaching the haptic keyboard or haptic touchpad in embodiments herein.

Figure 9:
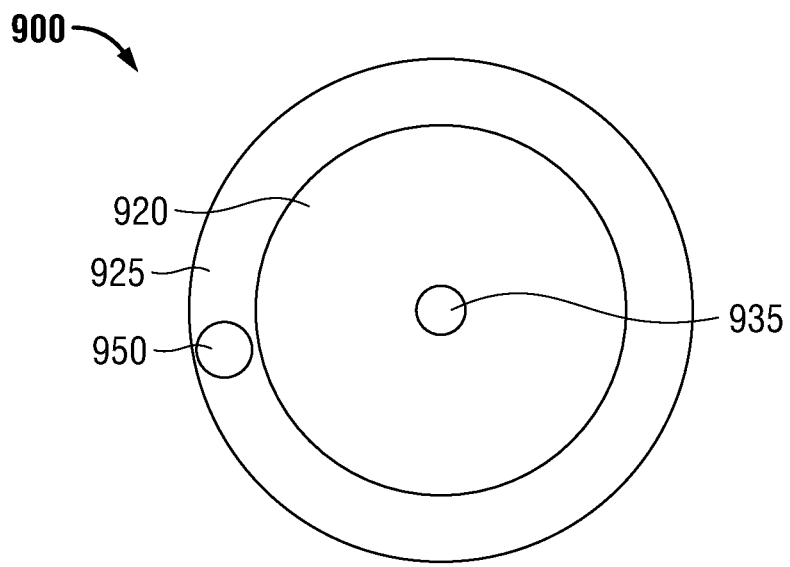
FIG. 9 is a top view of a piezoelectric element according to an embodiment of the present disclosure.

FIG. 9 is a top view of a piezoelectric element 900 according to an embodiment of the present disclosure. As described, the piezoelectric element 900 may be incorporated into a key of the keyboard or a touchpad. In the embodiments described herein, any number of piezoelectric elements 900 may be incorporated into the information handling system so as to provide haptic feedback to a user.

In an embodiment, the piezoelectric element 900 includes a layer of piezoelectric material 920. This layer of piezoelectric material 920 may be made of any piezoelectric material including crystals, ceramics, biological matter, protein layers, among other types of materials. For ease of explanation, the layer of piezoelectric material 920 may be made of a ceramic or a crystal material although the present specification contemplates the use of other types of materials in different embodiments.

As described herein, the layer of piezoelectric material 920 may be operatively, and more specifically, electrically coupled to both a contact foil layer and the metal conductive layer 925. In an embodiment, the layer of piezoelectric material 920 may be electrically coupled to the contact foil layer via a first electrical contact point 935. The first electrical contact point 935 may, in an embodiment, be a soldering point that couples the layer of piezoelectric material 920 to a metal trace formed on the contact foil layer. The metal conductive layer 925 may be a brass metal plate or ring. Metal conductive layer 925 may be electrically coupled to a trace on the contact foil layer via a second electrical contact point 950. First and second electrical contact points 935 and 950 may be a solder point in an example embodiment. Under application of a mechanical stress on the layer of piezoelectric material 920 resulting from a user actuating a coversheet layer above the piezoelectric element 900, the layer of piezoelectric material 920 may create an electrical charge on metal conductor layer as it is deformed or compressed, for example, into a cavity disposed below the piezoelectric element 900. This electrical charge may be passed to the metal traces via the first electrical contact point 935 and second electrical contact point 950 and may be conducted to a controller as described herein.

Upon detection of the electrical charge from the layer of piezoelectric material 920, the controller may send an electrical signal to the piezoelectric material layer 920 and the conductive layer 925 via metal traces formed on the contact foil layer. The electrical signal from the controller may be a variety of electrical response signals as described herein to cause the layer of piezoelectric material 920 to return a haptic feedback event. The haptic feedback event may be felt by a user who caused the deformation of the layer of piezoelectric material 920 of the piezoelectric element 900 during the actuation of a key on a keyboard or a location on the touchpad.

Although FIG. 9 shows a specific shape and size of the piezoelectric element 900 and conductive layer 925, the present specification contemplates that the piezoelectric element 900 may take on other forms and shapes as would serve a specific purpose in the operation of a keyboard or touchpad described herein.

Figure 10:
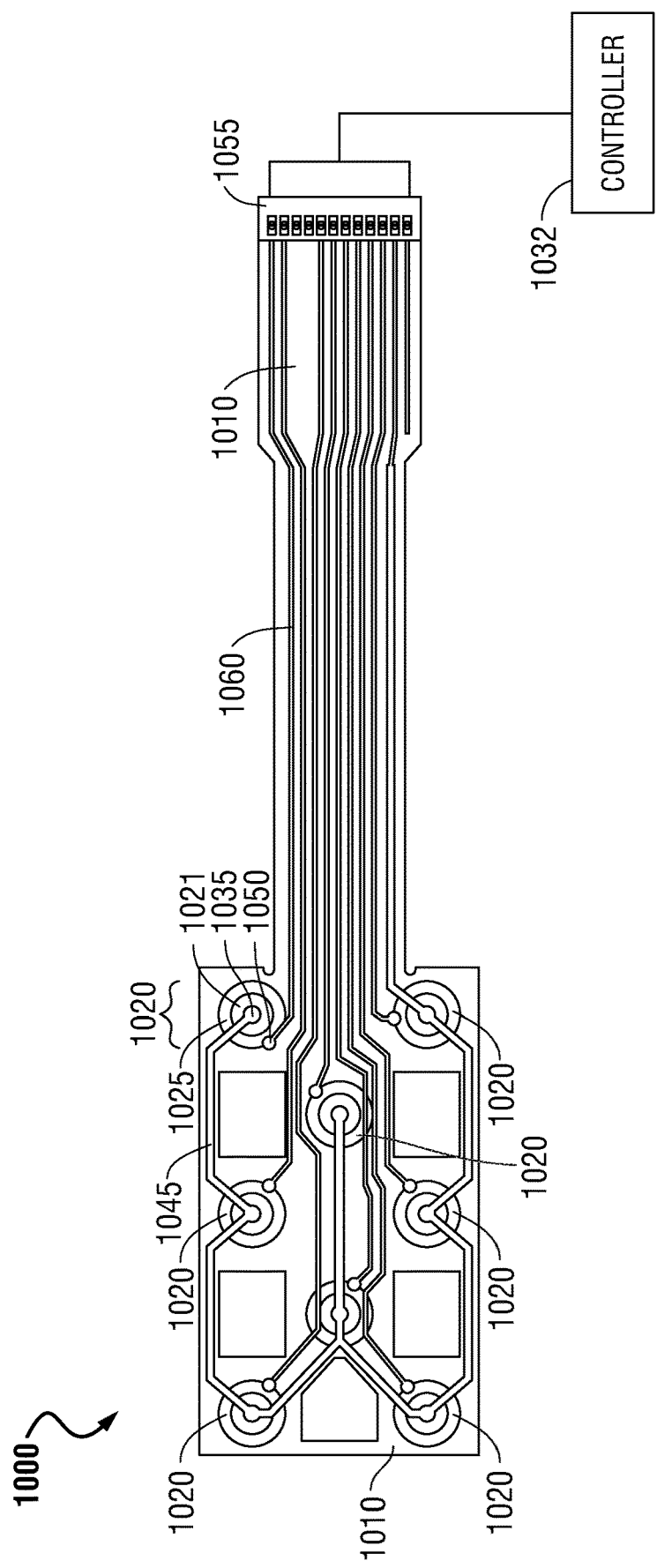
FIG. 10 is a top view of a contact foil of a touchpad for an information handling system embodiment of the present disclosure.

FIG. 10 is a top view of a contact foil layer 1000 of a keyboard of an information handling system embodiment of the present disclosure. As described herein, the contact foil layer 1000 may include a contact foil 1010 may be made of any elastically resilient material that, when any given key or location on the touchpad is actuated or the contact foil 1010 is bent, the contact foil 1010 returns to its original state when the contact foil 1010 is no longer subjected to a force used to bend the contact foil 1010. Contact foil layer 1000 may be a flexible printed circuit layer in an example embodiment.

The contact foil 1010 of the contact foil layer 1000 may be used to communicatively and electrically couple one or more piezoelectric elements 1020 to a processor or other controller. As described herein, the piezoelectric elements 1020 may be electrically coupled to a number of metal traces via a first metal trace 1045 and a second metal trace 1060. In a specific embodiment, a piezoelectric layer 1021 of the piezoelectric elements 1020 may be electrically coupled to the first metal trace 1045 via a first electrical contact point 1035. Similarly, a conductive metal plate layer 1025 of the piezoelectric elements 1020 may be electrically coupled to the second metal trace 1060 via a second electrical contact point 1050. The first electrical contact point 1035 and second electrical contact point 1050 may be, in an embodiment, a solder point.

The contact foil layer 1000 may further include a serial communication coupling device 1055. The serial communication coupling device 1055 may communicatively couple the first metal trace 1045 and second metal trace 1060, among other metal traces associated with each piezoelectric elements 1020, to a processor or controller 1032 for processing of electrical charges received from the piezoelectric layer 1021 according to the embodiments described herein.

Figure 11:
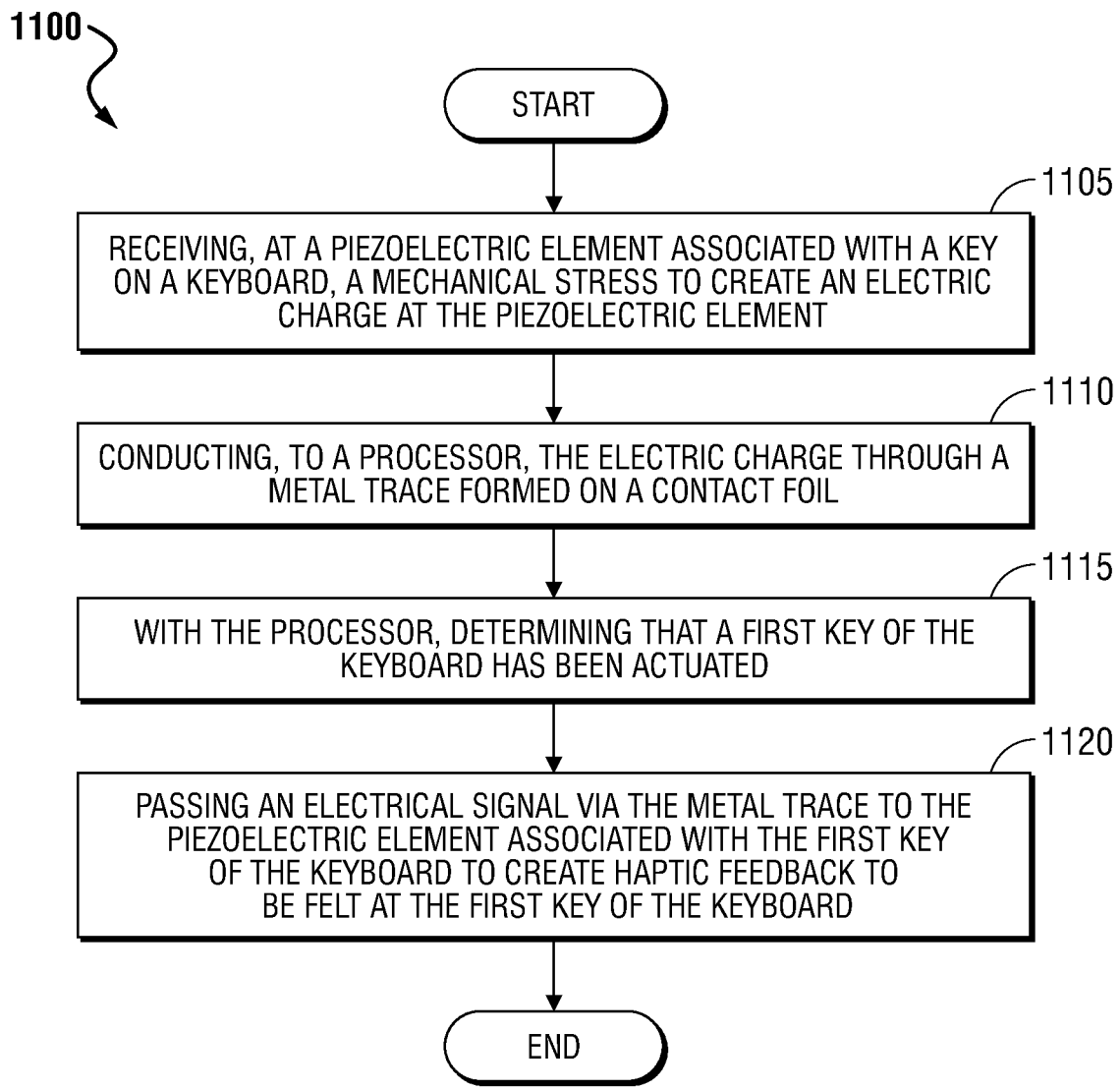
FIG. 11 is a flow diagram illustrating a method of operating a keyboard of an information handling system according to an embodiment of the present disclosure.

FIG. 11 is a flow diagram illustrating a method 1100 of operating a haptic keyboard of an information handling system according to an embodiment of the present disclosure. The method 1100 may begin by receiving, at a piezoelectric element associated with a key on a keyboard, a mechanical stress to create an electric charge at the piezoelectric element at block 1105. As described herein, the actuation of the key of the keyboard causes a mechanical stress to be placed on a piezoelectric material layer of the piezoelectric elements. The key on the keyboard may be a key location of a haptic keyboard for a coversheet layer or for a top replaceable overlay layer providing key interface locations for a user according to the various embodiments described herein. The deformation of the piezoelectric material layer results from the application of this mechanical stress which results in the creation of the electrical charge. Mechanical stress causes deformation of the piezoelectric elements into a cavity disposed below at a support plate supporting the structures of the piezoelectric elements thereby compressing the piezoelectric material within the metal disk layer to which it is adhered.

The method 1100 may continue, at block 1110, with conducting, to a processor, the electrical charge through a metal trace formed on a contact foil. The contact foil may be operatively coupled to the piezoelectric device such that the charge formed at the piezoelectric device may be allowed to conduct through at least one metal trace formed thereon and to the processor. In the embodiments described herein, two conductors are connected to the piezoelectric material layer and the metal disk layer to detect and actuation signal.

The method 1100 may continue at block 1115 with determining with the processor, that a first key of the keyboard has been actuated. This determination may be made based on the electrical charge signal that the processor receives from one or more specific metal traces formed on the contact foil. Alternative embodiments may be used to allow the processor to determine where and from which key on the keyboard the electrical charge is received from.

The method 1100, may continue at block 1120 with passing an electrical response signal to the piezoelectric element associated with the first key of the keyboard to create haptic feedback to be felt at the first key of the keyboard. As described herein, the haptic feedback results from the electrical signal, at a determined voltage, current, or polarity being applied to the piezoelectric material layer. The response signal may be a sine wave, a square wave, pulsed signal, or otherwise varied and modulated to create a haptic event of a key press for the user. Application of the electrical signal to the piezoelectric material layer causes the piezoelectric material layer to stretch, compress, or return to its non-deformed state in some embodiments. The new stretched or compressed state of the piezoelectric material layer may create a haptic bump to be felt by the user at the key actuated on the keyboard when the piezoelectric element metal plate layer is warped in response to the haptic feedback signal. In one example embodiment, changing polarity and voltage levels in any portion of a haptic feedback signal may cause an expansion of the piezoelectric material causing it to stretch and a warping the metal plate layer into the underlying cavity. This may be followed by a haptic feedback signal of polarity and voltage level to compress of the piezoelectric material and warp the metal plate away from the cavity. In this way, a haptic event may mimic a mechanical keystroke at the actuated key on as feedback to a user's finger. Any combination of the above changes to the piezoelectric material may be generated by the haptic feedback signal for causing the metal plate to warp and generate the intended haptic feedback event. This method 1100, from user actuation of the key to haptic feedback creation, may occur within microseconds of receiving an actuation signal. The haptic feedback event may be felt at a haptic key location on a coversheet or on a top replaceable overlay that is snugly attached to the haptic keyboard stackup in various embodiments as described herein.

Figure 12:
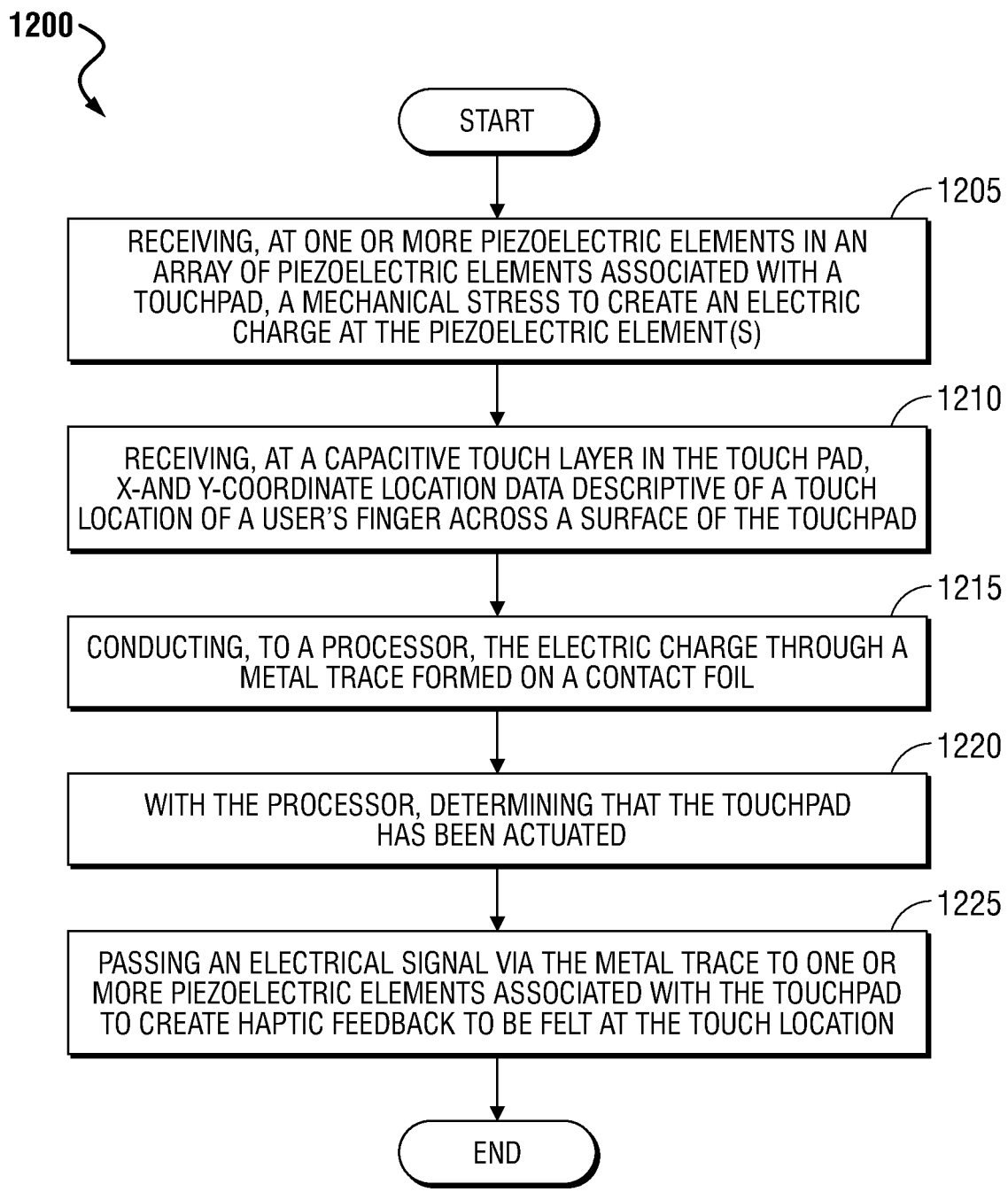
FIG. 12 is a flow diagram illustrating a method of operating a touchpad of an information handling system according to an embodiment of the present disclosure.

FIG. 12 is a flow diagram illustrating a method 1200 of operating a touchpad of an information handling system according to an embodiment of the present disclosure. The method 1200 may include, at block 1205, at least one a piezoelectric element of an array of piezoelectric elements associated with a touchpad, a mechanical stress to create an electric charge at the one or more piezoelectric elements. As described herein, the actuation of a location on the touchpad causes a mechanical stress to be placed on one or more piezoelectric material layers of the piezoelectric elements. The actuation interface with actuation interface locations of the haptic touchpad may be disposed on a coversheet layer or on a top replaceable overlay according to the various embodiments described herein. The deformation of the piezoelectric material layers may result from the application of this mechanical stress which results in the creation of the electrical charge. Deformation of the one or more piezoelectric elements into an underlying cavity formed in the support plate causes compression of the piezoelectric material. This compression may generate an electrical charge in the piezoelectric material layer.

The method 1200 may continue with receiving, at a capacitive touch layer in the touchpad, x- and y-coordinate location data descriptive of a touch location of a user's finger across a surface of the touchpad at block 1210. The x- and y-coordinate location data may be used by a processor in the described method 1200 to determine which piezoelectric elements to send an electric haptic response signal to. In these embodiments, the processor may be provided with additional data from a capacitive touch layer that provides the processor with a x- and y-coordinate location on the touchpad that the user has touched in addition to the actuation signal form one piezoelectric element. Alternatively, or additionally, the number of piezoelectric elements actuated by the actuation of the touch of the user may be used to allow the processor to determine where, on the touchpad, the user has touched.

The method 1200 may, at block 1215, continue with conducting, to a processor, the electric charge through metal traces formed on a contact foil. As described herein, the metal traces may be formed on a contact foil made of any elastically resilient material that, when any given location on the touchpad is actuated or the contact foil is bent, the contact foil returns to its original state when the contact foil is no longer subjected to a force used to bend the contact foil. For example, a flexible PCB may be used. Several examples of flexible PCB may include photolithography metal on to a flexible PCB such as a PET material or lamination of metal traces within PET material. Other flexible PCB or circuit materials are also contemplated.

The method 1200 may further include, with the processor, determining that the touchpad has been actuated at block 1220. In this embodiment, the processor may determine a location along the touchpad where the piezoelectric device from which the electrical charge was received is located: across a left side of the touchpad coversheet, across a right side of the touchpad coversheet, across a top portion of the touchpad coversheet, across a bottom portion of the touchpad coversheet, or any specific area across the surface of the touchpad coversheet The method 1200 may further include, at block 1225, passing an electrical signal through the piezoelectric device associated with the location on the touchpad causing haptic feedback to be felt at the location on the touchpad interface surface of the coversheet or top replaceable overlay in various embodiments. As described herein, the haptic feedback results from the electrical signal, at a determined voltage, current, or polarity being applied to the piezoelectric material layer. Application of the electrical signal to the piezoelectric material layer causes the piezoelectric material layer to return to its non-deformed state or compressed about the non-deformed state. The new compressed state of the piezoelectric material layer may warp the metal plate of the piezoelectric element and create a haptic bump or click to be felt by the user at the location on the touchpad actuated on the touchpad. A fast pulse of positive polarized voltage may generate a haptic event that mimics a mechanical click of a touchpad mechanical switch in one example embodiment. This method 1200, from user actuation of the touchpad to haptic feedback creation, may occur within microseconds via the haptic touchpad controller.

Figure 13:
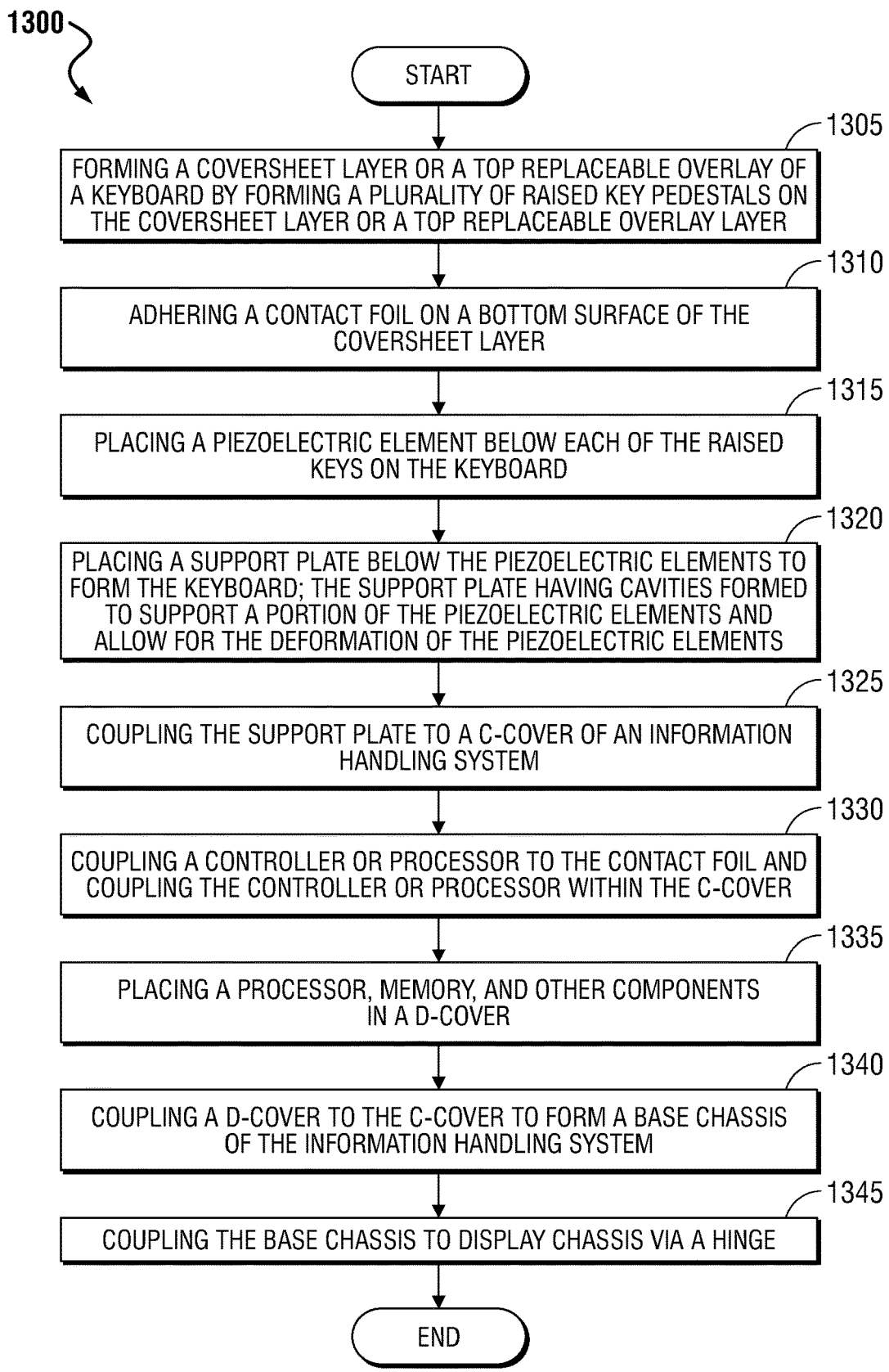
FIG. 13 is a flow diagram illustrating a method of manufacturing a keyboard of an information handling system according to an embodiment of the present disclosure.

FIG. 13 is a flow diagram illustrating a method 1300 of manufacturing a keyboard of an information handling system according to an embodiment of the present disclosure. The method 1300 may include forming a coversheet layer via an injection molding process or with utilization of a plurality of other materials to form a single coversheet material layer. With the coversheet layer, the method may proceed by forming a plurality of keys on a keyboard on the coversheet layer or a top replaceable overlay layer magnetically attachable to the coversheet layer at block 1305. In an embodiment, the shape of the coversheet layer or the top replaceable overlay layer may be such so as to conform to the user's fingers. In an embodiment, in order to shape the coversheet layer or the top replaceable overlay layer, the material used to form the coversheet layer may be subjected to an injection molding process forming ergonomically shaped key location designations. As such, a top portion of the coversheet layer or the top replaceable overlay layer may be formed to be ergonomically beneficial to a user's actuation such as by providing key pedestals, key frame, or other tactile or visual designation of a key and by conforming to the user's fingers, for example. The injection molding process may be completed prior to the installation of the coversheet layer into the remaining layers within the keyboard as described herein. The coversheet may include one or more magnets, ferromagnetic inserts, or Hall effect sensors according to various embodiments described herein. The top replaceable overlay layer may be magnetically attachable or otherwise adhered mechanically or via reusable adhesive over the coversheet layer in some embodiments. In embodiments with the top replaceable overlay layer attachable to the coversheet, some embodiments may have the top replaceable overlay layer attached over a default keyboard, such as a QWERTY-type keyboard in the coversheet. In other embodiments, the coversheet may be flat or have guide structures as described herein to align the top replaceable overlay layer to attach to the coversheet layer. Any number of processes may be included with the injection molding process. In an embodiment, the injection molding process used to form the coversheet layer may include forming a number of holes within a sheet of, for example, ABS. These holes may correlate with each actuatable key to be formed on the keyboard. The formation of the coversheet layer may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet layer on which the raised portions are formed may be painted and any number or type of graphics may be laser etched or painted on each raised portion or other indicators indicating a specific key of the keyboard.

The method 1300 may continue with adhering a contact foil on a bottom surface of the coversheet layer at block 1310. Adhering, the contact foil to the coversheet layer may include depositing an adhesive to the bottom surface of the coversheet layer and placing the contact foil to the bottom surface of the coversheet layer. The adhesive may be any type of adhesive.

The method 1300 may, at block 1315, include placing a piezoelectric element below each of the keys on the keyboard. In this embodiment, the number of keys formed in the keyboard may vary based on the number and arrangement of keys to be used as input to the information handling system. For example, the number of piezoelectric elements may be equal to a number of numerical keys to be formed on a ten-key type input device. Additionally, the number of piezoelectric elements may be equal to a number of alphanumeric keys to be formed on a QWERTY-type keyboard. Alternative and customized keyboards are contemplated under the concepts described herein and the present description contemplates these alternative keyboard layouts.

The method 1300 may also include, at block 1320, placing a support below the piezoelectric elements; the support having a cavities formed to support a portion of the piezoelectric elements and allows for the deformation of the piezoelectric elements into the underlying cavities. As described herein, the support may both hold the layers of the keyboard together including the outer edges of the piezoelectric elements as well as maintain the keyboard to a more rigid portion of the information handling system. The method 1300 also includes, at block 1325, coupling the support plate to the C-cover via a number of screws, bolts or other type of coupling device described herein.

The method 1300 may also include coupling a controller or processor to the contact foil and coupling the controller or processor within the C-cover at block 1330. The method may continue with placing other processors, a memory, and power systems (e.g. batteries or power transformers and the like) as well as other information handling system components in the C-cover or D-cover at block 1335. The processor may be any type of processing device that may access data from the memory and receive electric charges from the various piezoelectric devices as described herein. Other components in accordance with the information handling system of FIG. 1 may also be installed in the C-cover or D-cover assembly according to techniques understood in the art for creating motherboards, graphics boards, wireless systems, power systems, bus systems, data ports, cooling systems and the like.

The method 1300 also includes, at block 1340, the coupling a D-cover to the C-cover to form a base chassis of the information handling system. In an embodiment, the C-cover may also include a touchpad pad described herein or a standard mechanical touchpad. With a haptic keyboard and haptic touchpad, a simple uniform coversheet may be used. The method 1300 may further include coupling the base chassis to a display chassis via a hinge at block 1345. The base chassis and display chassis may form a notebook-type information handling system.

Figure 14:
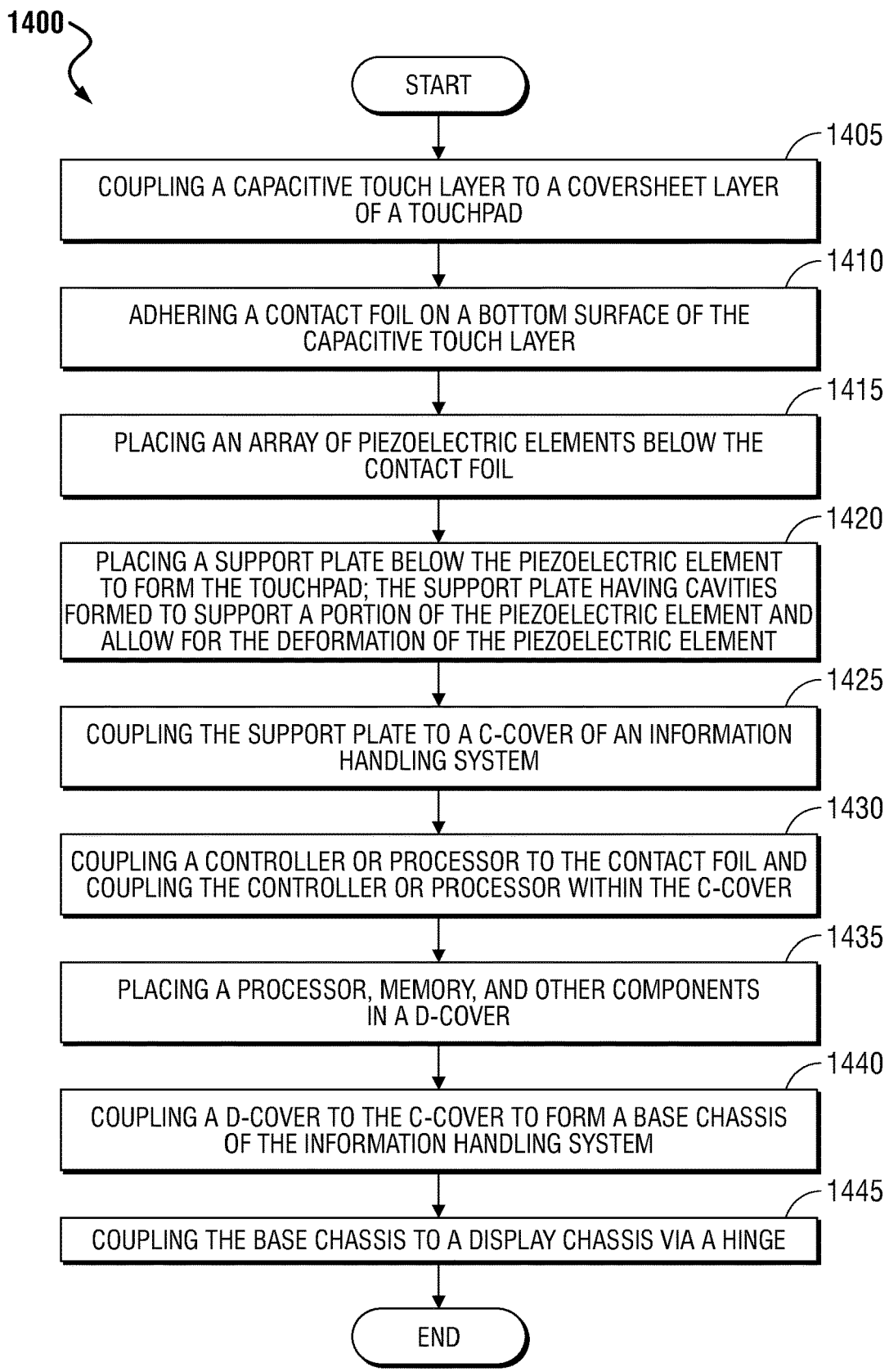
FIG. 14 is a flow diagram illustrating a method of manufacturing a touchpad of an information handling system according to an embodiment of the present disclosure.

FIG. 14 is a flow diagram illustrating a method of manufacturing a touchpad of an information handling system according to an embodiment of the present disclosure. The method 1400 may include coupling a capacitive touch layer to a coversheet layer of a touchpad at block 1405. The capacitive touch layer may be coupled to the coversheet layer using any type of adhesive. In some embodiments, the capacitive touch layer may be formed on the contact foil or a stiffener layer.

The method 1400 may continue with adhering a contact foil on a bottom surface of the capacitive touch layer at block 1410. Adhering, the contact foil to the capacitive touch layer may include depositing an adhesive to the bottom surface of the capacitive touch layer and placing the contact foil to the bottom surface of the capacitive touch layer. The adhesive may be any type of adhesive.

The method 1400 may, at block 1415, include placing a plurality of piezoelectric elements below the contact foil in an array to operate as a touchpad as described herein. In this embodiment, the number of piezoelectric elements may vary based on an arrangement of the touchpad to be used as input to the information handling system. For example, the number of piezoelectric elements may be spaced under the coversheet area designated as the touchpad to provide one or more piezoelectric elements within all locations of the touch pad coversheet area. In an example embodiment, the array of piezoelectric elements may be spaced such that at least one piezoelectric element is between 1 cm to 10 cm of any location on the designated touchpad coversheet area.

The method 1400 may also include, at block 1415, placing a support plate below the piezoelectric elements to form the touchpad. The support plate has cavities formed therein to support a portion of the piezoelectric element while allowing for the deformation of the piezoelectric elements. As described herein, the support may both hold the layers of the touchpad together and outer edges of the piezoelectric elements as well as maintain the touchpad to a more rigid portion of the information handling system. The method 1400 also includes, at block 1425, coupling the support plate to the C-cover via a number of screws, bolts or other type of coupling device described herein.

The method 1400 may also include coupling a controller or processor to the contact foil and coupling the controller or processor within the C-cover at block 1430. The method may continue with placing other processors, a memory, and power systems (e.g. batteries or power transformers and the like) and other information handling system components in the C-cover or D-cover at block 1435. The processor may be any type of processing device that may access data from the memory and receive electric charges from the various piezoelectric devices as described herein. Other components in accordance with the information handling system of FIG. 1 may also be installed in the C-cover or D-cover assembly according to techniques understood in the art for creating motherboards, graphics boards, wireless systems, power systems, bus systems, data ports, cooling systems and the like.

The method 1400 also includes, at block 1440, the coupling a D-cover to the C-cover to form a base chassis of the information handling system. In an embodiment, the C-cover may also include a haptic keyboard as described herein. In an alternative embodiment, a mechanical or other type of keyboard may be used. The method 1400 may further include coupling the base chassis to a display chassis via a hinge at block 1445. The base chassis and display chassis may form a notebook-type information handling system in an example embodiment.

Figure 15:
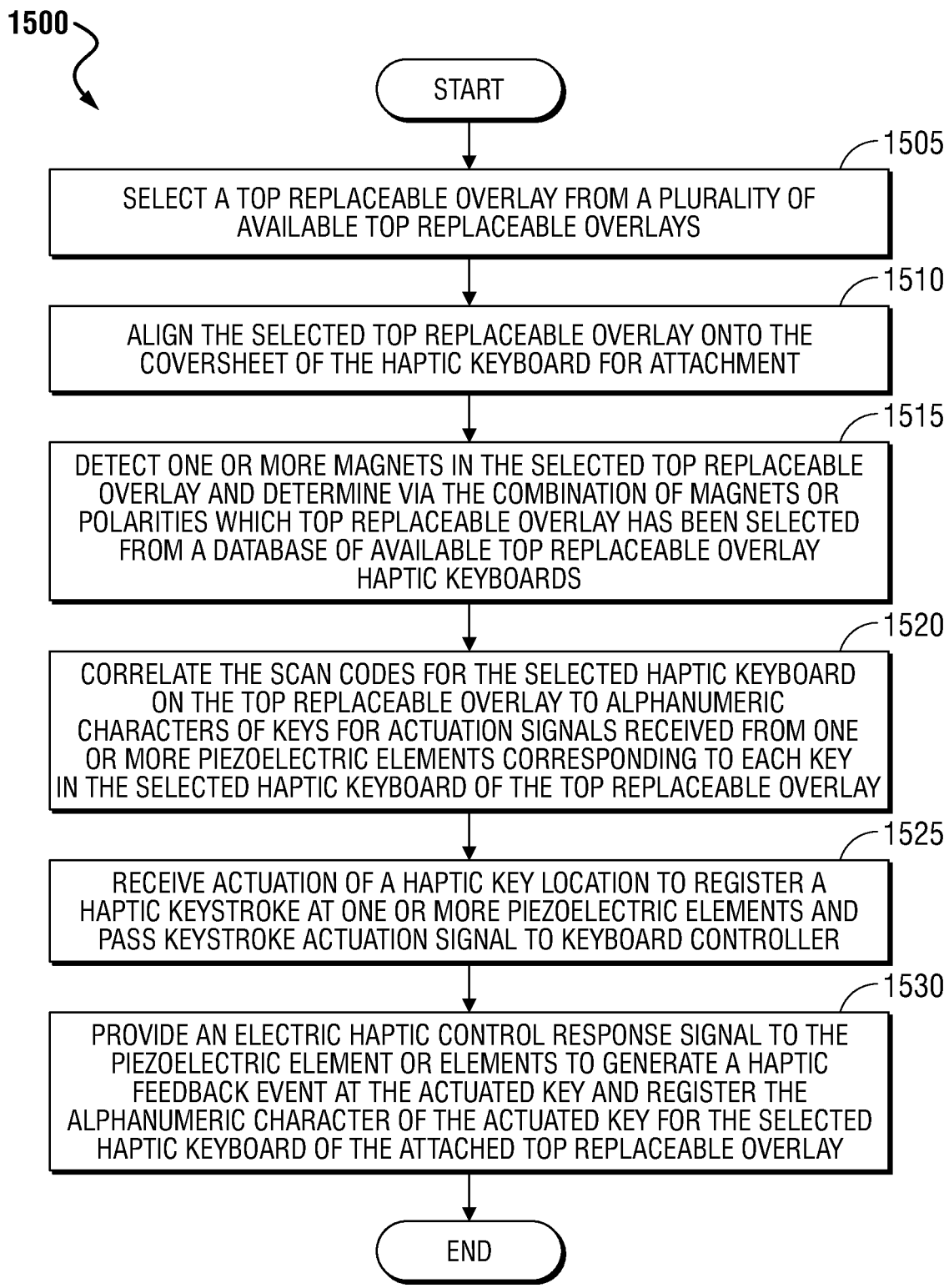
FIG. 15 is a method of attaching and implementing a top replaceable overlay and attachment system for a haptic keyboard of an information handling system according to an embodiment of the present disclosure.

FIG. 15 is a flow diagram illustrating a method 1500 of attaching a top replaceable overlay with an attachment system to coversheet of a haptic keyboard for an information handling system according to an embodiment of the present disclosure. The method 1500 may begin at 1505 by selecting a top replaceable overlay representing a variation on a haptic keyboard layout or a variation of key markings or designations from a plurality of available top replaceable overlays. The top replaceable overlays may include a QWERTY keyboard layout, different key layouts including larger or smaller keys, keyboard ergonomic designs including key pedestals, key frames, or key depressions of a variety of types, shapes, or sizes, or different keyboards marked to correspond to keyboards for a variety of languages involving different alphanumeric character systems among other available variations. Similarly, a variation of touchpad types may be part of the available top replaceable overlays. For example, different sized touchpads or differing ergonomic options may be available. Further, differing layouts with respect to click locations including a left selection location, right selection location, center selection location or others may be available in various embodiments.

As described herein, the actuation of the key of the keyboard causes a mechanical stress to be placed on a piezoelectric material layer of the piezoelectric elements under each key. In the selection of a top replaceable overlay, a key may not directly correspond to each piezoelectric element underneath a key. Thus, the deformation of the piezoelectric material layer resulting from the application of an actuation press of a key may cause mechanical stress to a single piezoelectric element under a key location of a plurality of piezoelectric elements under a key location. This may result in the creation of the electrical charge at one or more piezoelectric elements depending upon the key layout of the top replaceable overlay. The top replaceable overlay adaptation system may accommodate for the key layout of the selected top replaceable overlay as indicated by the attachment system.

The method 1500 may continue, at block 1510, with aligning the selected top replaceable overlay onto the coversheet of the haptic keyboard. As described in embodiments herein, the attachment system of the top replaceable overlay may be a magnetic system in which one or more magnets is used to magnetically hold a top replaceable overlay to the coversheet of a haptic keyboard and to the C-cover structure. One or more magnets may be placed in either the top replaceable overlay or in the C-cover structure under a coversheet of the haptic keyboard or of a single sheet haptic keyboard and haptic touchpad including palmrests in some embodiments. In one example embodiment, one or more magnets in the top replaceable overlay that aligns with a ferromagnetic material or another magnet or magnets of opposite polarity under the coversheet of the haptic keyboard, the haptic touchpad, or palmrests covering the C-cover may hold the top replaceable overlay to the coversheet. Similarly, a magnet or plurality of magnets in the C-cover structure under the coversheet of the haptic keyboard, haptic touchpad, or palmrests may align with a ferromagnetic material or magnet of opposite polarity in the top replaceable overlay in other embodiments to hold the top replaceable overlay to the coversheet as an attachment system. Thus, a magnet and corresponding ferromagnetic material or magnet of opposite polarity may be disposed in either the C-cover structure or the top replaceable overlay and multiple magnets may be deployed in either or both in embodiments herein. In additional embodiments, a physical guide such as raised alignment lines or sides as well as use of material that may provide some level of frictional adherence may be used to assist in the attachment of the selected top replaceable overlay. In further embodiments, a mechanical structure may further assist in the attachment of the selected top replaceable overlay such as slot or side guides that allow the top replaceable overlay to slide into a side slot edge along left, right, back or front sides of the C-cover or fit snugly between back, front, left or right side walls around the location for placement of the top replaceable overlay. These mechanical assist aspects may help to hold the selected top replaceable overlay to the haptic keyboard, touchpad, or palmrests on the C-cover.

The method 1500 may continue at block 1515 with determining via one or more Hall sensors that a magnet is detected within range to indicate that a selected top replaceable overlay has been attached to the coversheet of a C-cover and haptic keyboard or haptic touchpad. In various embodiments described herein, a plurality of magnets may be disposed in either the top replaceable overlay or the C-cover and the magnets may be of varying polarity. The combination of Hall sensors detecting magnets may be sent to a top replaceable overlay adaptation system with a processor or controller executing code instructions to decipher the combination of Hall sensors reporting magnets to indicate to a keyboard controller which top replaceable overlay. The top replaceable overlay adaptation system may access a database indicating which combination of detected magnets or magnets with detected polarities corresponds to a selected haptic keyboard appearing on the selected top replaceable overlay.

At 1520, the top replaceable overlay adaptation system will utilize the scan codes provided for the selected haptic keyboard type from the database of available top replaceable overlays to identify a reinterpretation actuation signal scan codes received from each of one or more piezoelectric elements corresponding to key locations of the selected haptic keyboard of the selected top replaceable overlay. Each key may be associated with one piezoelectric element or changed layout may associate multiple piezoelectric elements with one key location of the haptic keyboard in various embodiments. In one such an embodiment, the haptic keyboard controller may adjust which piezoelectric elements correspond to keys aligned or nearby over the piezoelectric elements for the selected top replaceable overlay keyboard keys when keys sizes or keyboard layout is changed. In another such embodiment, the haptic keyboard controller may adjust which piezoelectric elements correspond to alphanumeric characters in the scan codes for keys aligned or nearby over the piezoelectric elements for the selected top replaceable overlay keyboard keys when varied language keys for multiple language keyboards are changed via the top replaceable overlay.

In other embodiments, the polarity of the one or more magnets may be varied in the top replaceable overlay and the Hall effect sensors may detect the polarity of the one or more magnets. This may provide for detection of even more top replaceable overlay available options for use with the haptic keyboard or haptic touchpad of the embodiments described herein. The number of magnets used and the use of polarity differences among the plurality of magnets used in the top replaceable overlay or in the C-cover may provide for more combinations to allow the top replaceable overlay adaptation system to interpret more top replaceable overlay options. In an example embodiment, between one and five magnets may be used with the top replaceable overlay structure and one to five corresponding Hall effect sensors may be disposed in the C-cover of the base chassis as shown in the embodiment of FIGS. 8A, 8B, and 8C. It is understood that any number or combination of magnets and polarities as well as corresponding Hall effect sensors may be used with the embodiments herein.

With the top replaceable overlay attached and held via the attachment system as described in the embodiments above, the top replaceable overlay of the present embodiments may be snugly held to the top coversheet of the haptic keyboard and haptic touchpad so that the haptic response events of the piezoelectric elements is felt by a user as it would be with a stackup to the top coversheet without the top replaceable overlay. Thus, the top replaceable overlay and attachment system avoids the problem of hollow key travel and ill-fitting key covers of previous overlays placed on mechanically actuated keyboard systems with scissor mechanisms or dome mechanisms.

The method 1500, may continue at block 1525 with receiving mechanical actuation on a haptic key location of the haptic keyboard, registering a haptic keystroke with the generation of electrical charge by the piezo electric element or elements of the key. Generation of this electrical actuation signal may occur according to various embodiments herein where deformation of a piezoelectric material of the piezoelectric element within a metal disk compresses the piezoelectric material causing generation of a charge across the piezoelectric material. This detected charge is sent to the haptic keyboard controller via traces in a contact foil as the actuation signal indicating a keystroke has been received.

Proceeding to block 1530, the keyboard controller executing some or all of the haptic feedback keyboard and touchpad control system may pass an electrical haptic control response signal to the piezoelectric element or elements associated with the actuated key of the keyboard to create haptic feedback to be felt at the actuated key of the keyboard. The actuation and operation of the haptic key and of any haptic touchpad may occur as described in embodiments herein. Detection of the actuation of a haptic key location indicates a scan code corresponding to the haptic key location to the haptic keyboard controller. In some embodiments, the haptic keyboard controller executing the top replaceable overlay adaptation system adjusts which piezoelectric elements reporting an actuation indicate a scan code for a key location when the key layout of the haptic keyboard changes corresponding piezoelectric elements with the selected top replaceable overlay. With the interpreted scan codes and the actuation signal from the one or more piezoelectric elements indicating a key stroke for a key of the selected haptic keyboard, a key character is registered and may appear on a display screen as with keyboard controls of other keyboard controllers known in the art. Further, the top replaceable overlay adaptation system determines which alphanumeric character is to be associated with the received scan code for the corresponding one or more piezoelectric elements as assigned for the selected top replaceable overlay. In this way, the scan codes for each key on the keyboard may be automatically adjusted by the top replaceable overlay adaptation system to alphanumeric characters indicated on the actuated key location of the selected top replaceable overlay as indicated by the magnets detected in the top replaceable overlay. Thus, a user would not be stuck with the alphanumeric markings of the installed keyboard even though the scan codes being used are for a different set of selected alphanumeric characters such as for a different language keyboard. Further, an ill-fitting cover with hollow travel or other issues need not be used and the haptic feedback of the haptic keyboard or haptic touchpad may still be experienced by the user with limited effort in changing the present keys of the haptic keyboard or the desired haptic touchpad. In addition, the cost of manufacturing the one or more top replaceable overlays to make available to user of the information handling system is lower than a cost of manufacturing distinct keyboards for different languages, different key layouts, different key sizes, or different ergonomics thus providing for a cost efficient set of options for user of the information handling system.

The haptic feedback devices, systems, and methods described herein may enhance the perceived quality of the information handling system while still having a haptic feedback method and system that allows the user to feel as if an actuation of a key or touchpad has occurred. Still further, the haptic feedback systems described herein may create a keyboard or touchpad that feels like a mechanical keyboard that uses little user-detectable physical key travel. In other embodiments, a unique haptic feedback may be generated in response to actuation of keys or a touchpad. Additionally, the construction of the haptic feedback systems described herein results in a much thinner and simpler keyboard and touchpad than that of a mechanical keyboard. Embodiments herein may utilize a single material coversheet layer to ensure simplicity of manufacture and ease of color matching as well as providing an ability to select a variety of coversheet materials, textures and designs. The single material coversheet may also provide for haptic feedback events while eliminating mechanical key travel and reducing the risk of spills or dirt breaching the haptic keyboard or the haptic touchpad systems in some embodiments. Further, some water resistance or waterproofing benefit may be derived from the single sheet coversheet for the haptic keyboard, touchpad, palmrests and bezel of the C-cover for the information handling system. In some embodiments, this may result in a thinner more streamlined information handling system. With the reduction in space occupied by the haptic feedback keyboard and touchpad, space within the information handling system may be increased for use by other, additional, or larger components within the information handling system in other embodiments. In a specific embodiment, the additional space provided within the information handling system due to the use of a haptic feedback keyboard and touchpad results in the ability to increase the size of a battery used to power the information handling system. In yet other embodiments, a top replaceable overlay may be used with the coversheet and the haptic keyboard and haptic touchpad of the presently described embodiments to provide for selection of keyboard types including different language keyboards, different layouts and key sizes, different colors, shapes and textures of the keyboard or touchpad, and the like. In embodiments herein, the top replaceable overlay may be magnetically attachable or attachable via reusable adhesives or mechanical measures such as snap fit systems. In yet other embodiments, one or more magnets in a top replaceable overlay may be detected by Hall effect sensors in the coversheet or elsewhere in the base chassis C-cover to identify, via a top replaceable overlay adaptation system, the operation of the scan codes associated with the piezoelectric elements registering keystrokes to correspond with characters at the locations of the selected top replaceable overlay The blocks of the flow diagrams of FIGS. 11, 12, 13, 14 and 15 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A coversheet layer of an information handling system, comprising:
    a single-layer coversheet to identify a key location of a haptic keyboard and a haptic touchpad interface area on a C-cover for the information handling system;
    a support layer;
    a contact foil placed between the coversheet and the support layer;
    a piezoelectric element placed between the contact foil and the support layer to receive an applied mechanical stress at the key location or the haptic touchpad interface location of the coversheet and generate an electric actuation signal; and
    a controller of the information handling system operatively coupled to the contact foil to:
        receive the electric actuation signal from the piezoelectric element placed under the mechanical stress via the contact foil; and
        send an electrical haptic response signal to the piezoelectric element to cause the piezoelectric element to generate haptic feedback at the key location or the touchpad interface location.

2. The coversheet layer of the information handling system of claim 1, wherein the single-layer coversheet further comprises an actuation location indicated by a key pedestal comprising a raised and contoured portion identifying the key.

3. The coversheet layer of the information handling system of claim 1, wherein the support plate further comprises a cavity formed below the piezoelectric element to allow a portion of the piezoelectric element to deflect into the cavity upon the mechanical stress applied to the input actuation device.

4. The coversheet layer of the information handling system of claim 1, comprising a plurality of adhesive layers to secure the coversheet to the contact foil and the contact foil to the support layer.

5. The coversheet layer of the information handling system of claim 3, wherein the single-layer coversheet comprises a flexible material and that may be a cloth material, bamboo material, metallic material, or a glass material.

6. The coversheet layer of the information handling system of claim 1, further comprising a touchpad, the touchpad including:
    a capacitive touch layer operatively coupled to a bottom surface of the single layer coversheet via a first adhesive layer;
    a contact foil layer operatively coupled to a bottom surface of the stiffening layer via a second adhesive layer and an array of piezoelectric elements laid out along a bottom surface of the contact foil layer and operatively coupled to a touchpad support structure, wherein the contact foil layer is operatively coupled to the controller to receive input from one or a plurality of piezoelectric elements located at an actuation location on the touchpad and send an electrical charge to the one or plurality of piezoelectric elements to cause the one or plurality of piezoelectric elements to provide haptic feedback at an actuation location on the touchpad.

7. A coversheet layer of an information handling system, comprising:
    a coversheet having a key location of a haptic keyboard and a haptic touchpad area on a C-cover for the information handling system;
    a magnet or ferromagnetic insert in the coversheet for alignment to a top replaceable overlay layer magnetically attachable to the coversheet;
    a support layer;
    a contact foil placed between the coversheet and the support layer;
    a piezoelectric element placed between the contact foil and the support layer to receive an applied mechanical stress at a key location or a touchpad interface location of the coversheet and generate an electric actuation signal; and
    a controller of the information handling system operatively coupled to the contact foil to:
        receive the electric actuation signal from the piezoelectric element placed under the mechanical stress via the contact foil; and
        send an electrical haptic response signal to the piezoelectric element to cause the piezoelectric element to generate haptic feedback at the key location or the touchpad actuation location.

8. The coversheet layer of the information handling system of claim 7, wherein the top replaceable overlay further comprises an actuation location indicated by a key pedestal comprising a raised and contoured portion identifying a key of the haptic keyboard.

9. The coversheet layer of the information handling system of claim 7, wherein the top replaceable overlay further comprises a touchpad actuation interface location indicated by markings or framing on the top replaceable overlay.

10. The coversheet layer of the information handling system of claim 7, wherein the top replaceable overlay is magnetically detectable via one or more Hall effect sensors in the base chassis to determine the top replaceable overlay that is attached as selected from a plurality of top replaceable overlays.

11. The coversheet layer of the information handling system of claim 10, wherein the plurality of top replaceable overlays includes a plurality of language haptic keyboards with alphanumeric characters for the plurality of language haptic keyboards.

12. The coversheet layer of the information handling system of claim 10, wherein the plurality of top replaceable overlays includes a plurality of key layouts for the selected haptic keyboard.

13. The coversheet layer of the information handling system of claim 10, wherein the coversheet includes a default haptic keyboard that is a QWERTY type keyboard over which a top replaceable overlay may be attached to select a different haptic keyboard.

14. The coversheet layer of the information handling system of claim 10, wherein the top replaceable overlay adaptation system adjust scan codes corresponding to one or more piezoelectric elements registering a keystroke with the alphanumeric character of the key pressed on the selected haptic keyboard of the top replaceable overlay.

15. A coversheet layer of an information handling system, comprising:

a coversheet having a key location of a haptic keyboard and a haptic touchpad area on a C-cover for the information handling system;

a magnet or ferromagnetic insert in the coversheet for alignment to a top replaceable overlay layer magnetically attachable to the coversheet;

one or more Hall effect sensors under the C-cover;

the top replaceable overlay layer including one or more magnets detectable by one or more Hall effect sensors, wherein the magnets magnetically attach the top replaceable overlay layer to the coversheet;

a support layer and a contact foil placed between the coversheet and the support layer;

a piezoelectric element placed between the contact foil and support layer to receive an applied mechanical stress at the key location of the coversheet or at a haptic touchpad interface location and generate an electric actuation signal; and a controller of the information handling system operatively coupled to the contact foil to:
  receive an electric actuation signal from the piezoelectric element placed under the mechanical stress via the contact foil; and
  send an electrical haptic response signal to the piezoelectric element to cause the piezoelectric element to generate haptic feedback at the key location or the haptic touchpad interface location.

16. The coversheet layer of the information handling system of claim 15, wherein the top replaceable overlay further comprises an actuation location indicated by a key pedestal comprising a raised and contoured portion identifying a key of the haptic keyboard.

17. The coversheet layer of the information handling system of claim 15, wherein the top replaceable overlay further comprises a touchpad actuation interface location indicated by markings or framing on the top replaceable overlay.

18. The coversheet layer of the information handling system of claim 15 further comprising:
  a top replaceable overlay adaptation system to detect a combination of one or more magnets in the top replaceable overlay by one or more Hall effect sensors under the coversheet to determine which top replaceable overlay is selected from a plurality of available top replaceable overlays.

19. The coversheet layer of the information handling system of claim 15, wherein the top replaceable overlay is selected from a plurality of top replaceable overlays that include a plurality of language haptic keyboards with alphanumeric characters for the plurality of language haptic keyboards.

20. The coversheet layer of the information handling system of claim 15, wherein the coversheet includes a default haptic keyboard that is a QWERTY type keyboard over which the top replaceable overlay may be attached to select a different haptic keyboard.

* * * * *